US012765010B2

(12) United States Patent
Chen et al.

(10) Patent No.: US 12,765,010 B2
(45) Date of Patent: Oct. 13, 2026

(54) SEMICONDUCTOR STRUCTURE WITH ISOLATION FEATURE

(71) Applicant: Taiwan Semiconductor Manufacturing Company, Ltd., Hsinchu (TW)

(72) Inventors: Chun-Yuan Chen, Hsinchu (TW); Huan-Chieh Su, Changhua County (TW); Li-Zhen Yu, New Taipei City (TW); Lo-Heng Chang, Hsinchu (TW); Cheng-Chi Chuang, New Taipei City (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 808 days.

(21) Appl. No.: 17/696,130

(22) Filed: Mar. 16, 2022

(65) Prior Publication Data

US 2023/0047194 A1 Feb. 16, 2023

Related U.S. Application Data

(60) Provisional application No. 63/231,383, filed on Aug. 10, 2021.

(51) Int. Cl.
*H10D 30/43* (2025.01)
*H10D 10/00* (2025.01)
(Continued)

(52) U.S. Cl.
CPC ......... *H10D 62/118* (2025.01); *H10D 30/031* (2025.01); *H10D 30/6713* (2025.01);
(Continued)

(58) Field of Classification Search
CPC ......... H01L 29/0665; H01L 21/823412; H01L 21/823418; H01L 21/823481;
(Continued)

(56) References Cited

U.S. PATENT DOCUMENTS 7,713,887 B2 * 5/2010 Eun .................. H01L 21/76224
438/296
9,209,247 B2 12/2015 Colinge et al.
(Continued)

FOREIGN PATENT DOCUMENTS

CN 113140545 A 7/2021
DE 102019110531 B3 * 4/2020 ....... H01L 21/02164

*Primary Examiner* — Zandra V Smith
*Assistant Examiner* — Daniel J Hibbert
(74) *Attorney, Agent, or Firm* — Birch, Stewart, Kolasch & Birch, LLP

(57) ABSTRACT

Semiconductor structures and methods for manufacturing the same are provided. The semiconductor structure includes a substrate and first nanostructures and second nanostructures formed over the substrate. The semiconductor structure also includes a gate structure including a first portion wrapping around the first nanostructures and a second portion wrapping around the second nanostructures. The semiconductor structure also includes a dielectric feature sandwiched between the first portion and the second portion of the gate structure. In addition, the dielectric feature includes a bottom portion and a top portion over the bottom portion, and the top portion of the dielectric feature includes a shell layer and a core portion surrounded by the shell layer.

20 Claims, 73 Drawing Sheets

(51) Int. Cl.

| | |
|---|---|
| ***H10D 30/01*** | (2025.01) |
| ***H10D 30/62*** | (2025.01) |
| ***H10D 30/67*** | (2025.01) |
| ***H10D 62/10*** | (2025.01) |
| ***H10D 62/822*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.

CPC ..... *H10D 30/6729* (2025.01); *H10D 30/6735* (2025.01); *H10D 30/6757* (2025.01); *H10D 62/116* (2025.01); *H10D 64/018* (2025.01); *H10D 84/0128* (2025.01); *H10D 84/013* (2025.01); *H10D 84/0151* (2025.01); *H10D 84/038* (2025.01)

(58) Field of Classification Search

CPC ........... H01L 29/0653; H01L 29/41733; H01L 29/42392; H01L 29/66553; H01L 29/66742; H01L 29/78618; H01L 29/78696; H01L 27/088; H01L 21/823475; H01L 29/0673; H01L 29/1079; H01L 29/165; H01L 29/66439; H01L 29/775; H01L 29/7848; H01L 29/66545; H01L 29/0642; H01L 21/823431; H01L 29/66795; H01L 29/785; B82Y 10/00; H10D 62/118; H10D 30/031; H10D 30/6713; H10D 30/6729; H10D 30/6735; H10D 30/6757; H10D 62/116; H10D 64/018; H10D 84/0128; H10D 84/013; H10D 84/0151; H10D 84/038; H10D 64/017; H10D 30/014; H10D 30/43; H10D 30/797; H10D 62/121; H10D 62/364; H10D 62/822; H10D 84/83; H10D 84/0149; H10D 30/024; H10D 30/62; H10D 84/0158; H10D 62/113

See application file for complete search history.

(56) References Cited

U.S. PATENT DOCUMENTS

| | | | | |
|---|---|---|---|---|
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,755,964 | B1 * | 8/2020 | Huang | H01L 21/76224 |
| 2007/0232021 | A1 * | 10/2007 | Eun | H01L 21/76224 257/E21.546 |
| 2020/0119003 | A1 * | 4/2020 | Mistkawi | H01L 29/0847 |
| 2020/0135932 | A1 * | 4/2020 | Wang | H10D 64/021 |
| 2021/0036121 | A1 * | 2/2021 | Lim | H10D 62/151 |

* cited by examiner

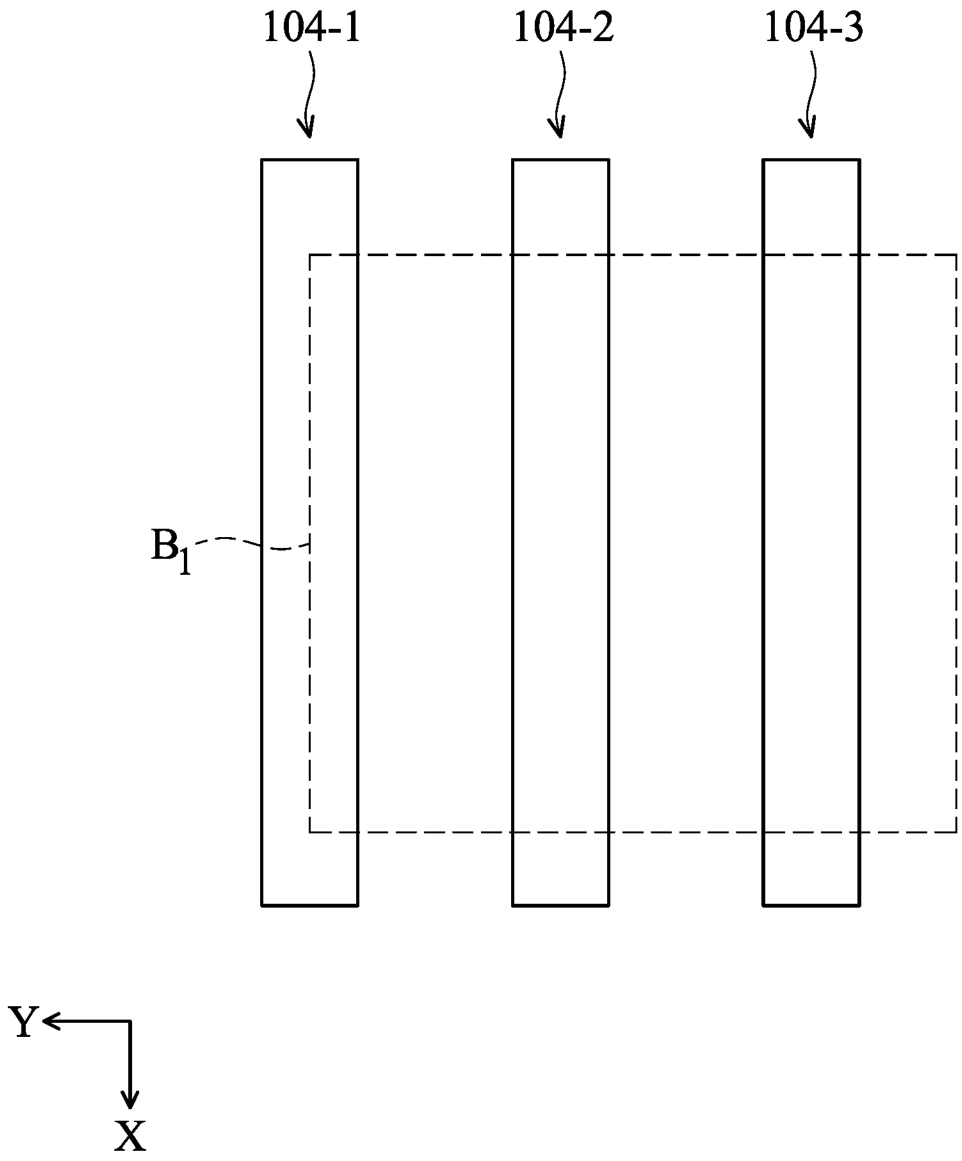
FIG. 1B-T

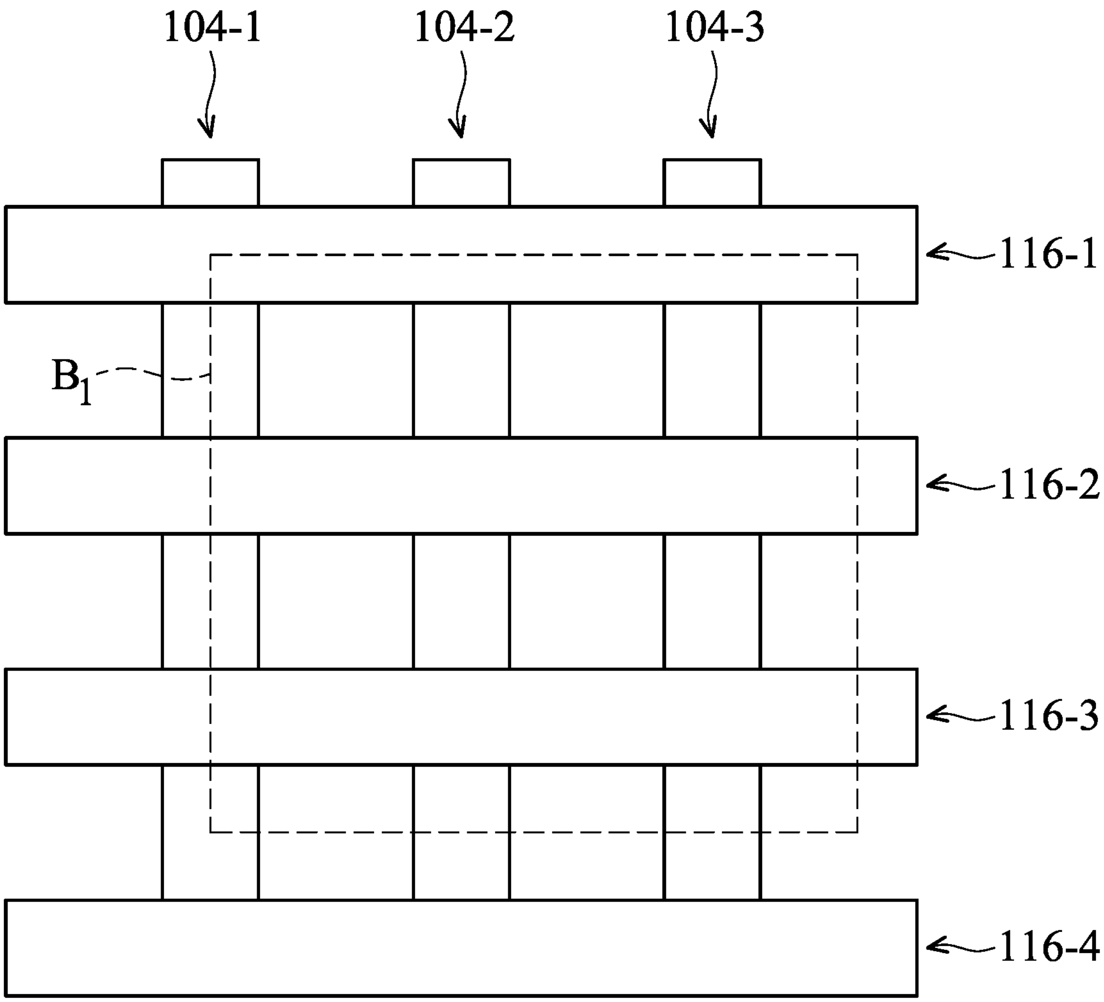
FIG. 1E-T

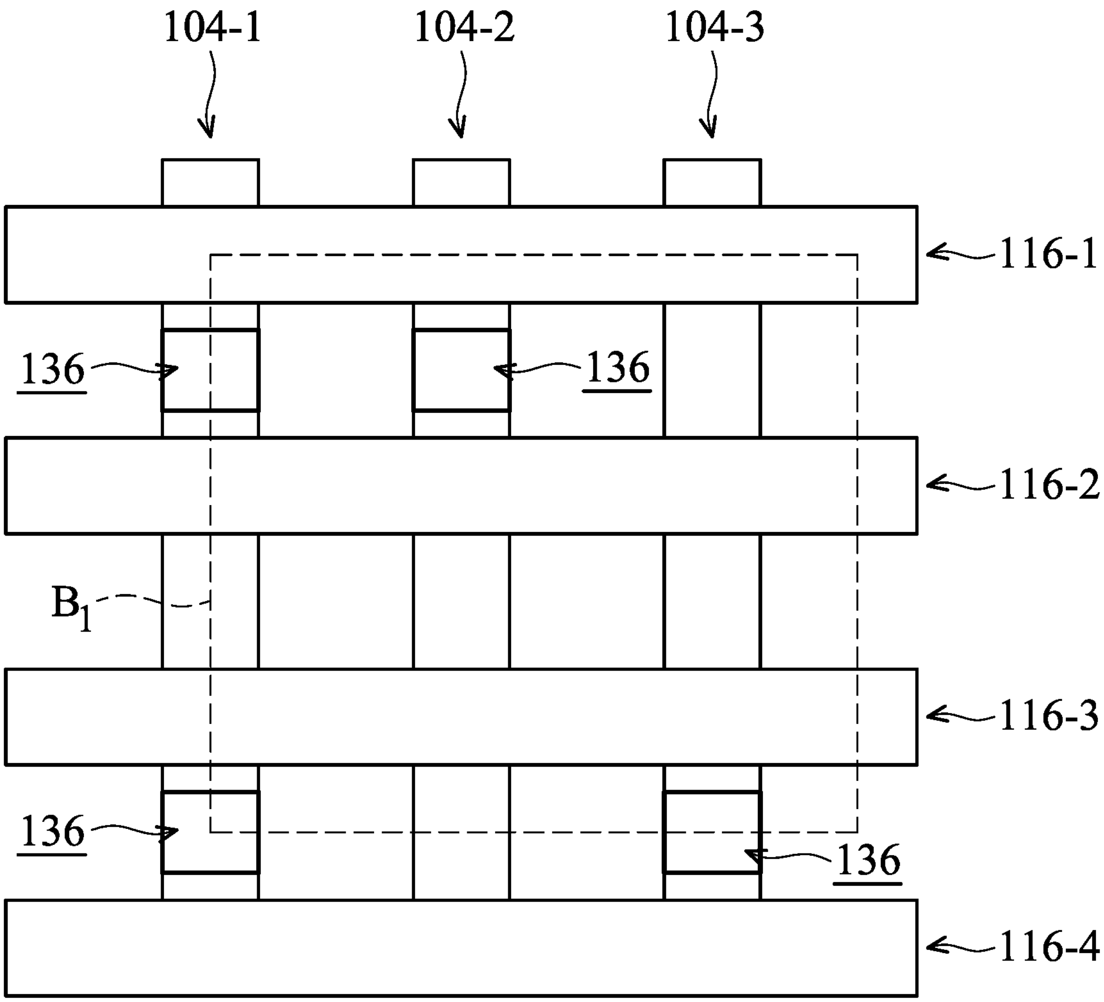
FIG. 1K-T

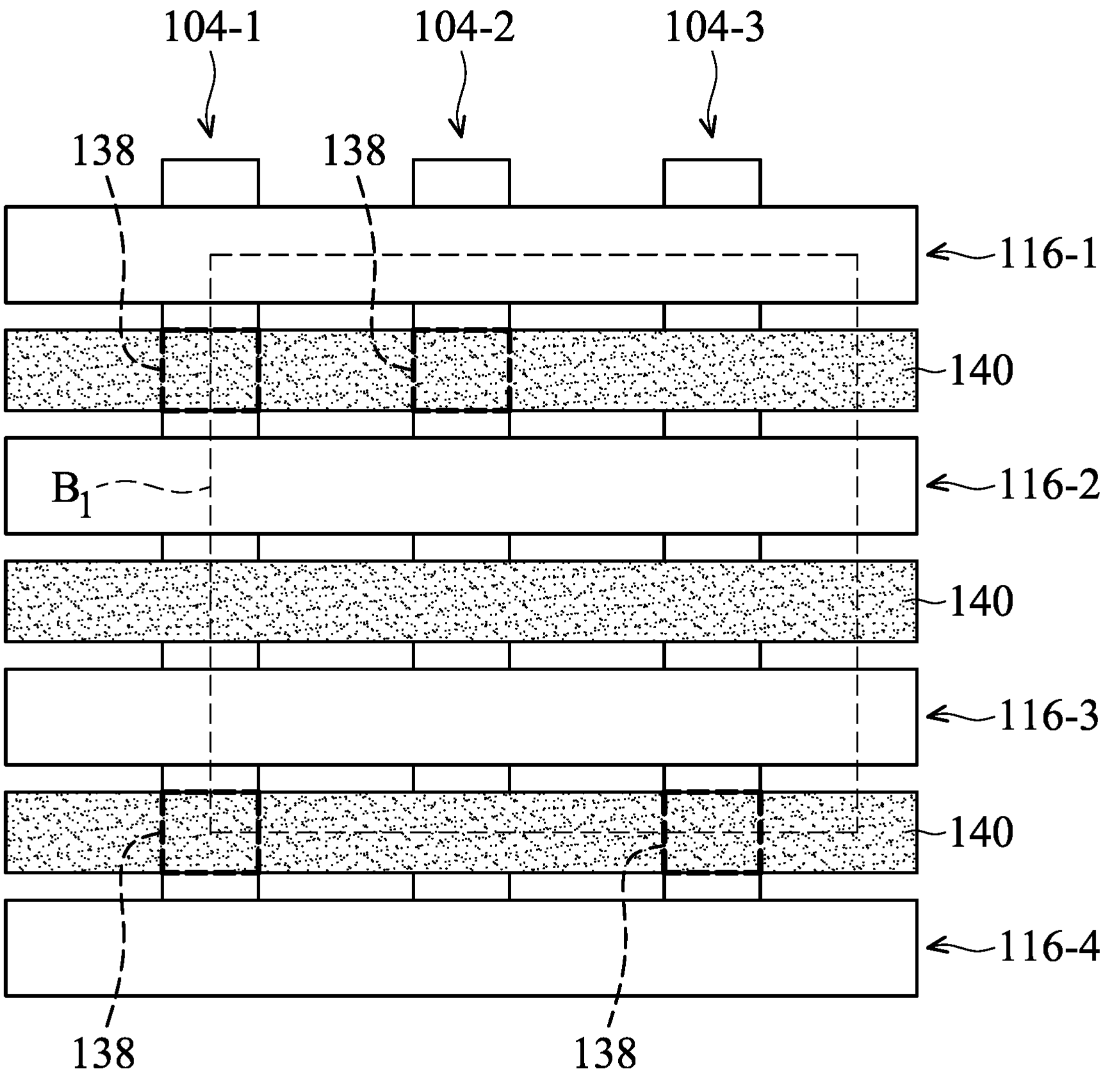
FIG. 1M-T

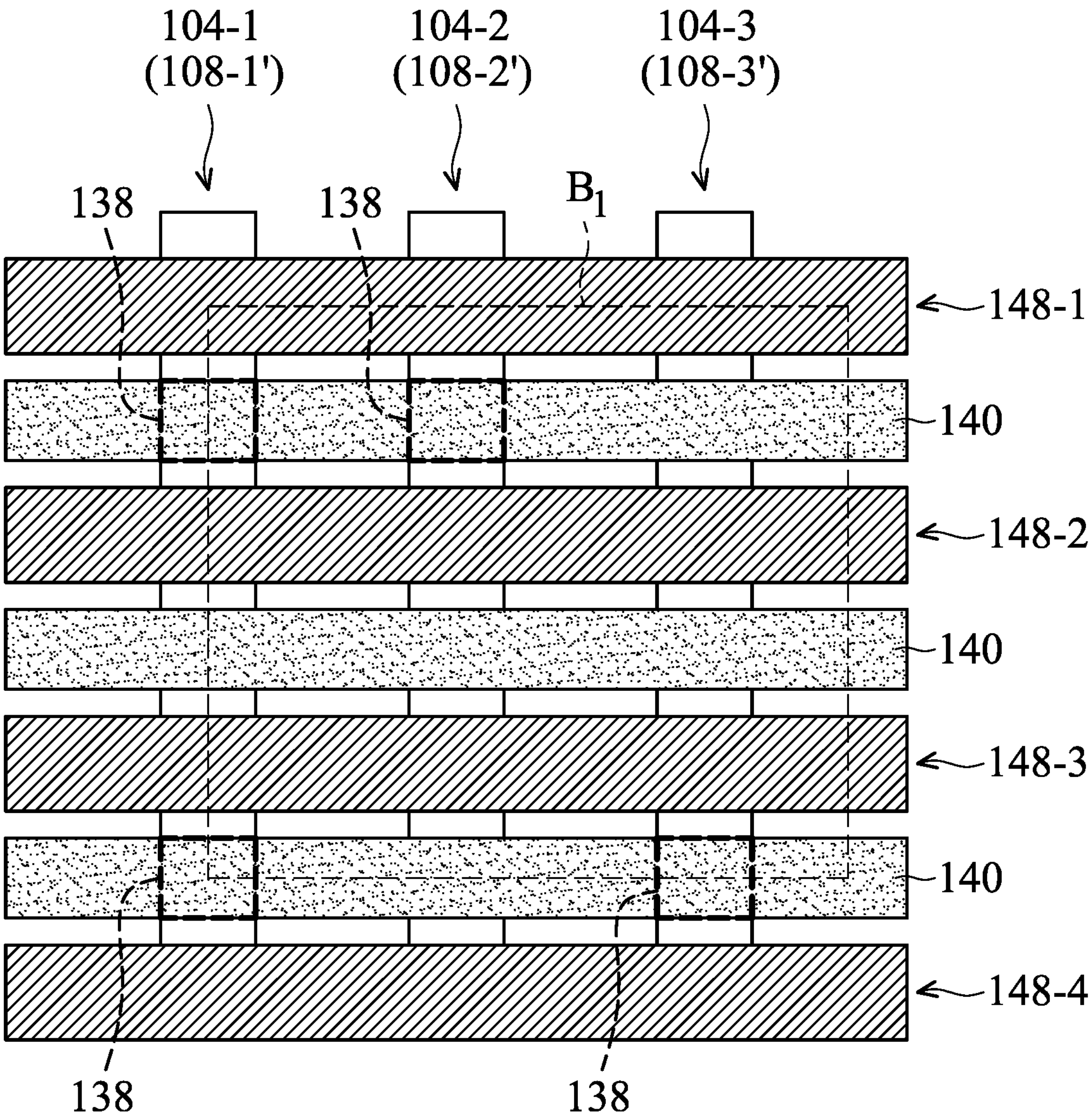
FIG. 1Q-T

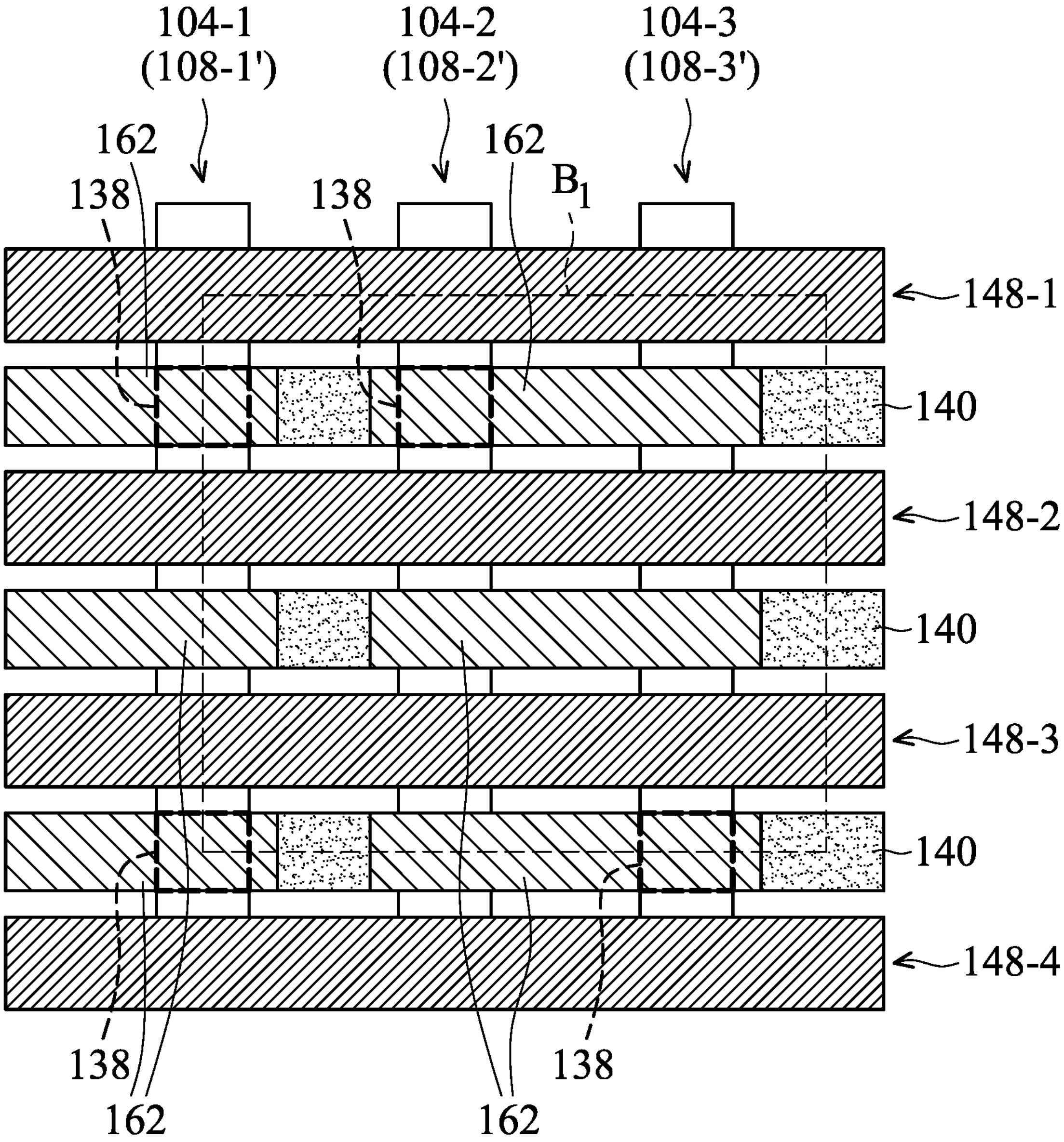
FIG. 1S-T

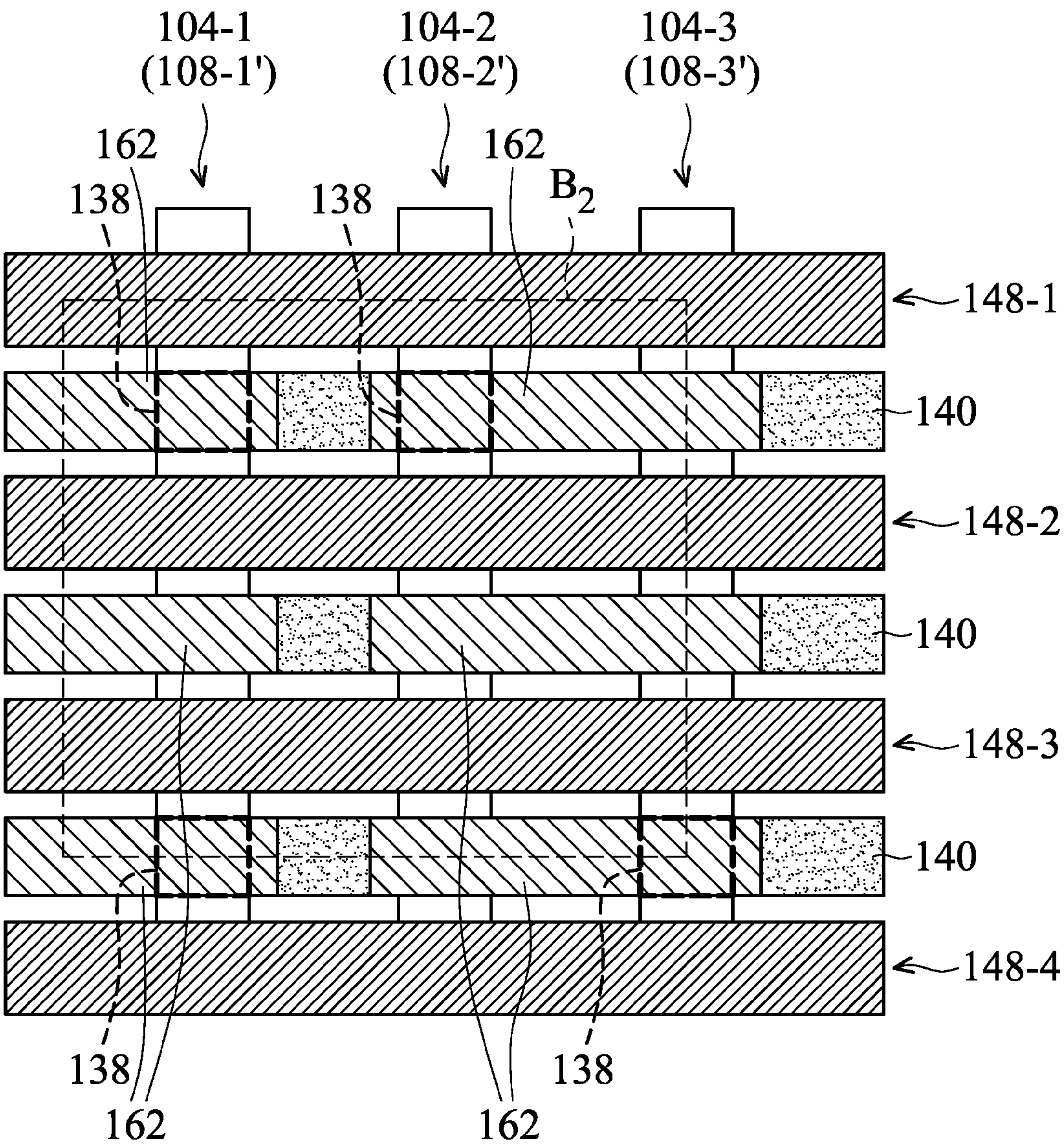
FIG. 1T-T

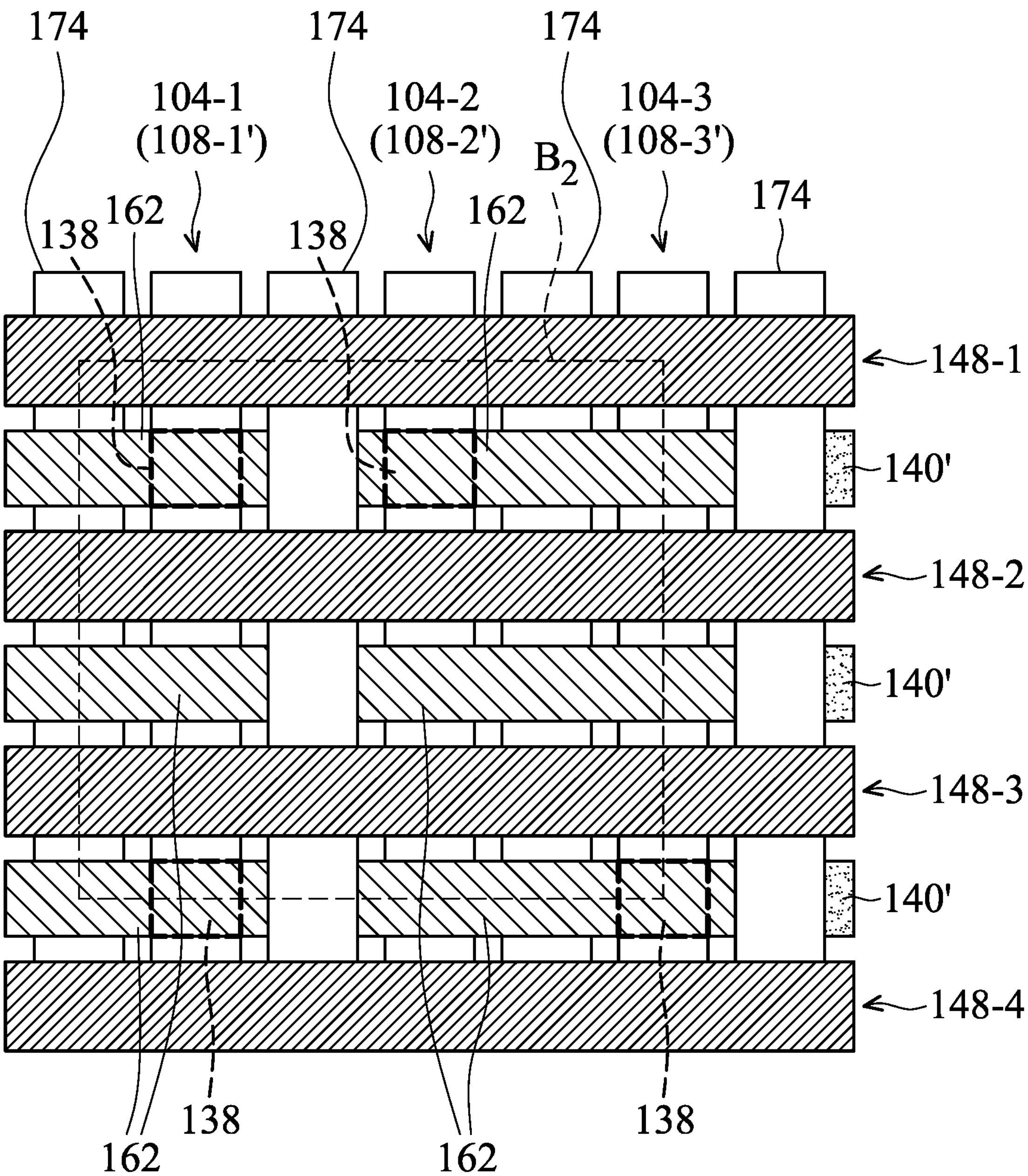
FIG. 1X-T

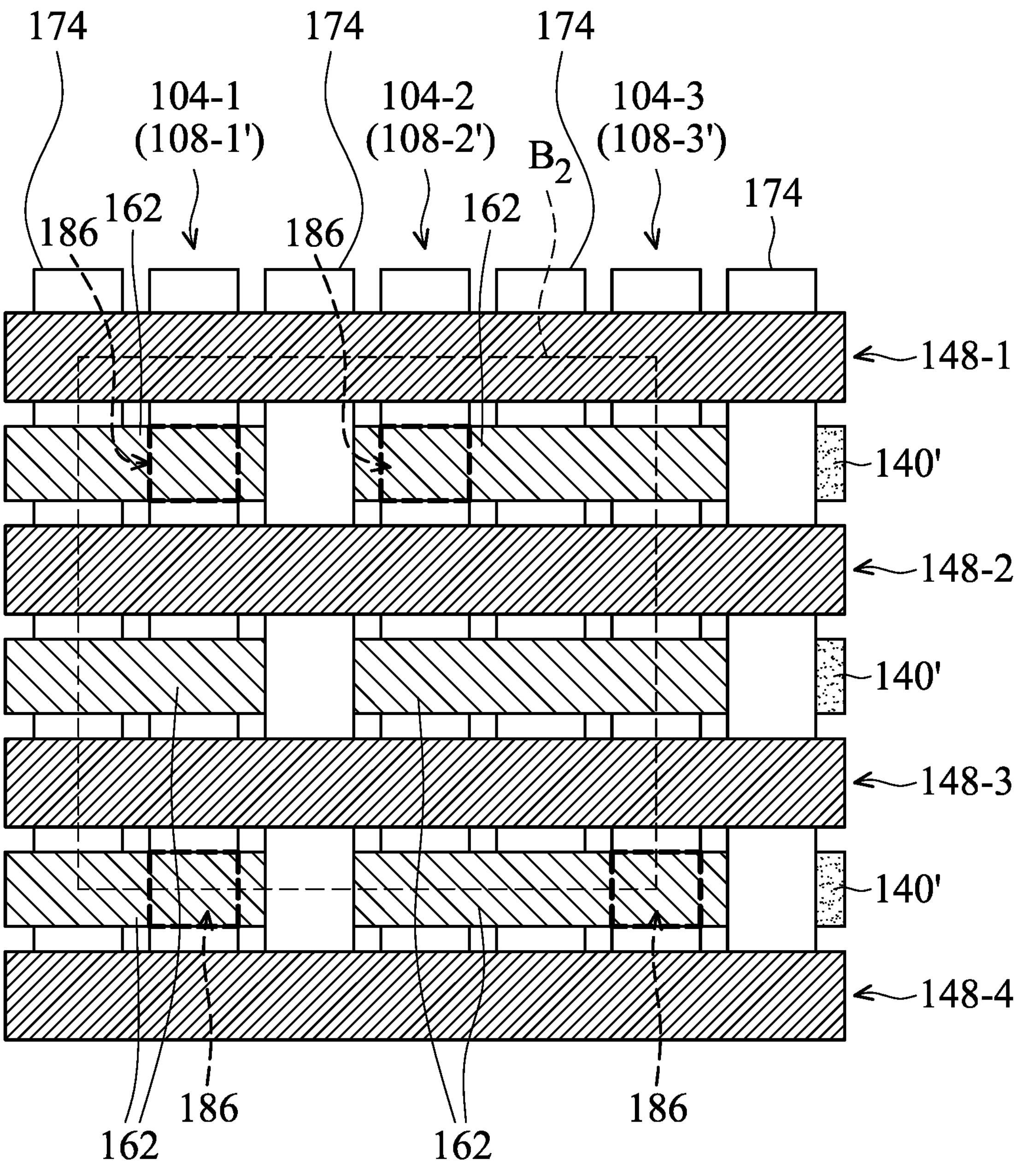
FIG. 1ZB-T

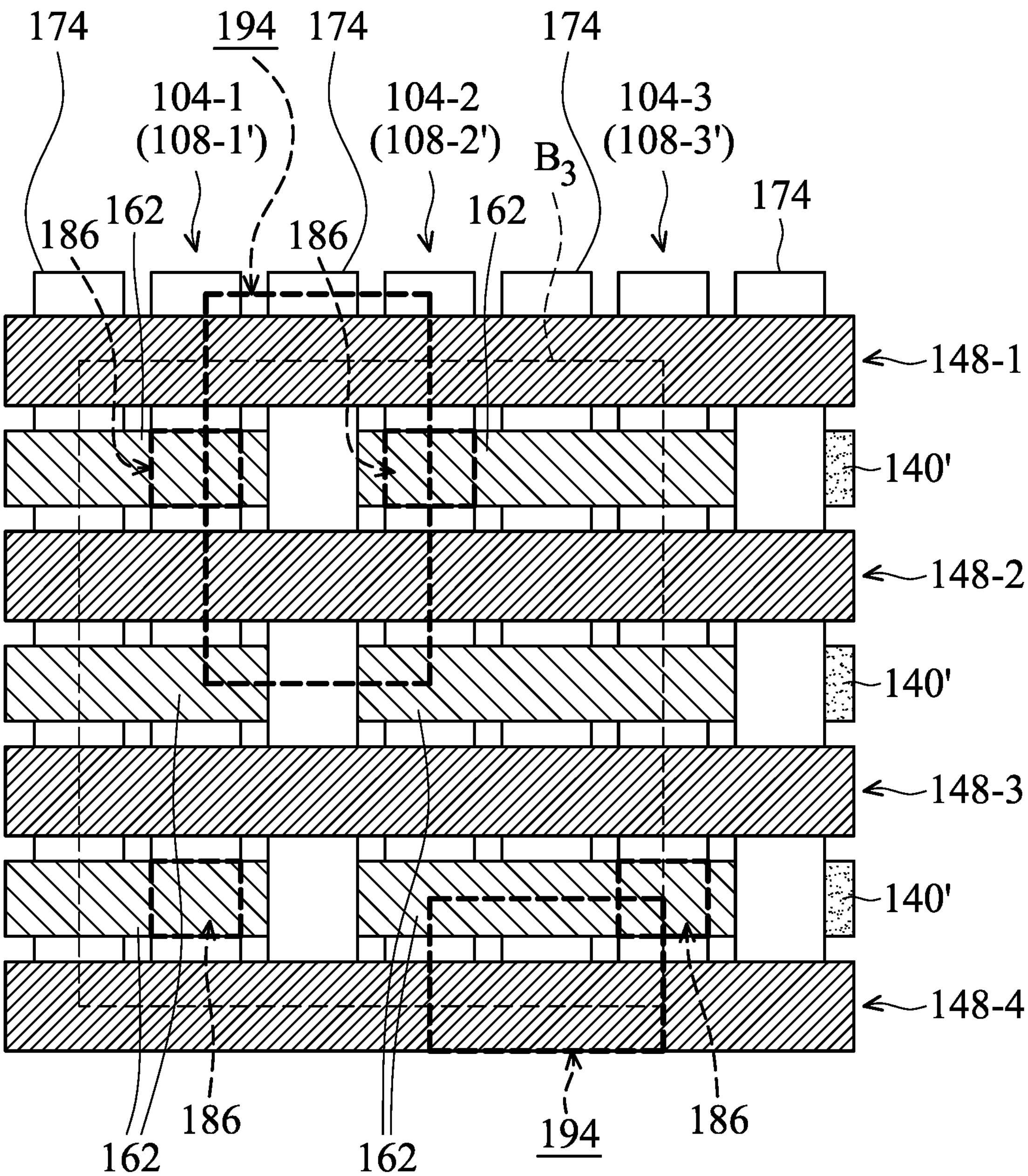
FIG. 1ZC-T

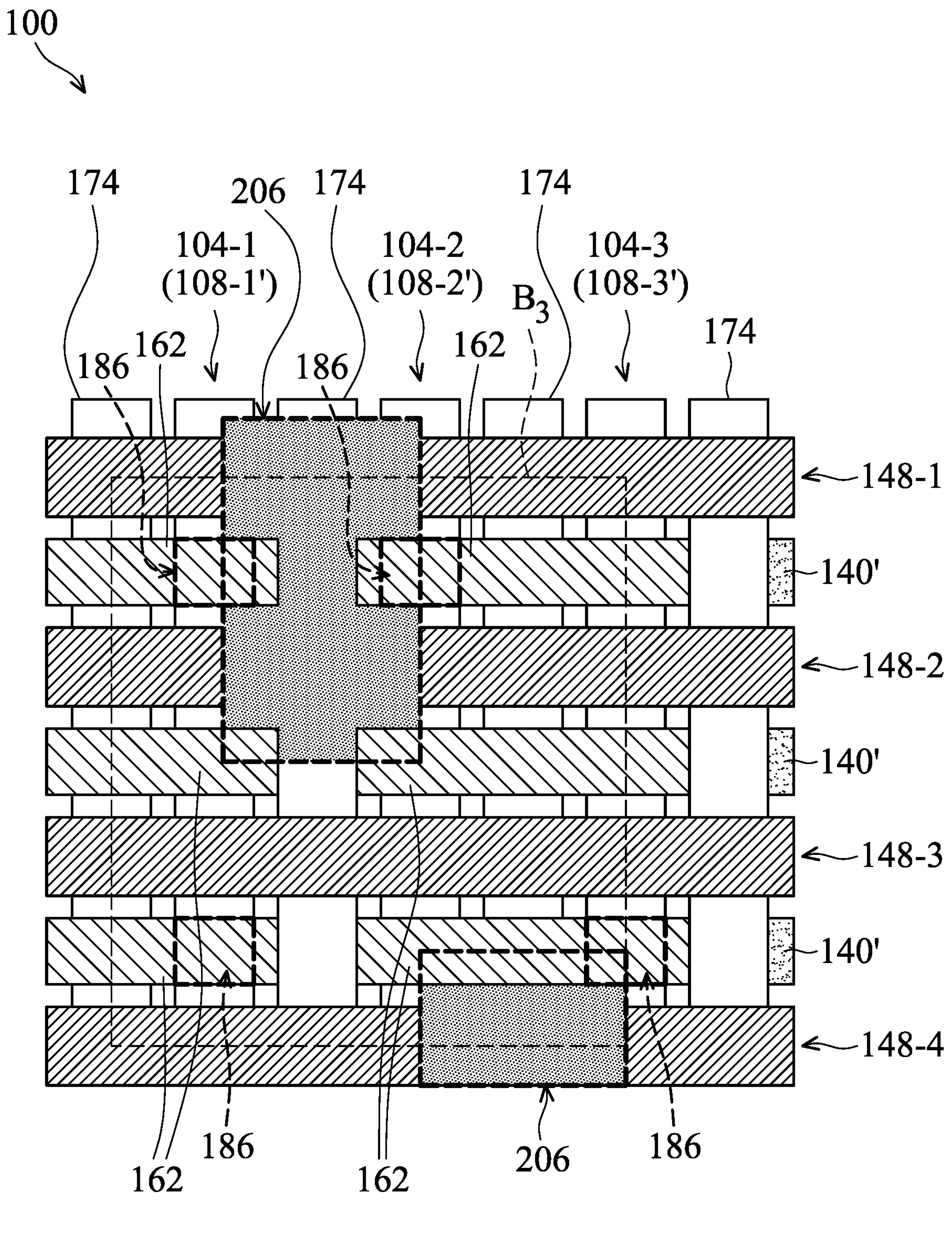
FIG. 1ZF-T

SEMICONDUCTOR STRUCTURE WITH ISOLATION FEATURE

PRIORITY CLAIM AND CROSS-REFERENCE

This application claims the benefit of U.S. Provisional Application No. 63/231,383, filed on Aug. 10, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIG. 1E-T illustrates a diagrammatic top view of an intermediate stage of the semiconductor structure, and the structure shown in FIG. 1E corresponds to the region shown in block $B_1$ in FIG. 1E-T in accordance with some embodiments.

FIG. 1K-T illustrates a diagrammatic top view of an intermediate stage of the semiconductor structure, and the structure shown in FIG. 1K corresponds to the region shown in block $B_1$ in FIG. 1K-T in accordance with some embodiments.

FIG. 1M-T illustrates a diagrammatic top view of an intermediate stage of the semiconductor structure, and the structure shown in FIG. 1M corresponds to the region shown in block $B_1$ in FIG. 1M-T in accordance with some embodiments.

FIG. 1Q-T illustrates a diagrammatic top view of an intermediate stage of the semiconductor structure, and the structure shown in FIG. 1Q corresponds to the region shown in block $B_1$ in FIG. 1Q-T in accordance with some embodiments.

FIG. 1S-T illustrates a diagrammatic top view of an intermediate stage of the semiconductor structure, and the structure shown in FIG. 1S corresponds to the region shown in block $B_1$ in FIG. 1S-T in accordance with some embodiments.

FIG. 1T-T illustrates a diagrammatic top view of an intermediate stage of the semiconductor structure, and the structure shown in FIG. 1T corresponds to the region shown in block $B_2$ in FIG. 1T-T in accordance with some embodiments.

FIG. 1X-T illustrates a diagrammatic top view of an intermediate stage of the semiconductor structure, and the structure shown in FIG. 1X corresponds to the region shown in block $B_2$ in FIG. 1X-T in accordance with some embodiments.

FIG. 1ZB-T illustrates a diagrammatic top view of an intermediate stage of the semiconductor structure, and the structure shown in FIG. 1ZB corresponds to the region shown in block $B_2$ in FIG. 1ZB-T in accordance with some embodiments.

FIG. 1ZC-T illustrates a diagrammatic top view of an intermediate stage of the semiconductor structure, and the structure shown in FIG. 1ZC corresponds to the region shown in block $B_3$ in FIG. 1ZC-T in accordance with some embodiments.

FIG. 1ZF-T illustrates a diagrammatic top view of the semiconductor structure, and the structure shown in FIG. 1ZF corresponds to the region shown in block $B_3$ in FIG. 1ZF-T in accordance with some embodiments.

FIGS. 1T-1 to 1Z-1 and 1ZA-1 to 1ZF-1 illustrate cross-sectional views of intermediate stages of manufacturing the semiconductor structure shown along line A-A' of FIGS. 1T to 1Z and 1ZA to 1ZF in accordance with some embodiments.

FIGS. 1T-2 to 1Z-2 and 1ZA-2 to 1ZF-2 illustrate cross-sectional views of intermediate stages of manufacturing the semiconductor structure shown along line B-B' of FIGS. 1T to 1Z and 1ZA to 1ZF in accordance with some embodiments.

FIG. 1ZF-3 illustrates a cross-sectional view of the semiconductor structure shown along line C-C' of FIG. 1ZF-T in accordance with some embodiments.

FIGS. 2 to 6 illustrate cross-sectional views of intermediate stages of manufacturing semiconductor structures in accordance with some other embodiments.

FIG. 8B-1 illustrates a cross-sectional view of the semiconductor structure 100*b* shown along and over the source/drain structure parallel to the extending direction of the gate structures in accordance with some embodiments.

FIG. 8B-2 illustrates a cross-sectional view of the semiconductor structure 100*b* shown along and over the source/drain structure parallel to the extending direction of the nanostructures in accordance with some embodiments.

FIG. 9B-1 illustrates a cross-sectional view of the semiconductor structure 100*c* shown along and over the source/ drain structure parallel to the extending direction of the gate structures in accordance with some embodiments.

Figure 1A:
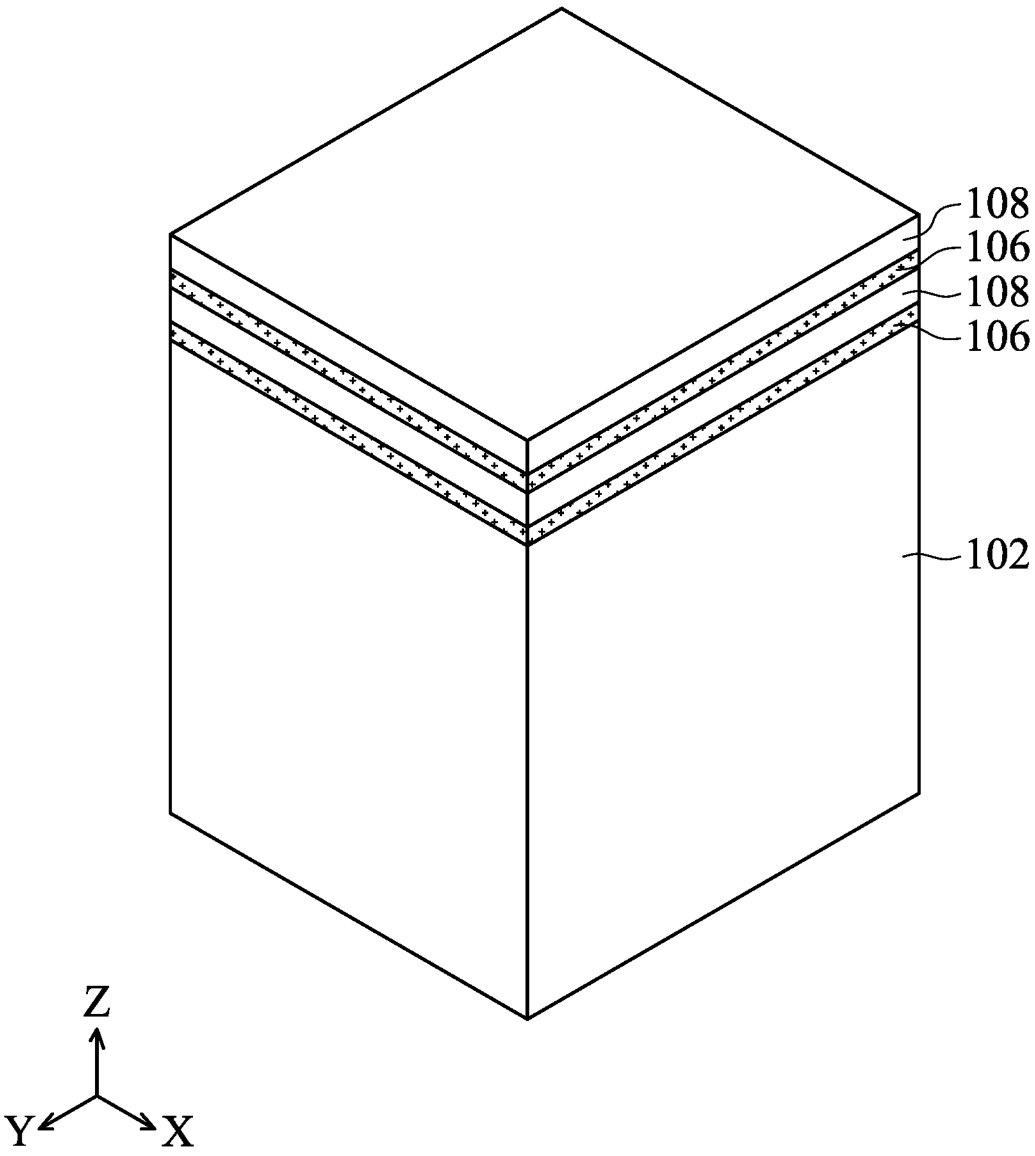
FIGS. 1A to 1Z and 1ZA to 1ZF illustrate diagrammatic perspective views of intermediate stages of manufacturing a semiconductor structure in accordance with some embodiments.
Figure 1B:
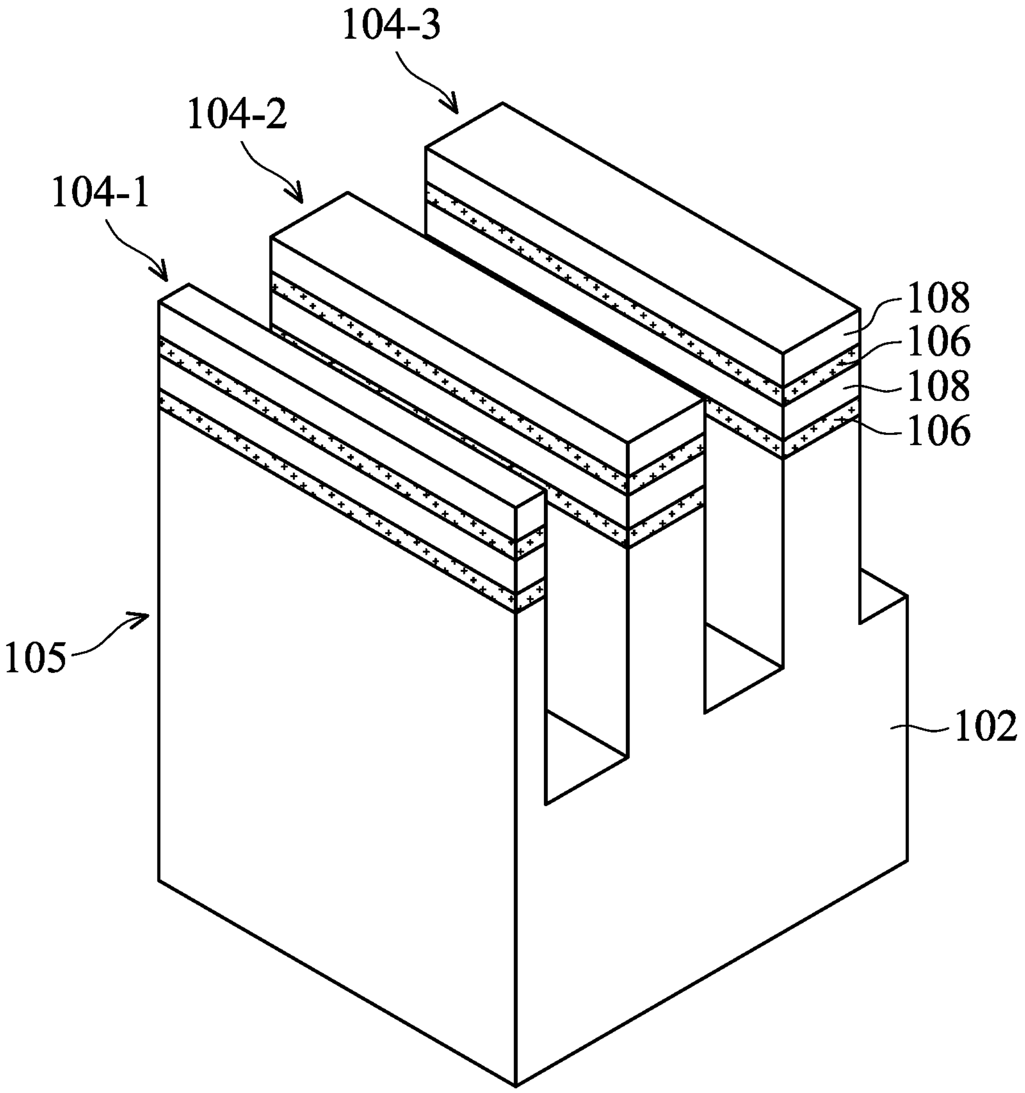
FIG. 1B-T illustrates a diagrammatic top view of the intermediate stage of the semiconductor structure, and the block $B_1$ shown in FIG. 1B-T corresponds to the structure shown in FIG. 1B in accordance with some embodiments.
Figure 1C:
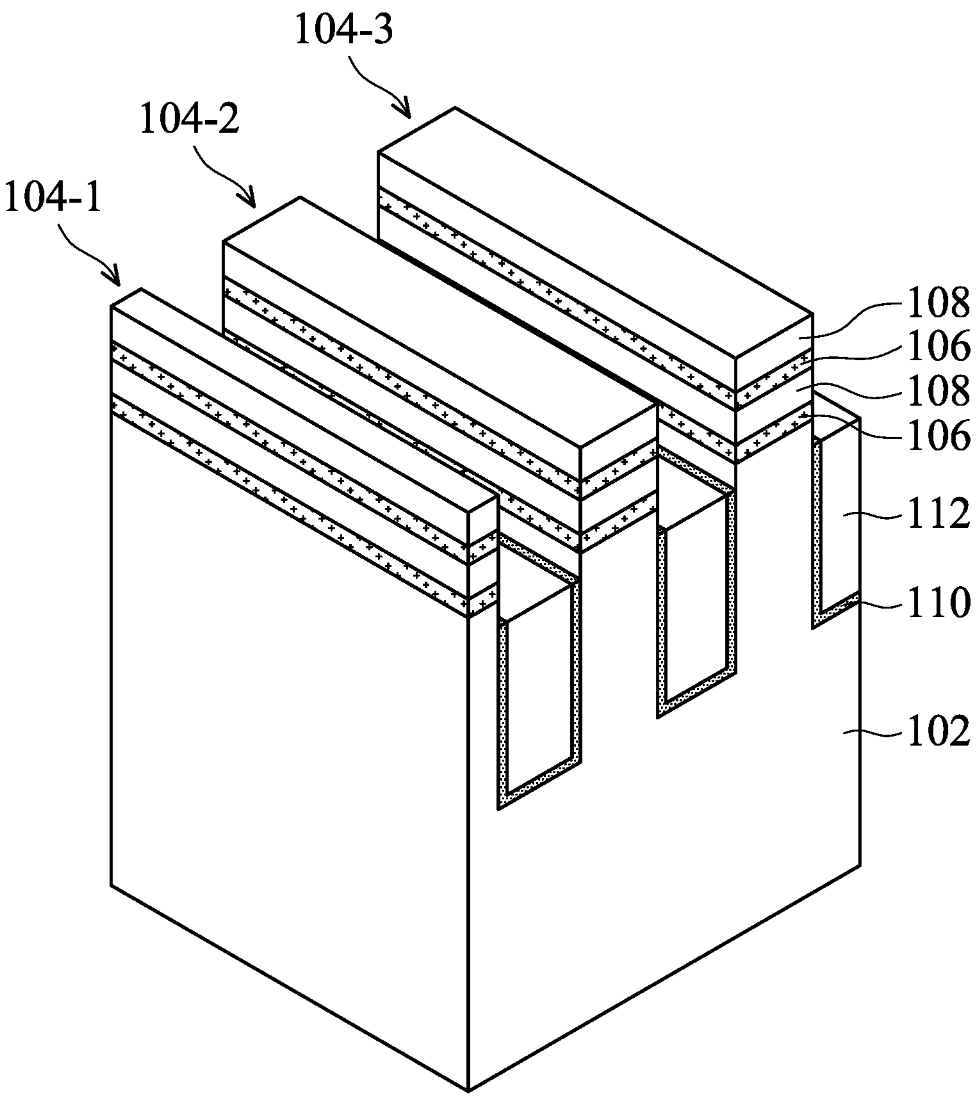
Figure 1D:
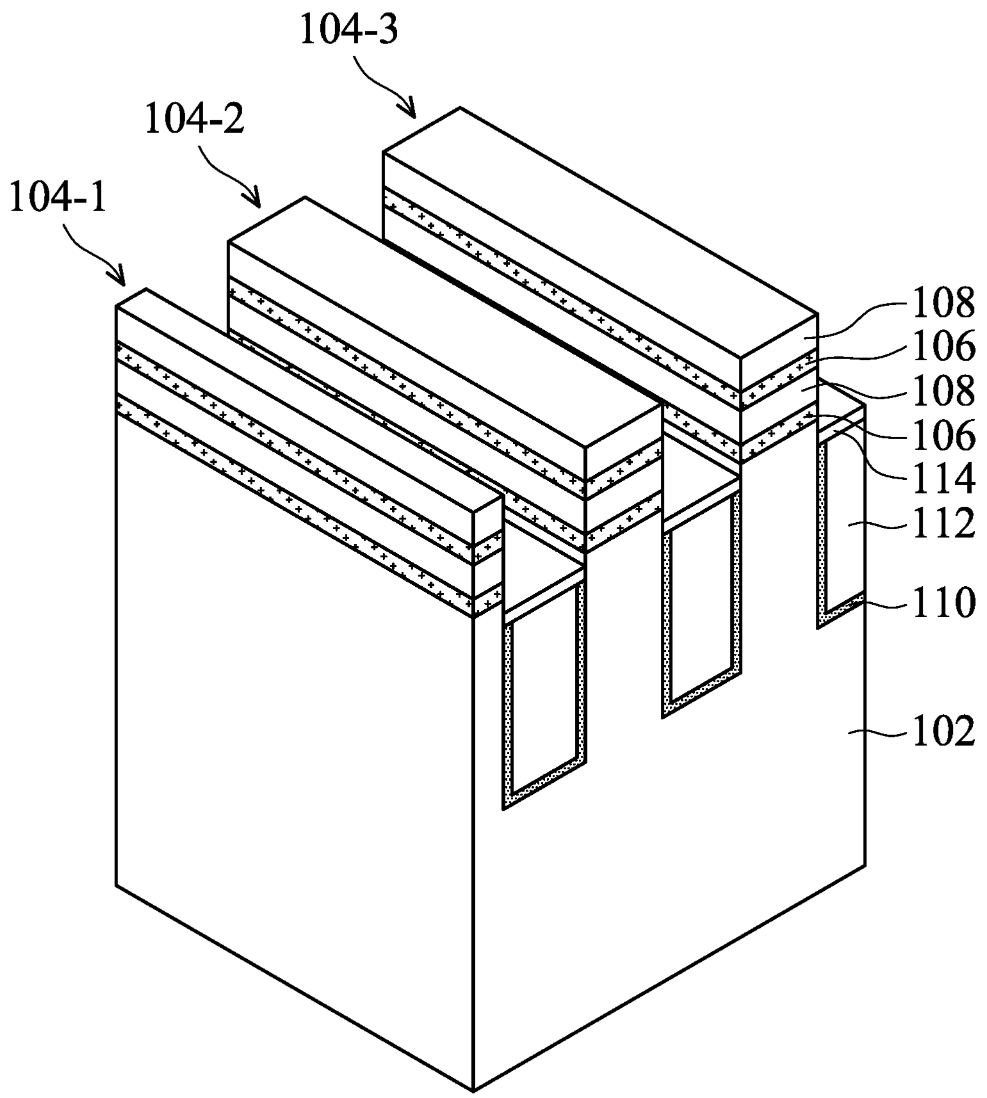
Figure 1E:
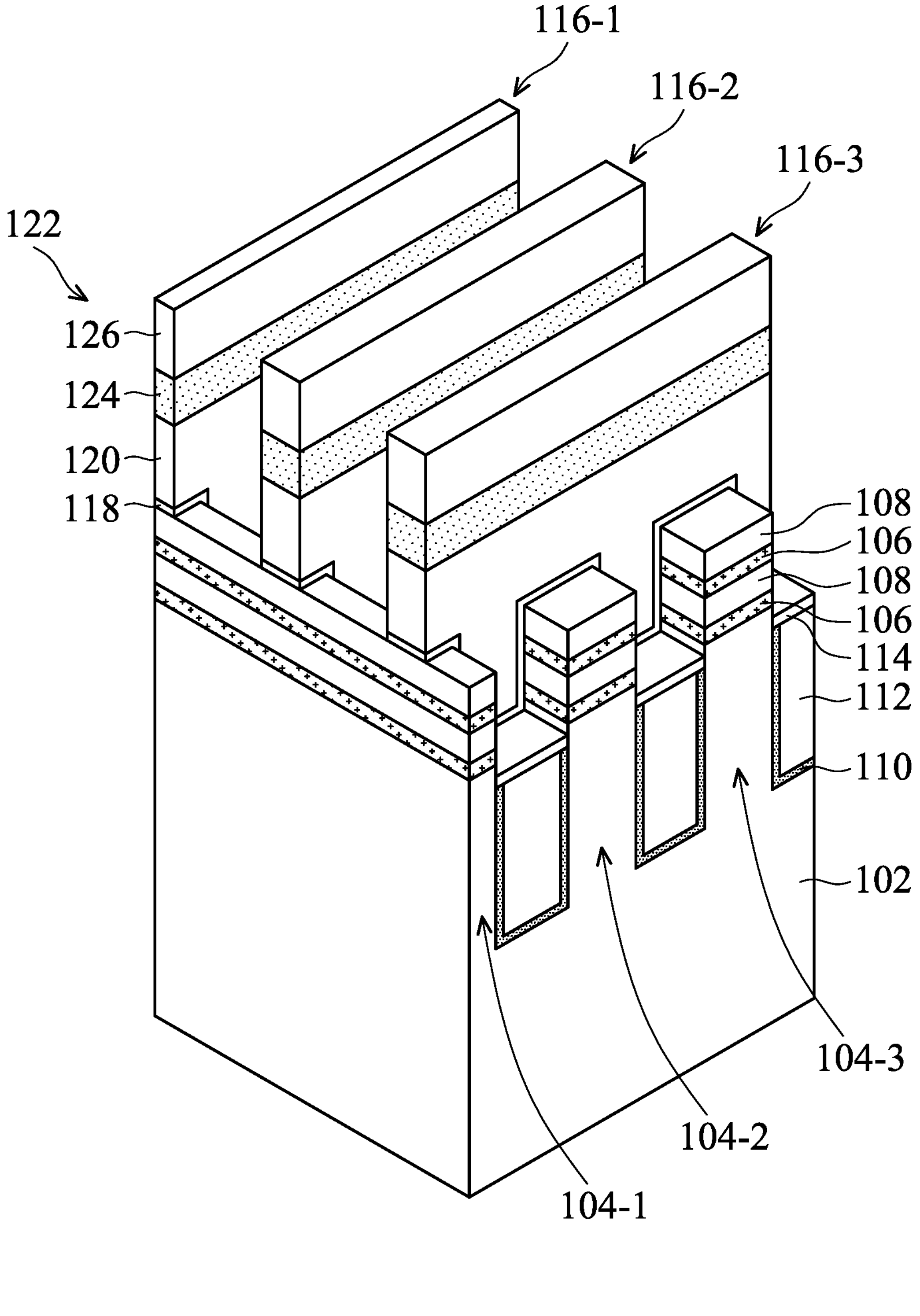
Figure 1F:
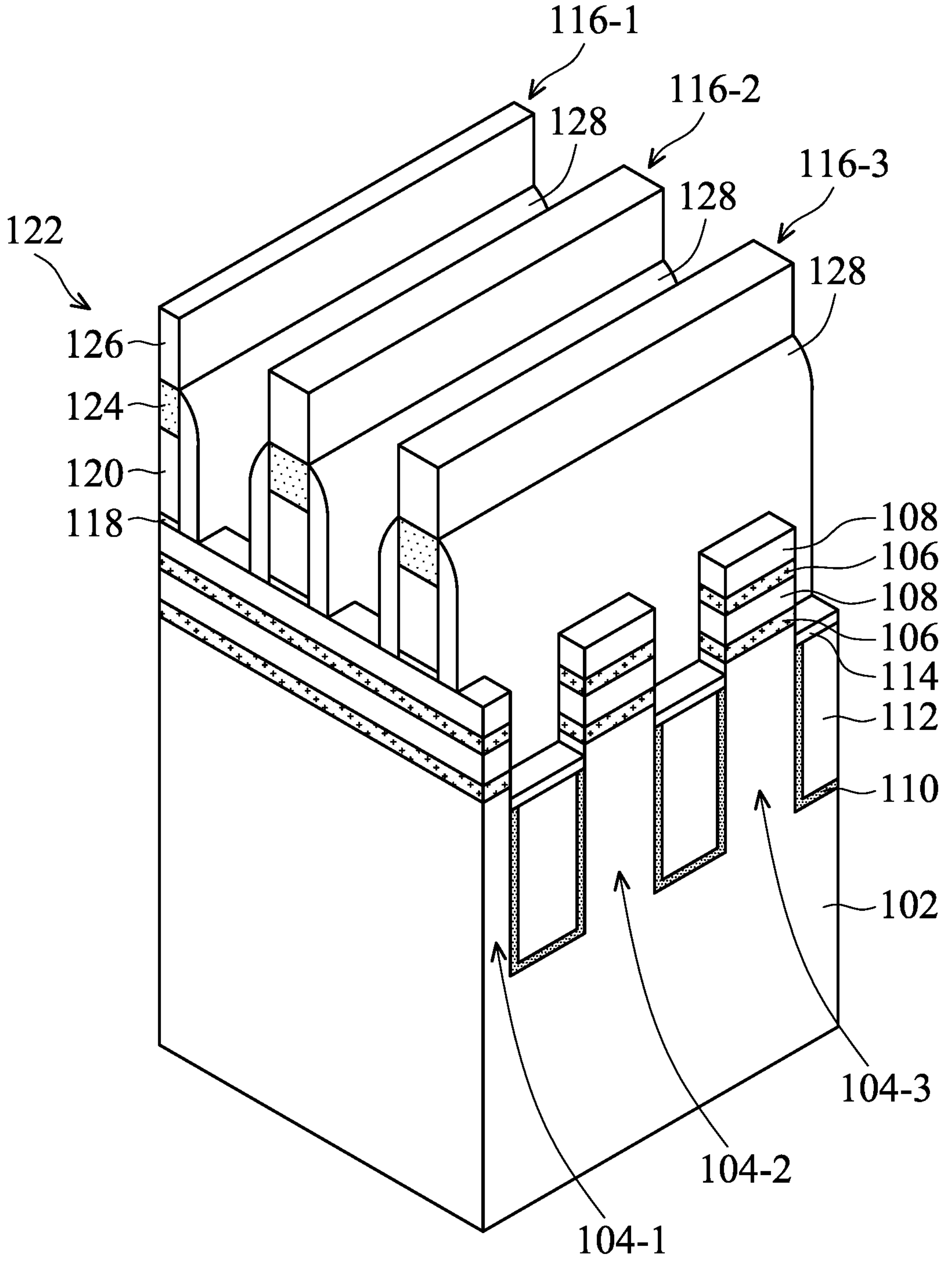
Figure 1G:
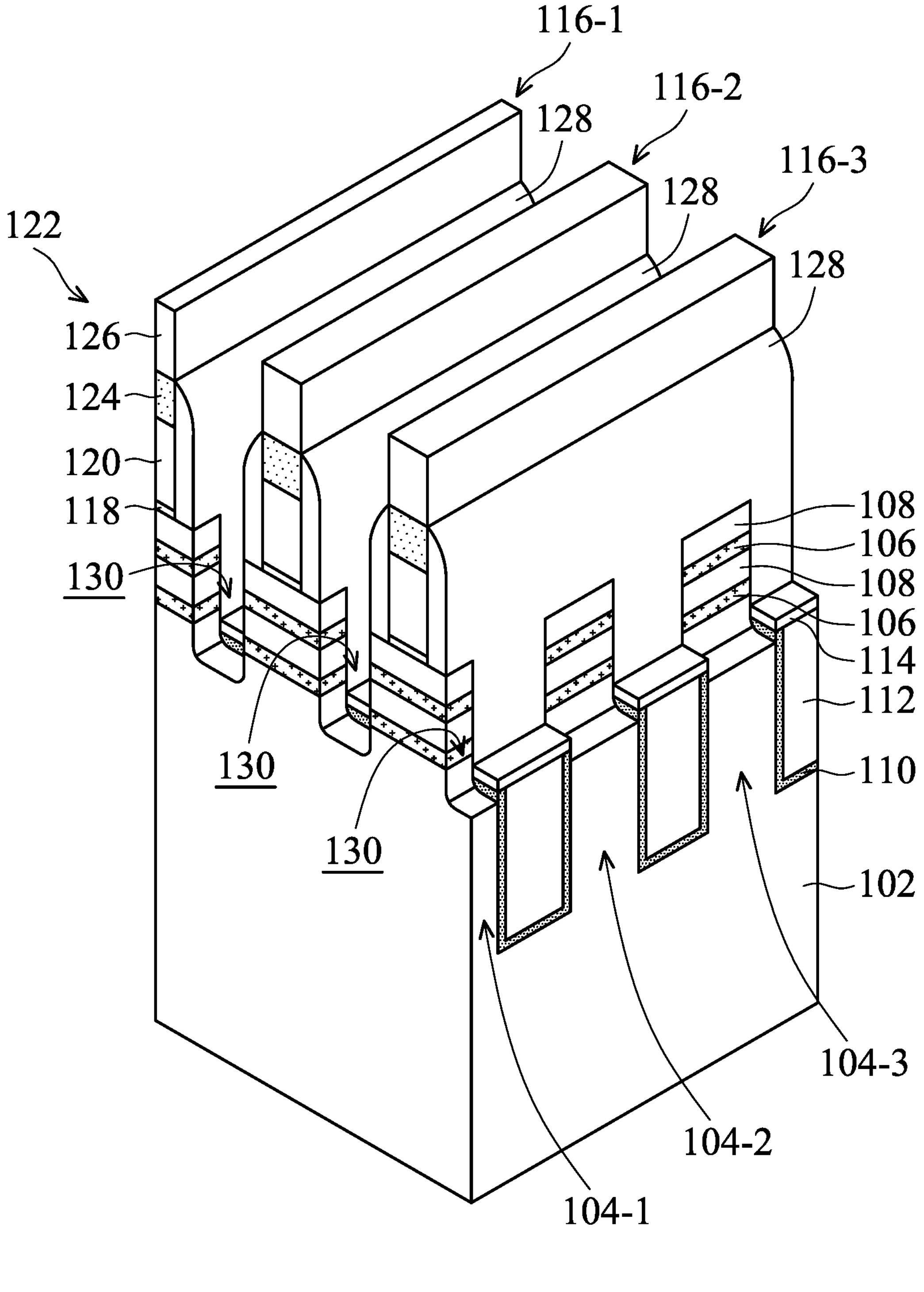
Figure 1H:
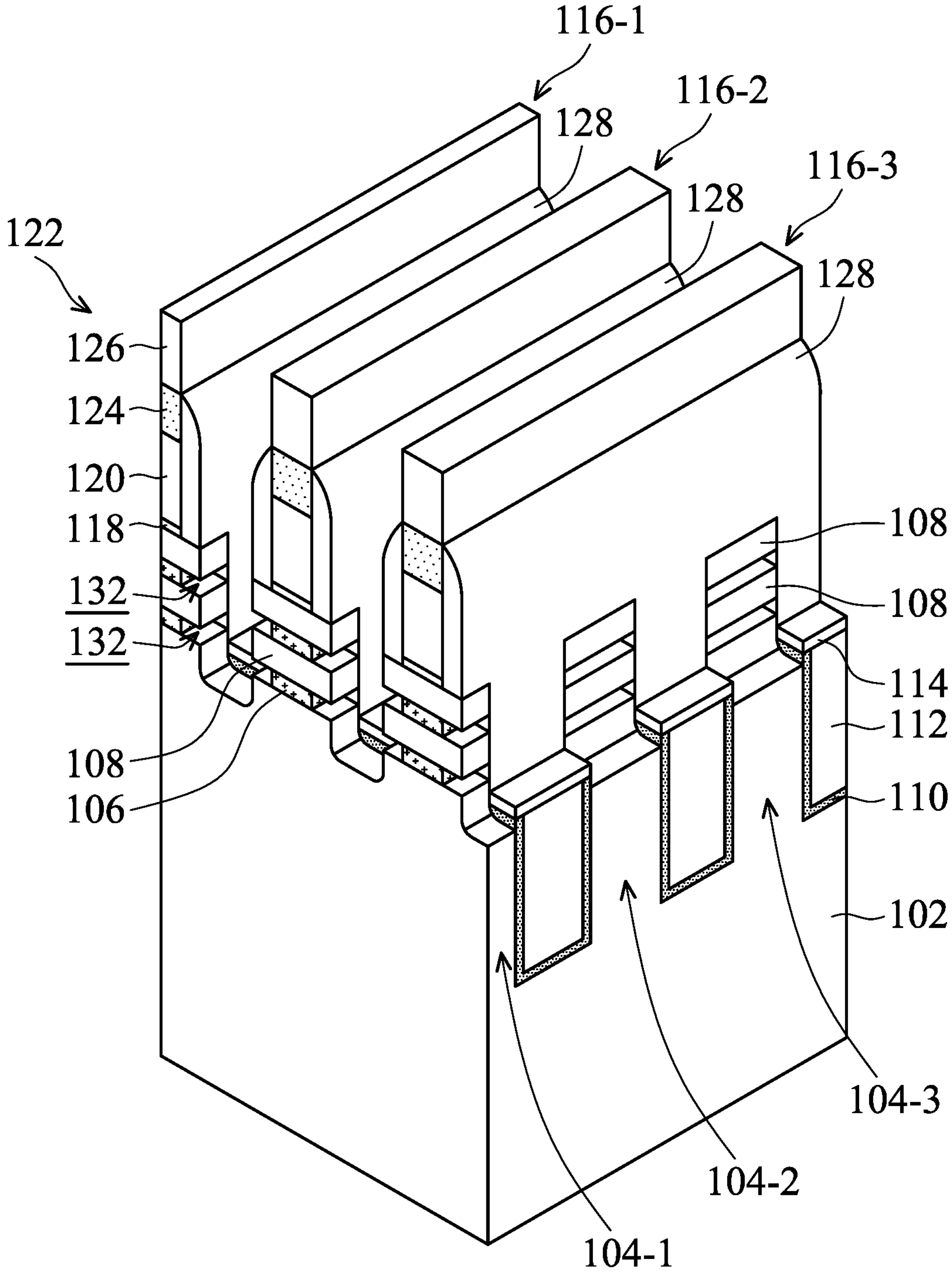
Figure 1I:
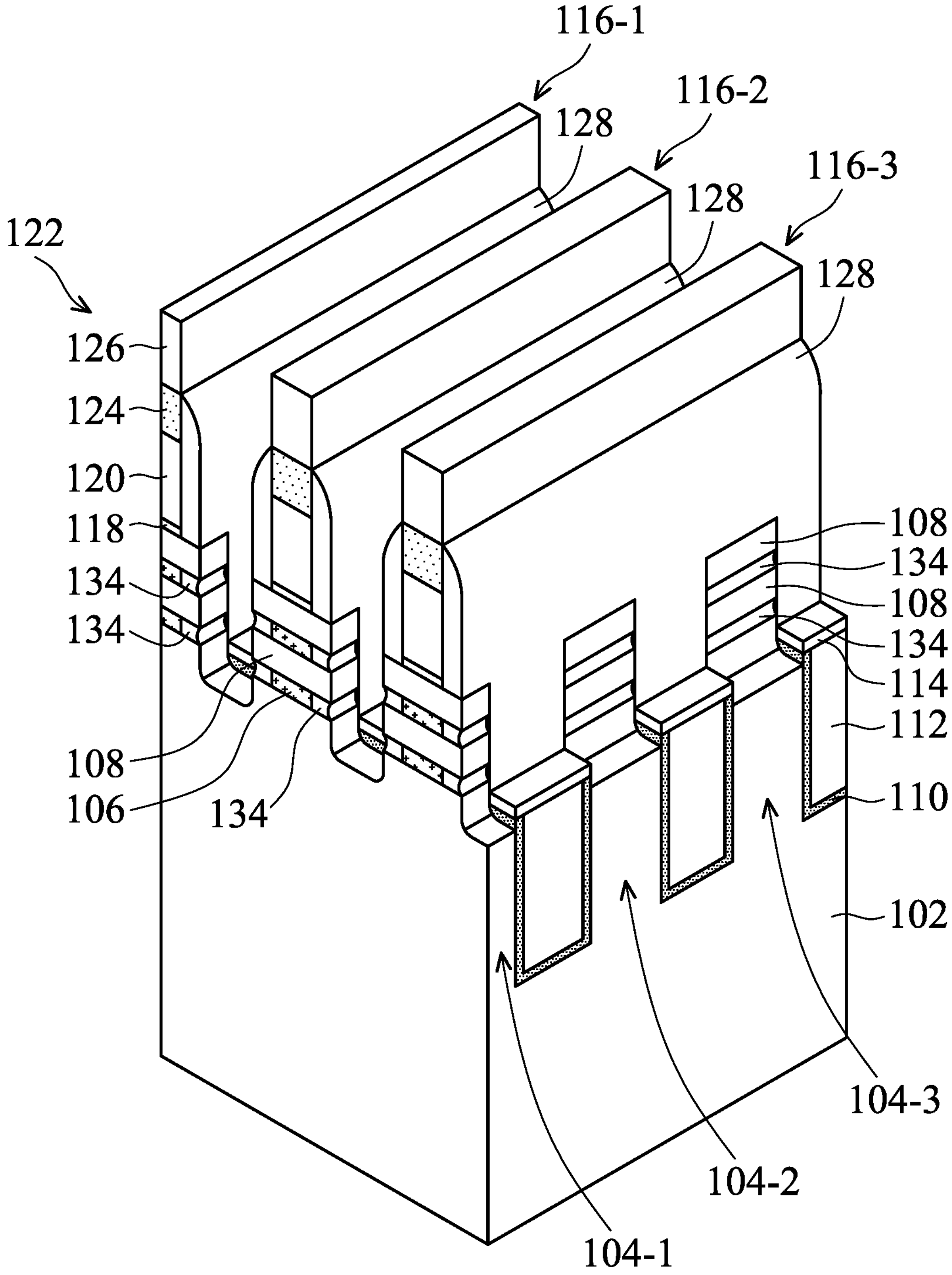
Figure 1J:
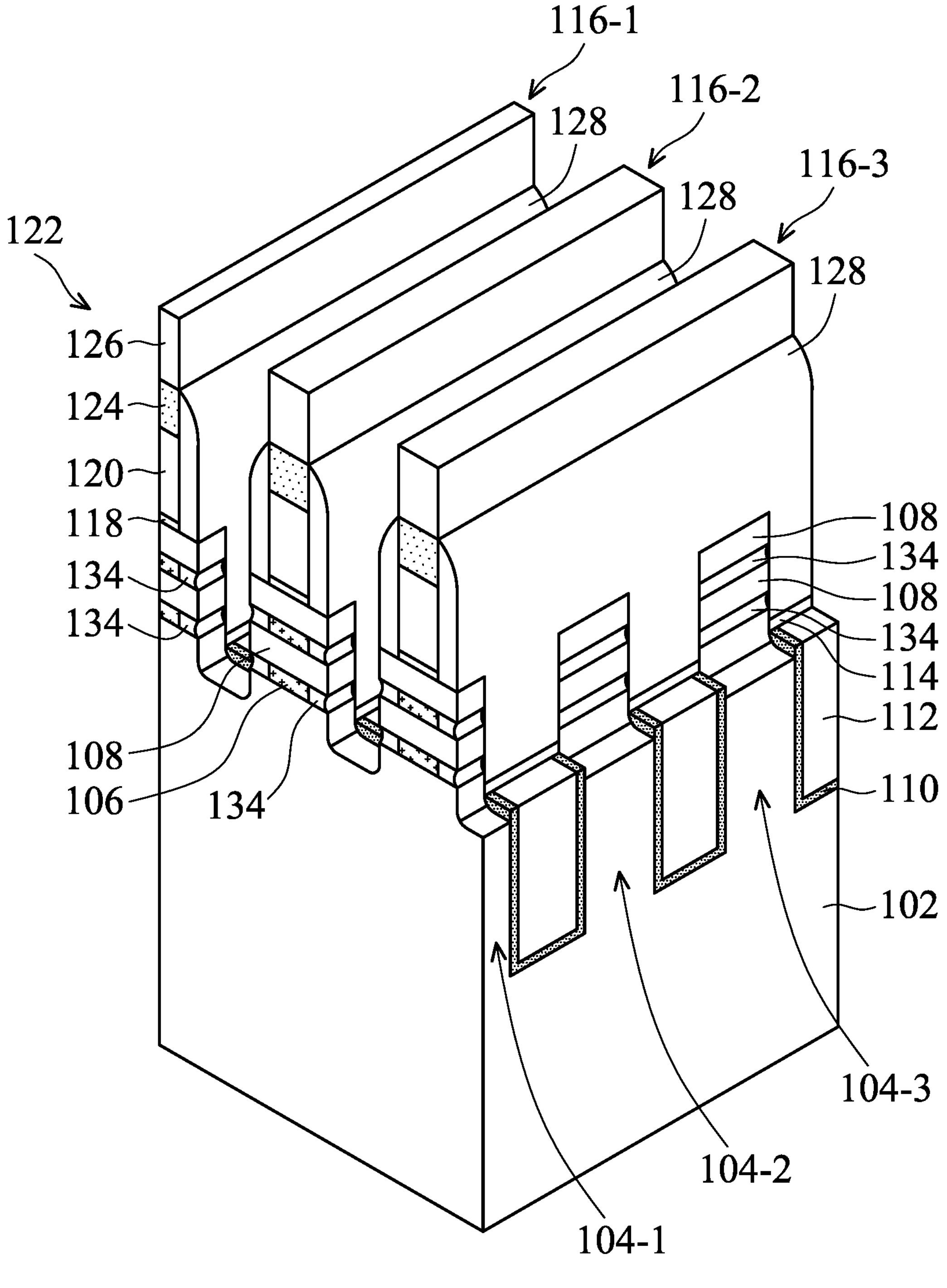
Figure 1K:
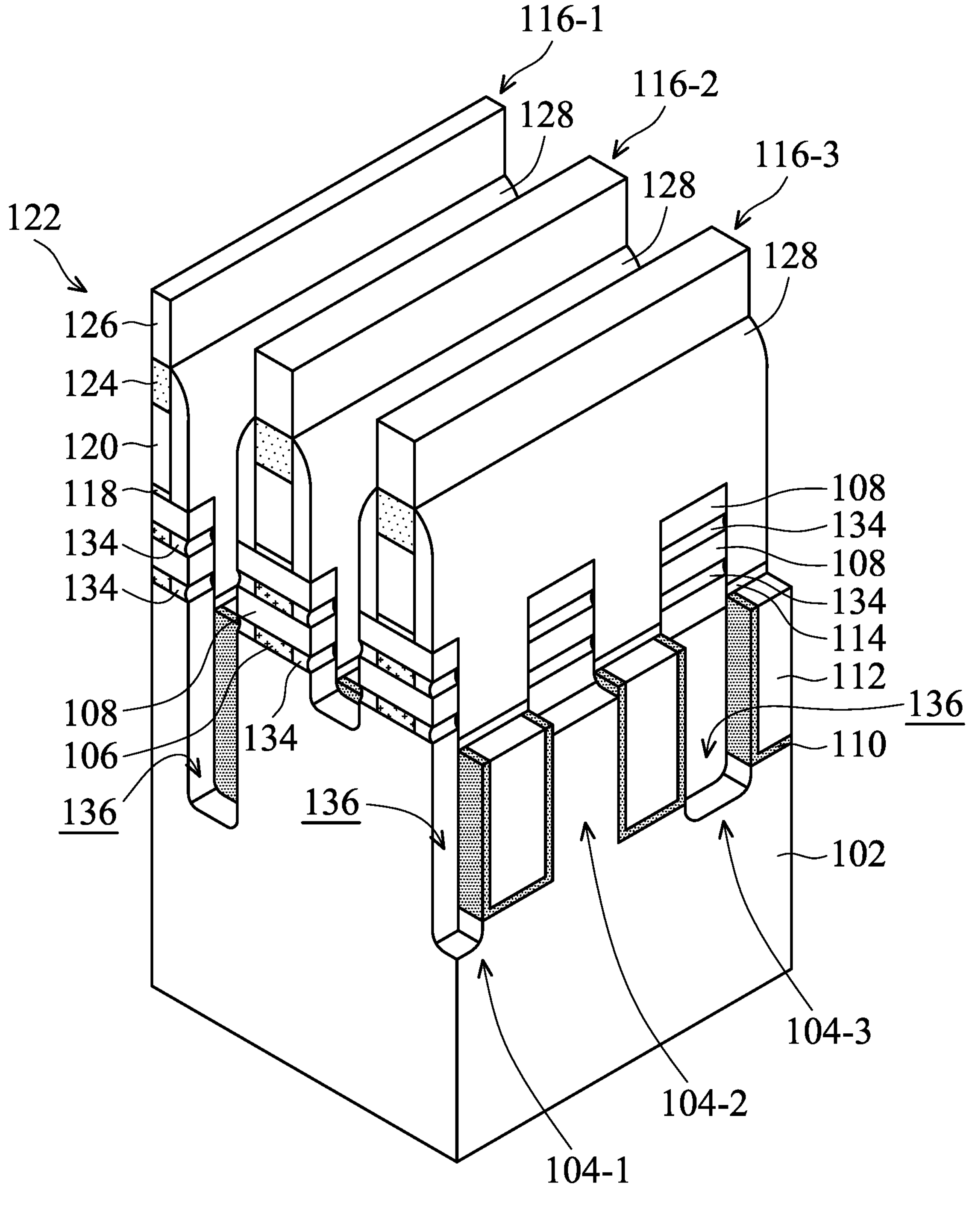
Figure 1L:
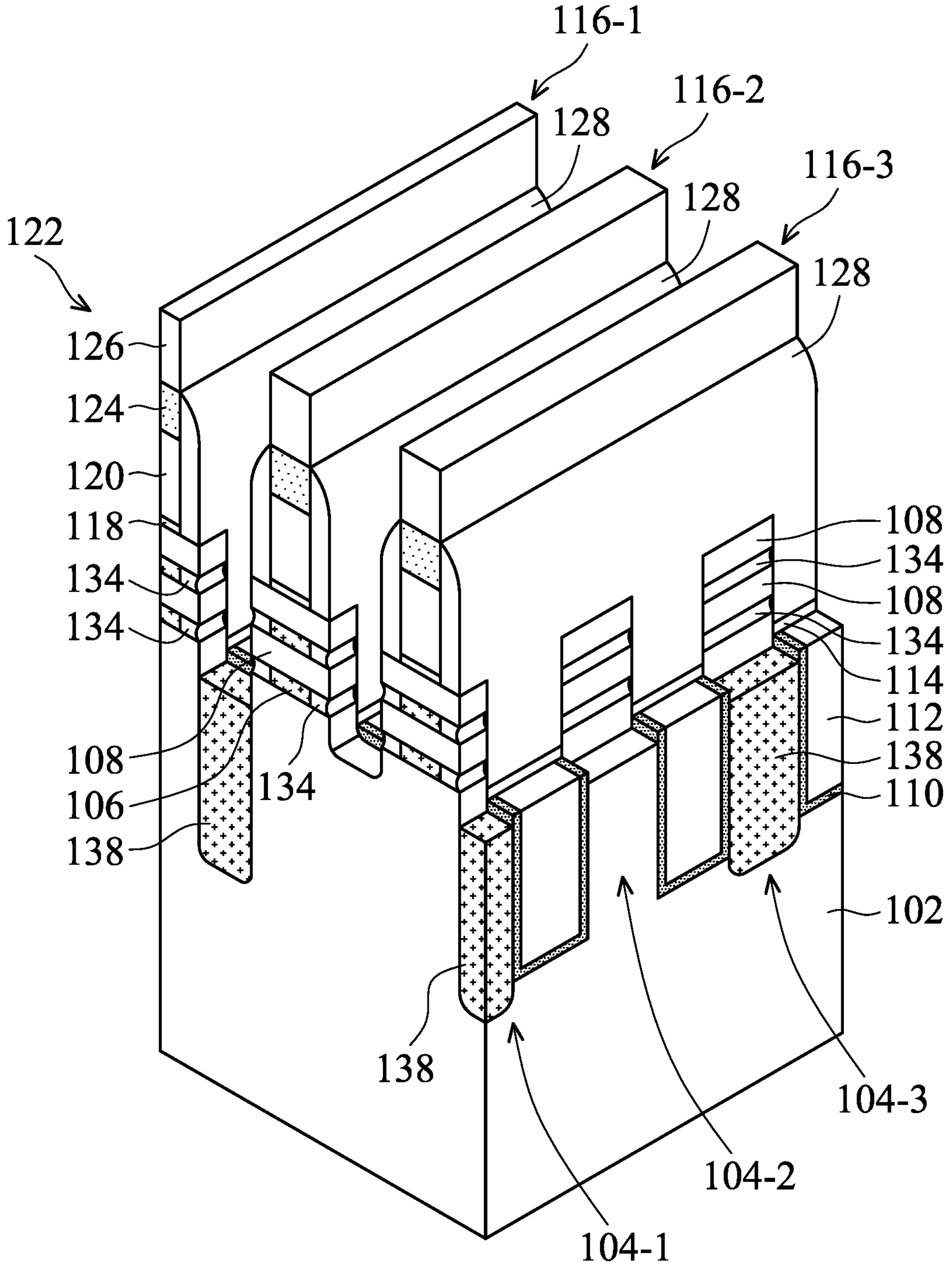
Figure 1M:
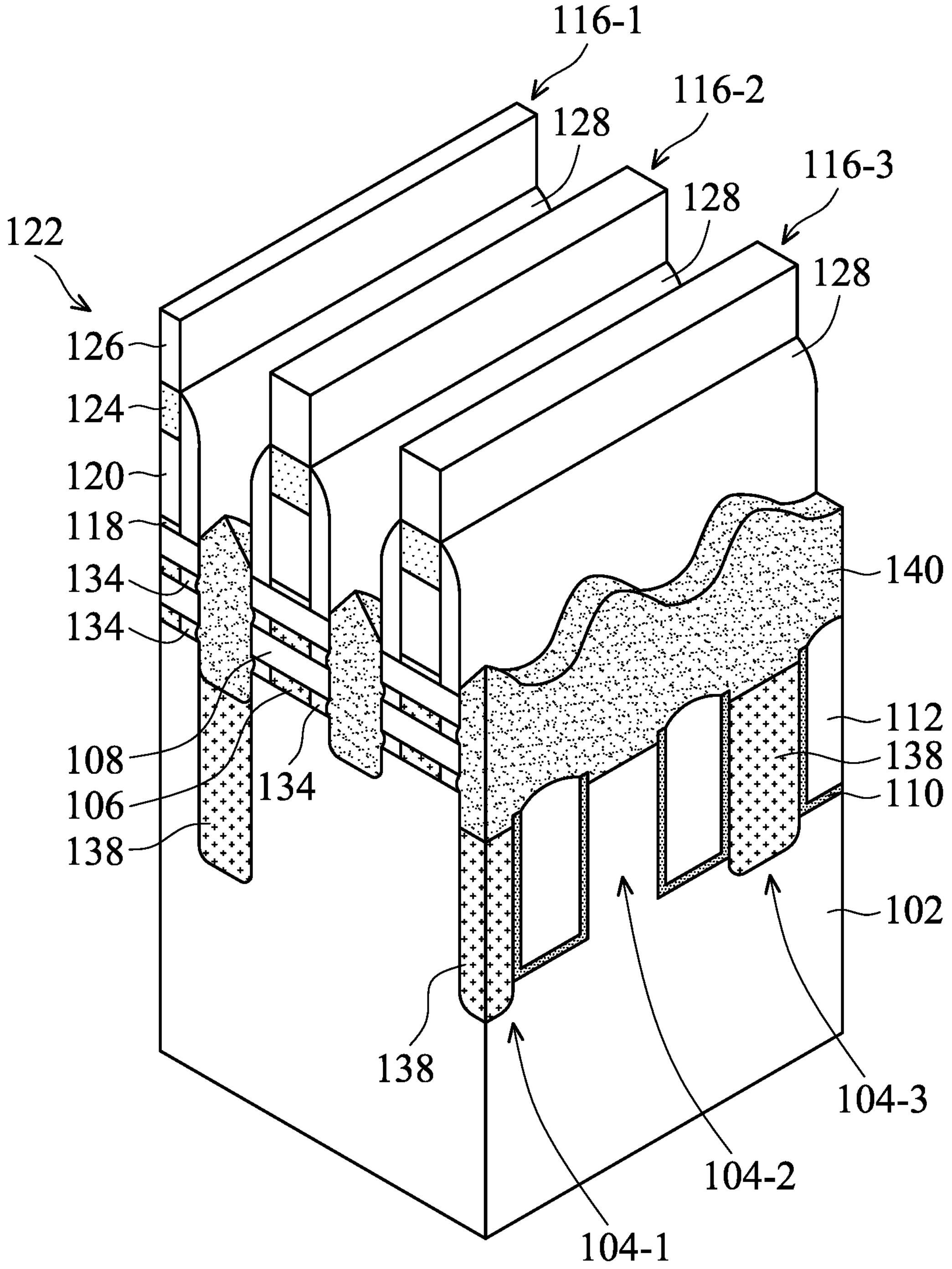
Figure 1N:
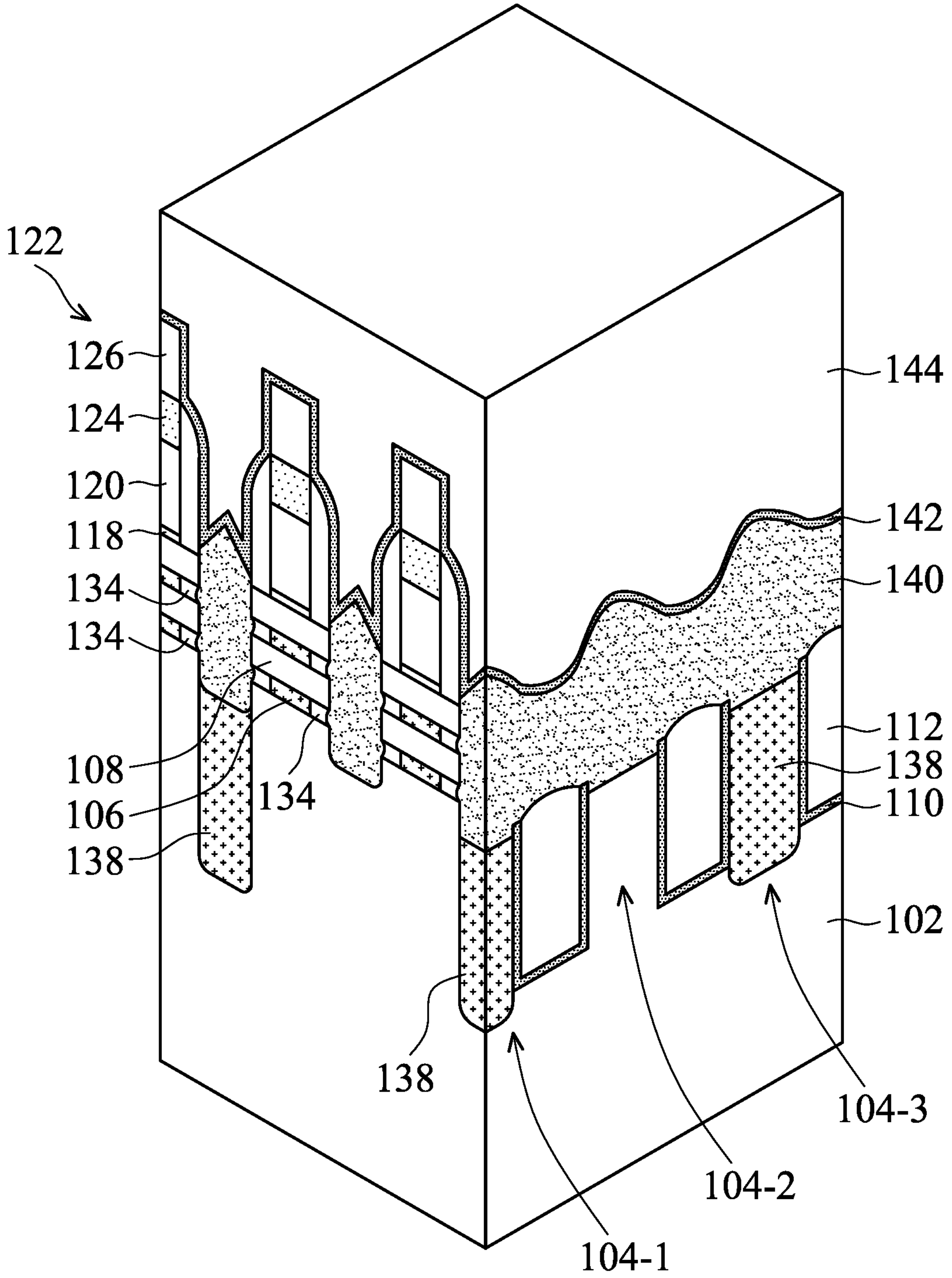
Figure 1O:
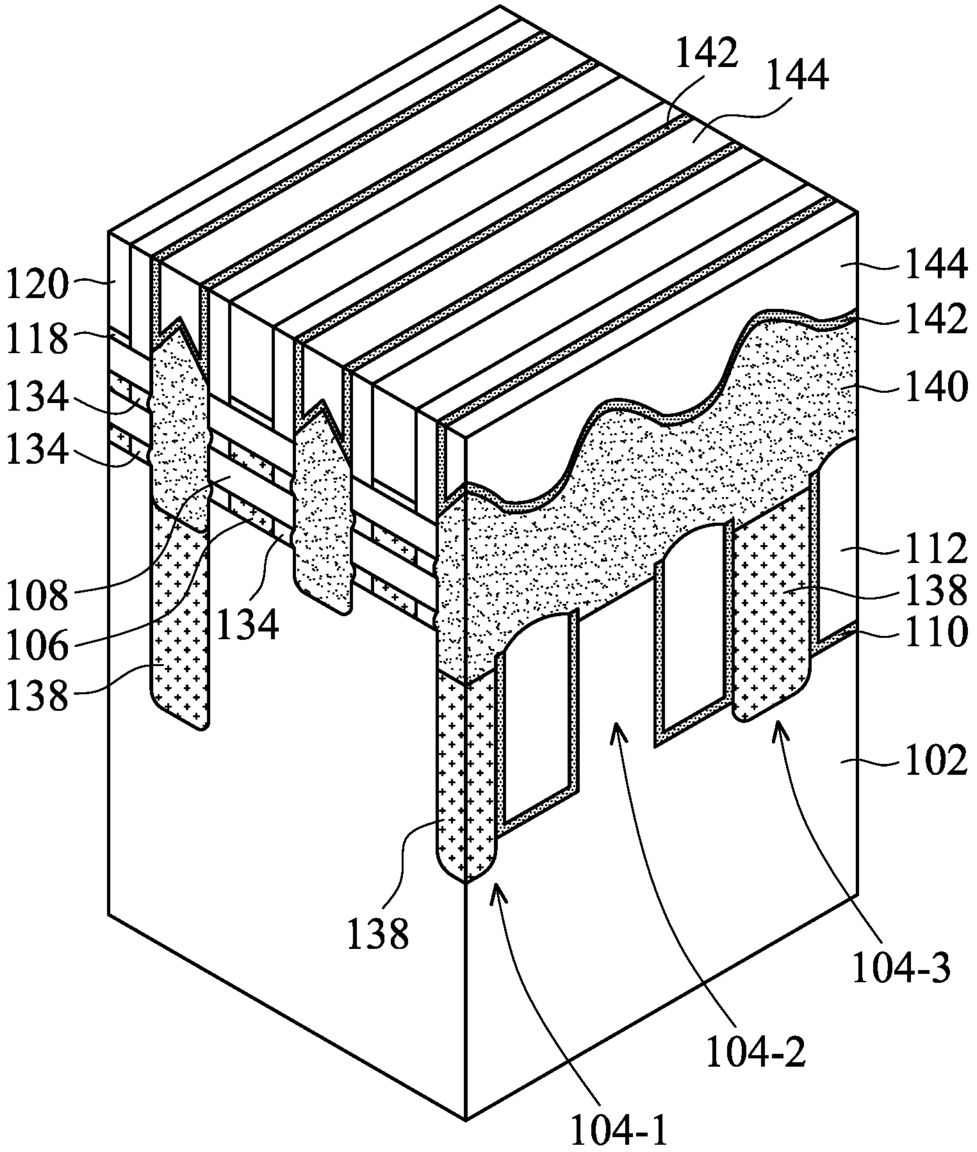
Figure 1P:
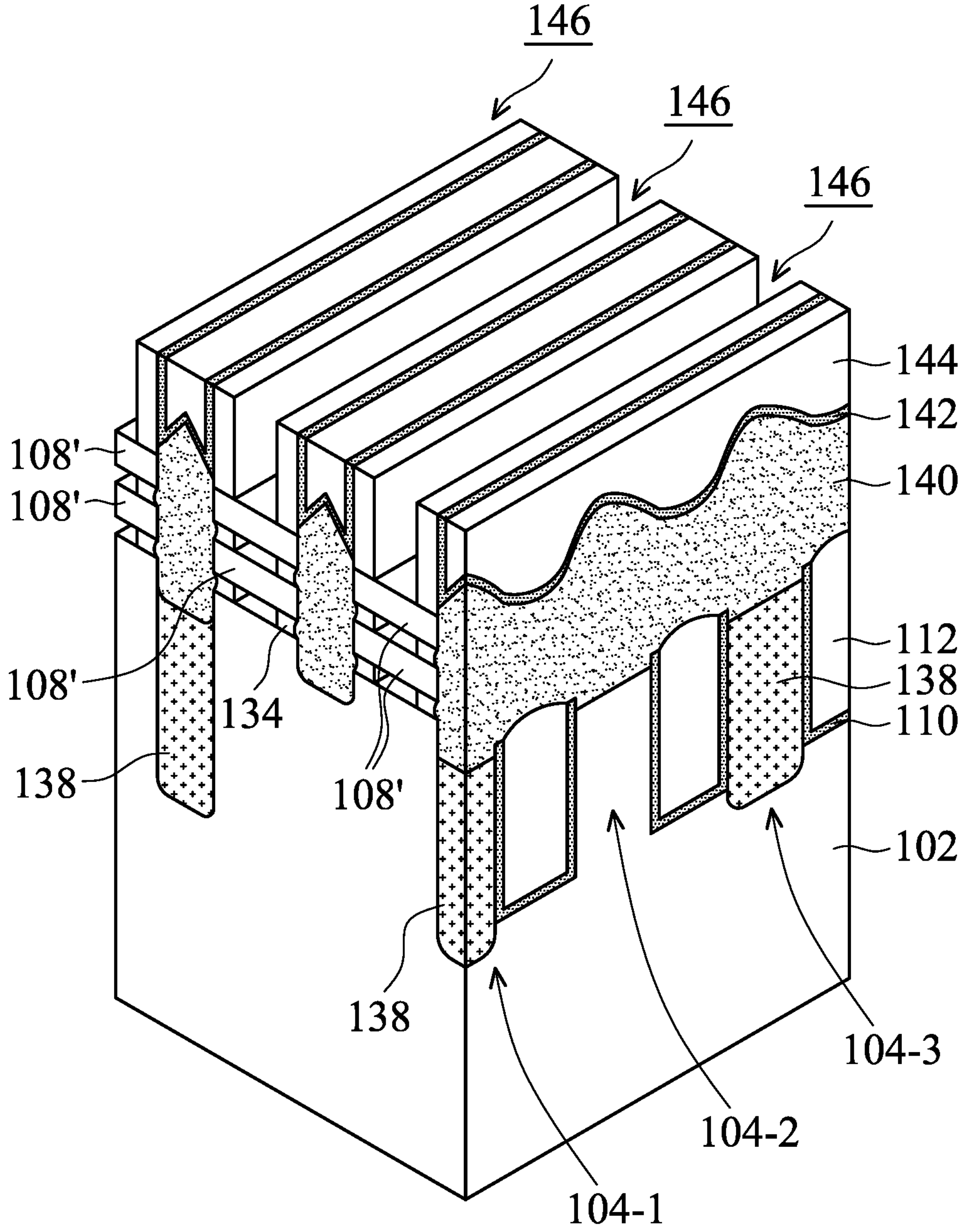
Figure 1Q:
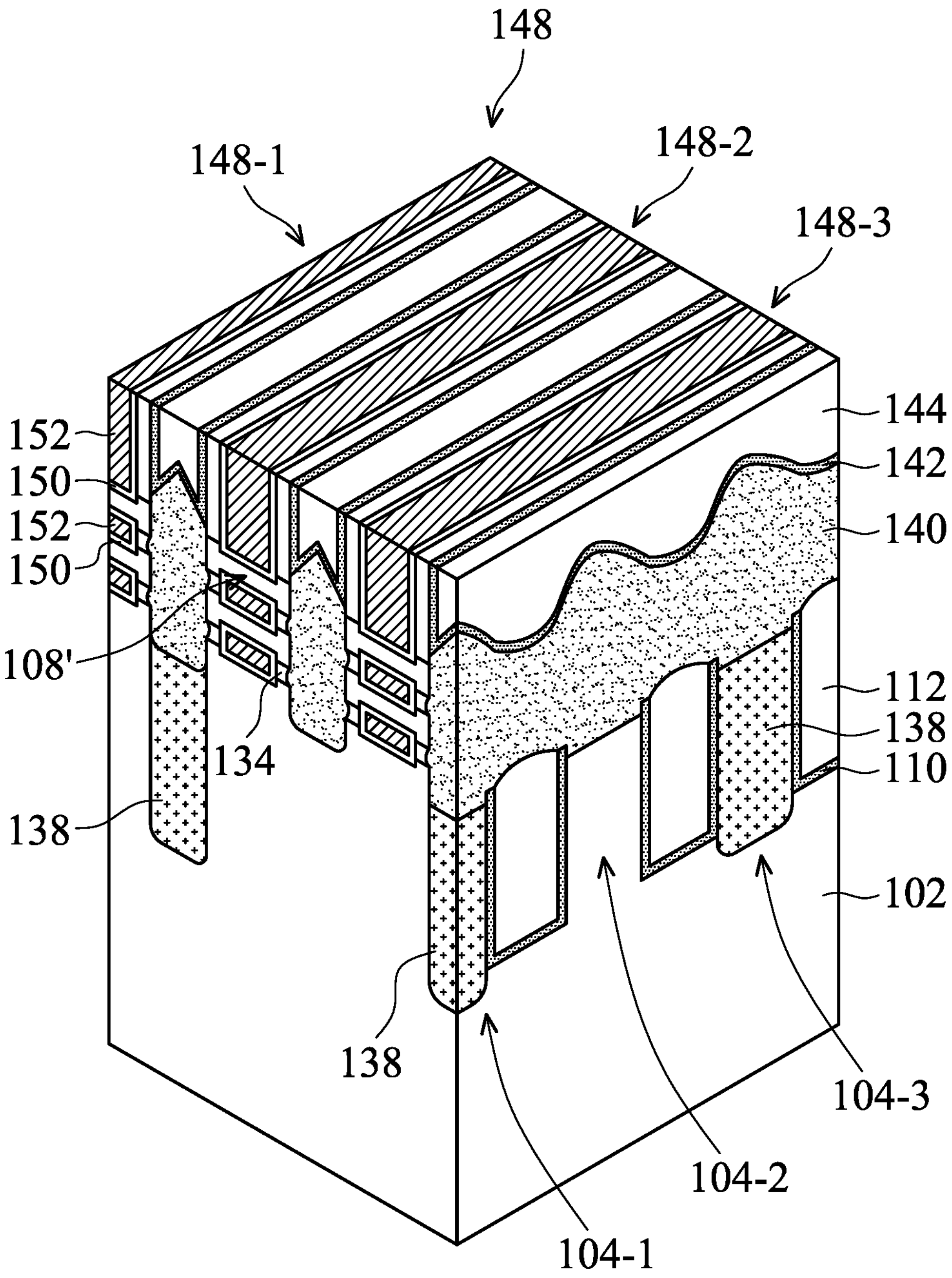
Figure 1R:
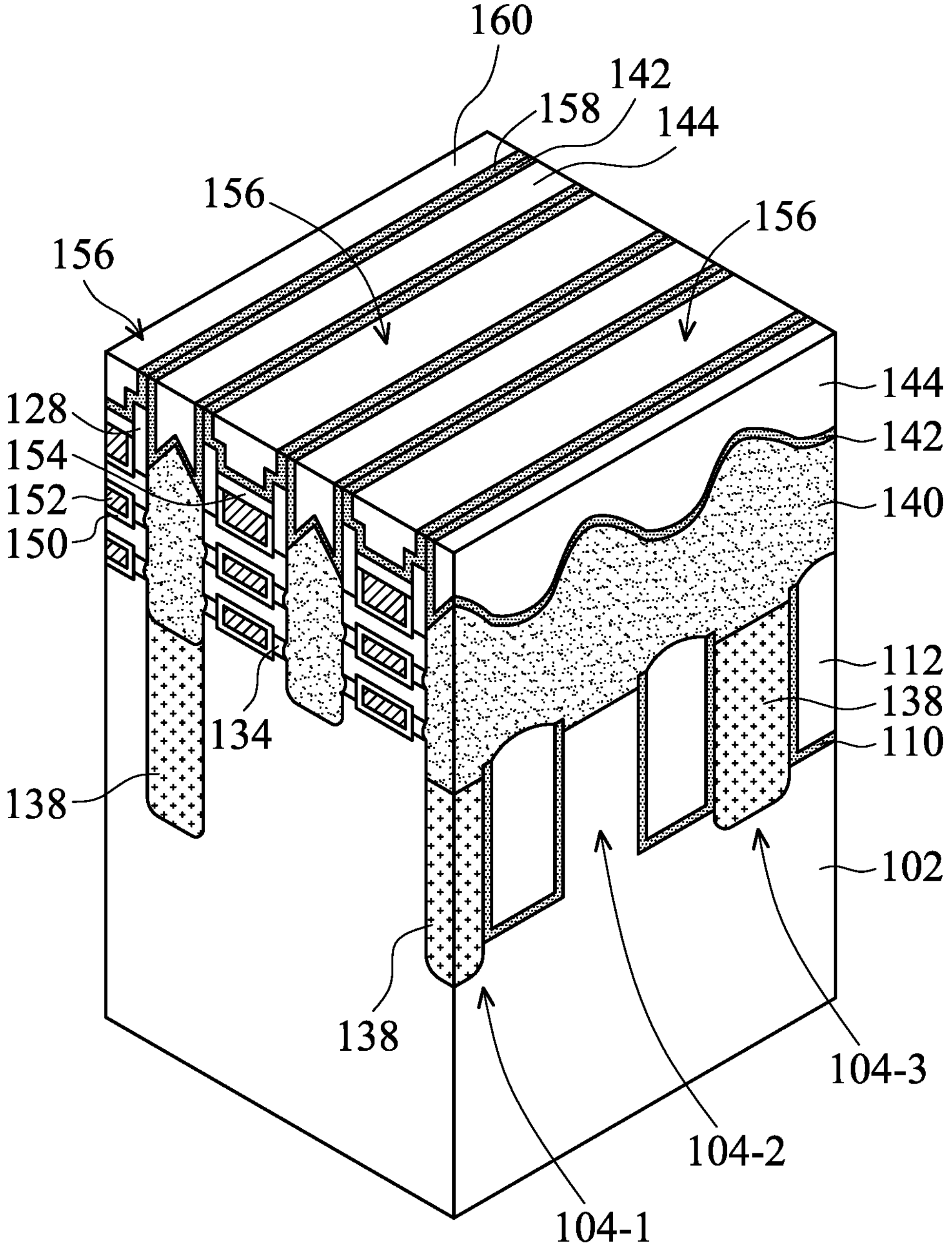
Figure 1S:
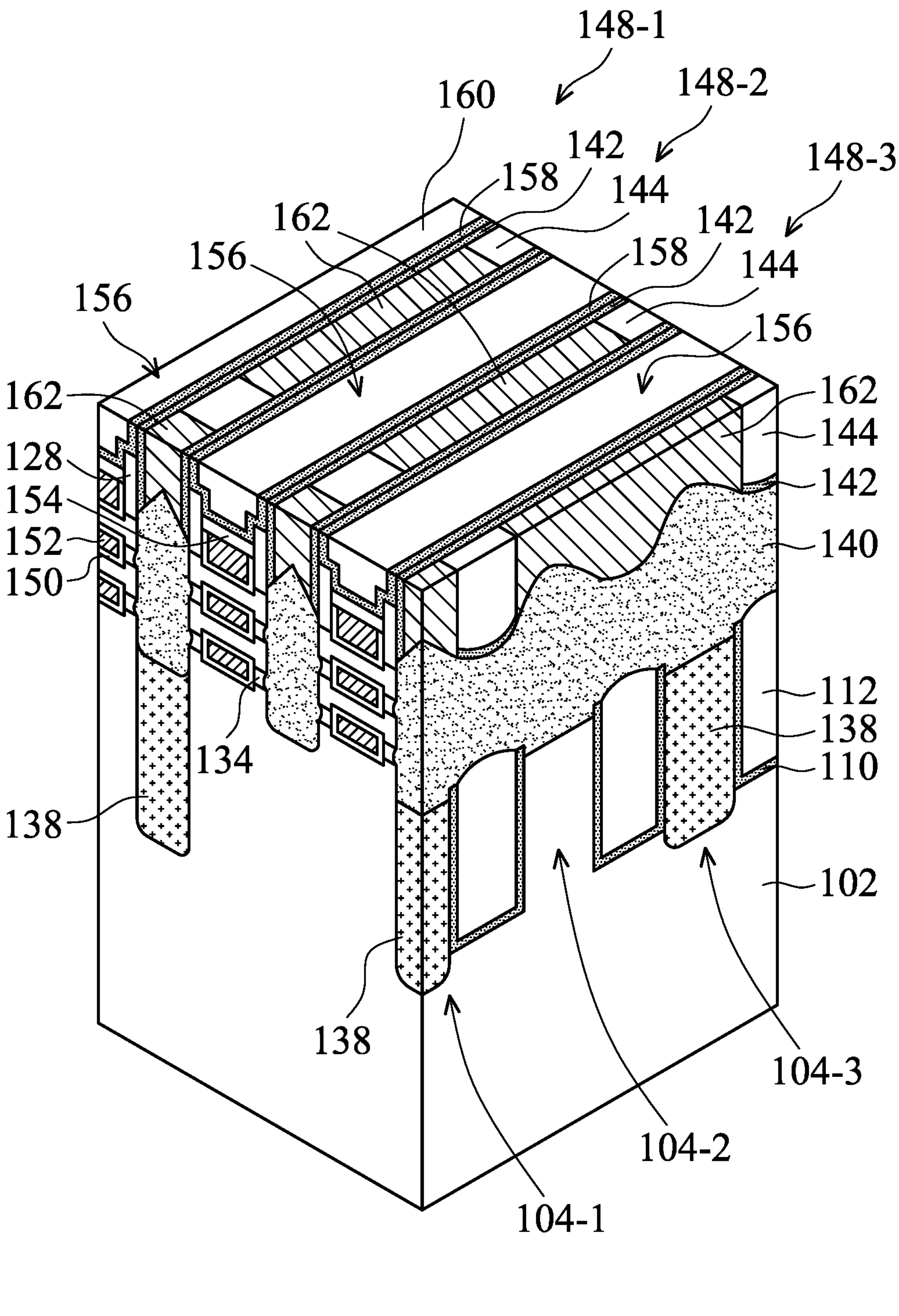
Figure 1T:
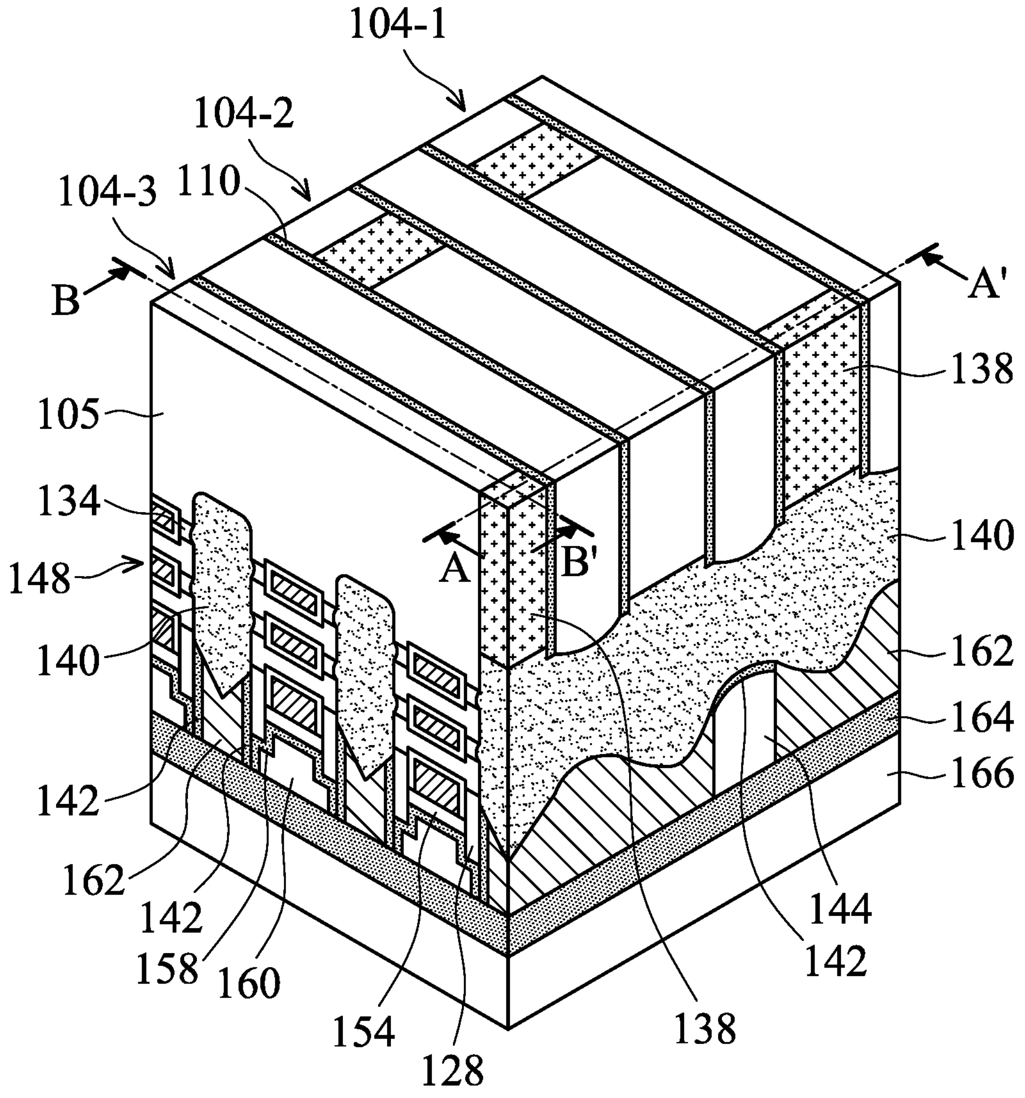
Figures 1, 1T:
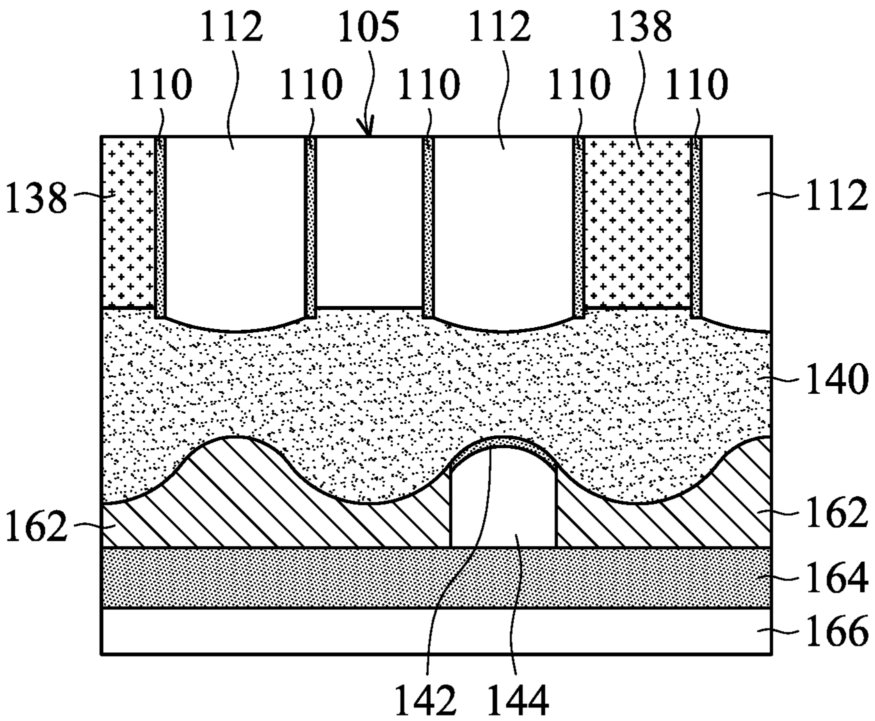
Figures 1, 1T, 2:
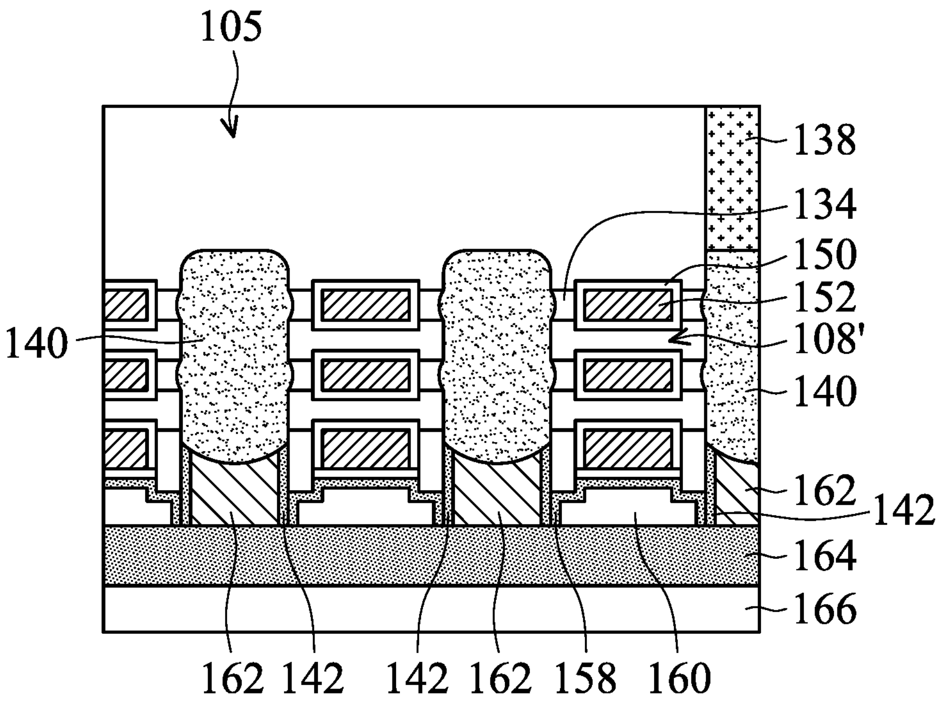
Figure 9A:
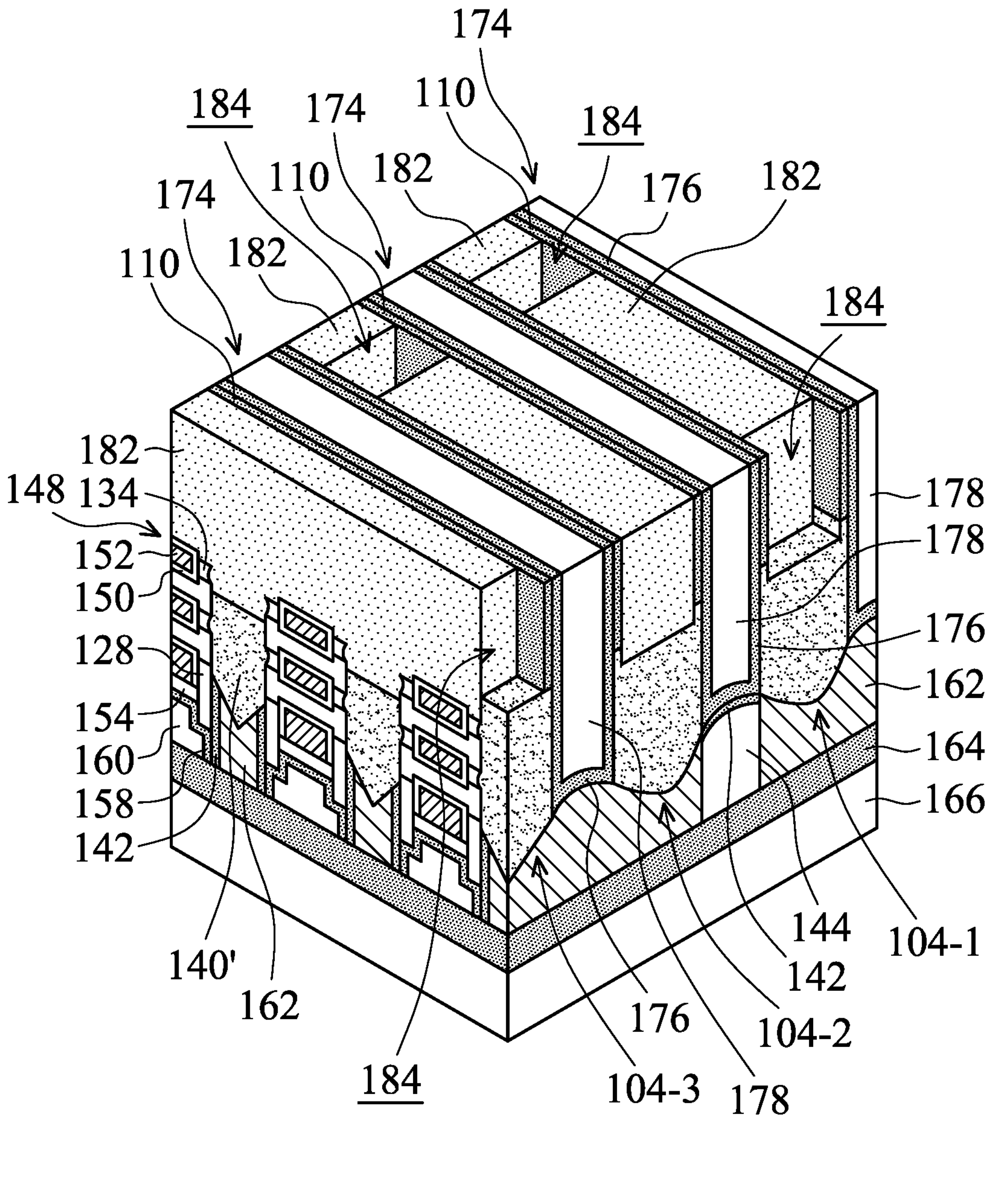
FIGS. 9A and 9B illustrate diagrammatic perspective views of intermediate stages of manufacturing a semiconductor structure in accordance with some embodiments.
Figure 9B:
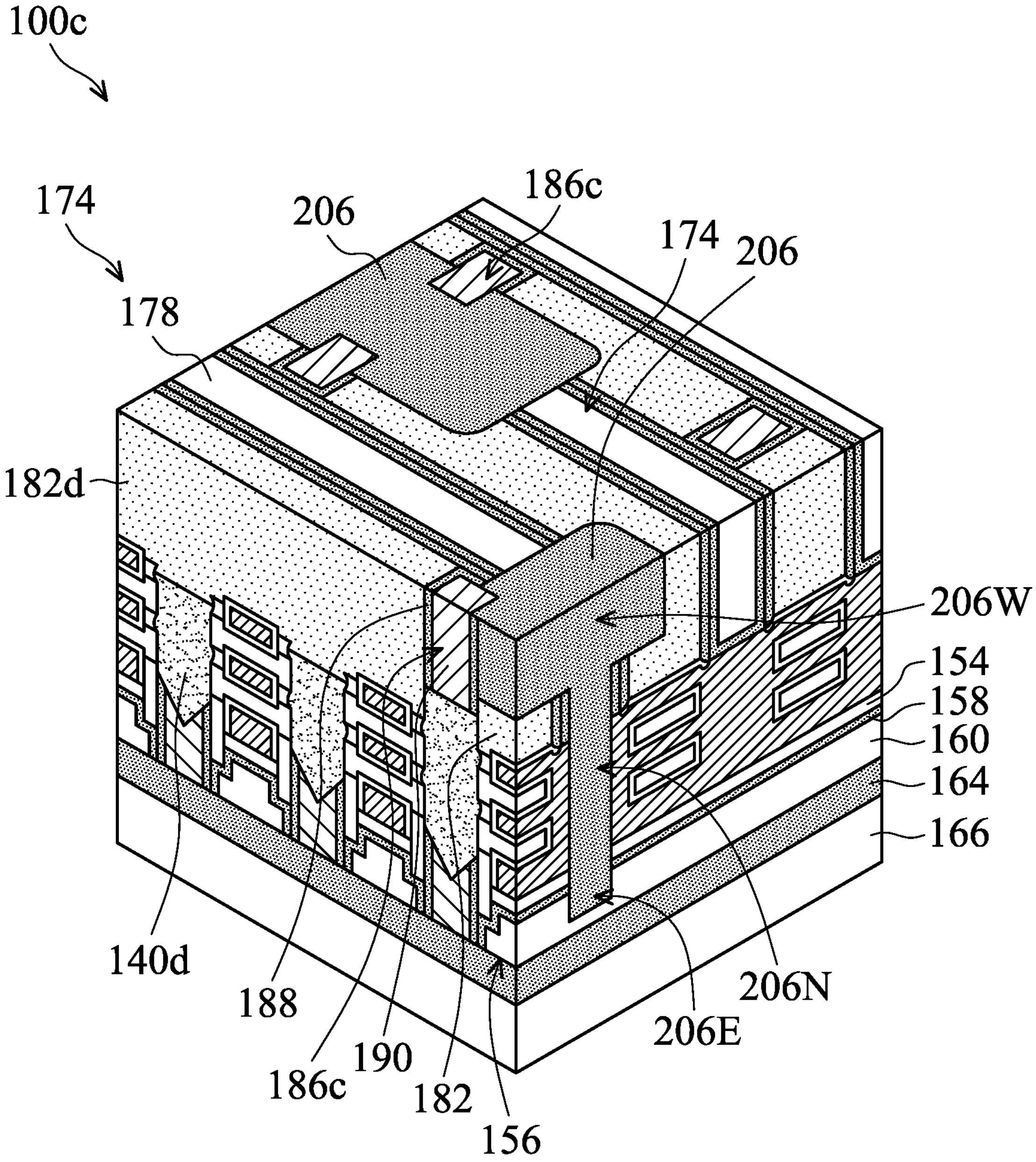
Figures 1, 9B:
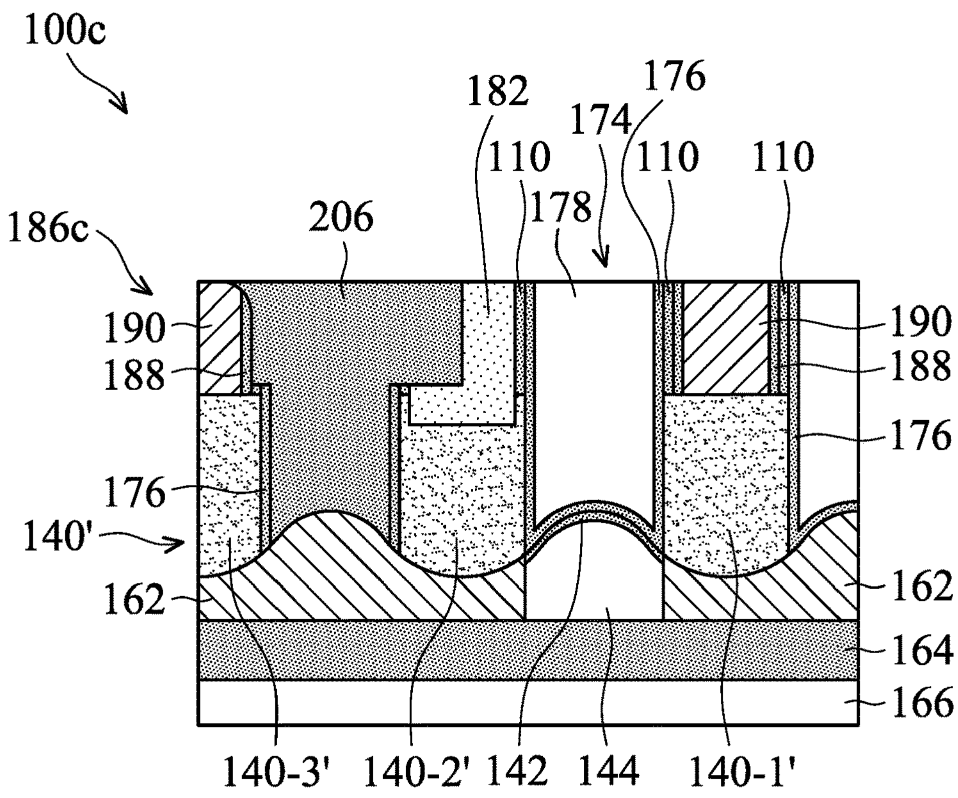
Figures 2, 9B:
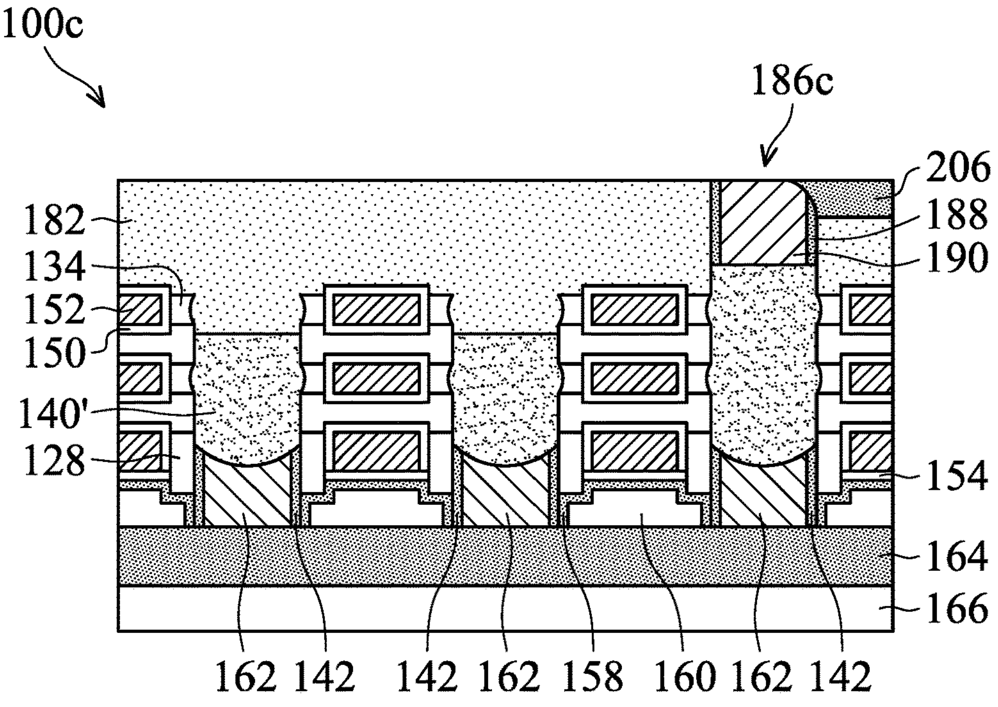

FIG. 9B-2 illustrates a cross-sectional view of the semiconductor structure 100*c* shown along and over the source/drain structure parallel to the extending direction of the nanostructures in accordance with some embodiments.

Figure 10A:
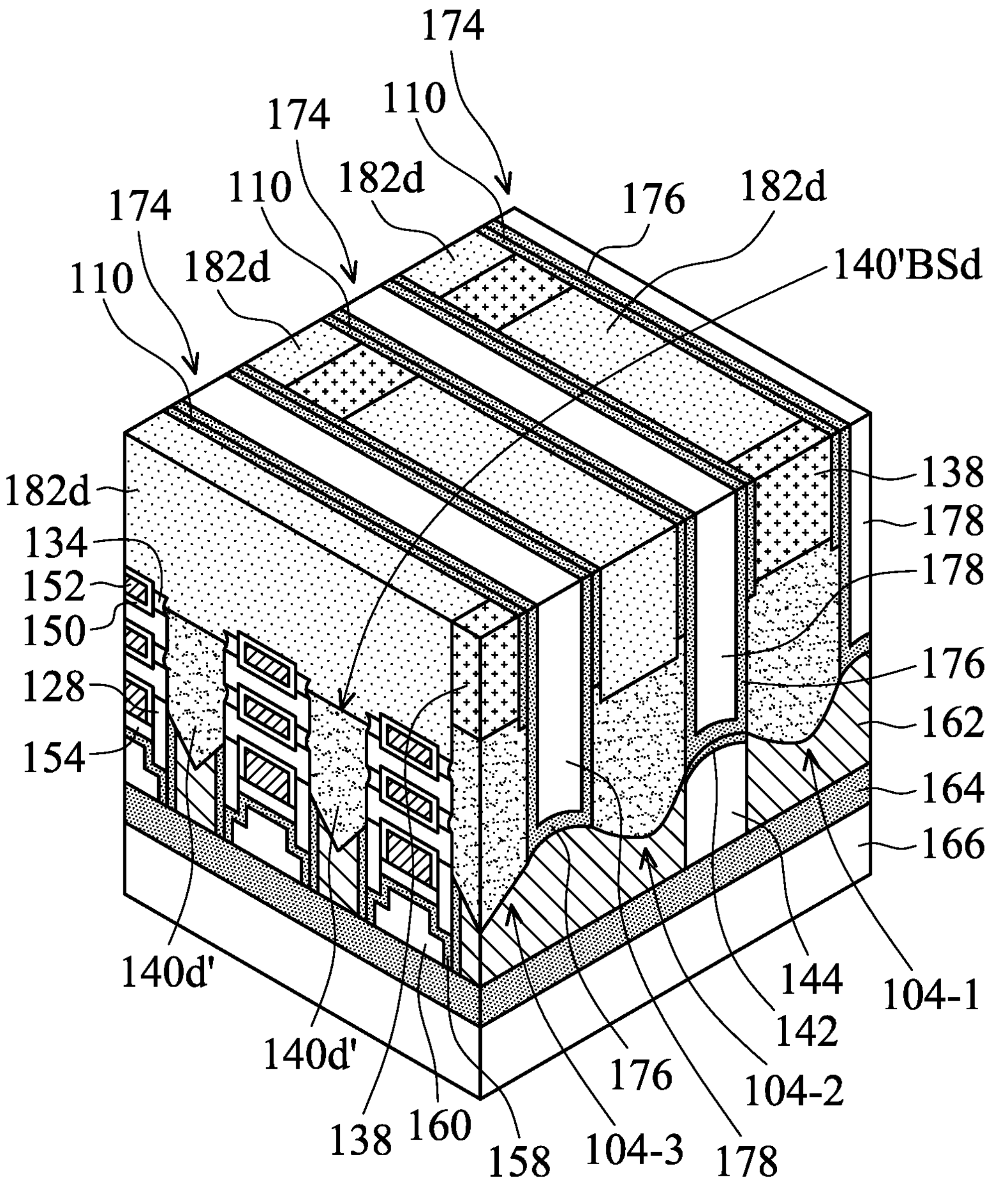
Figure 10B:
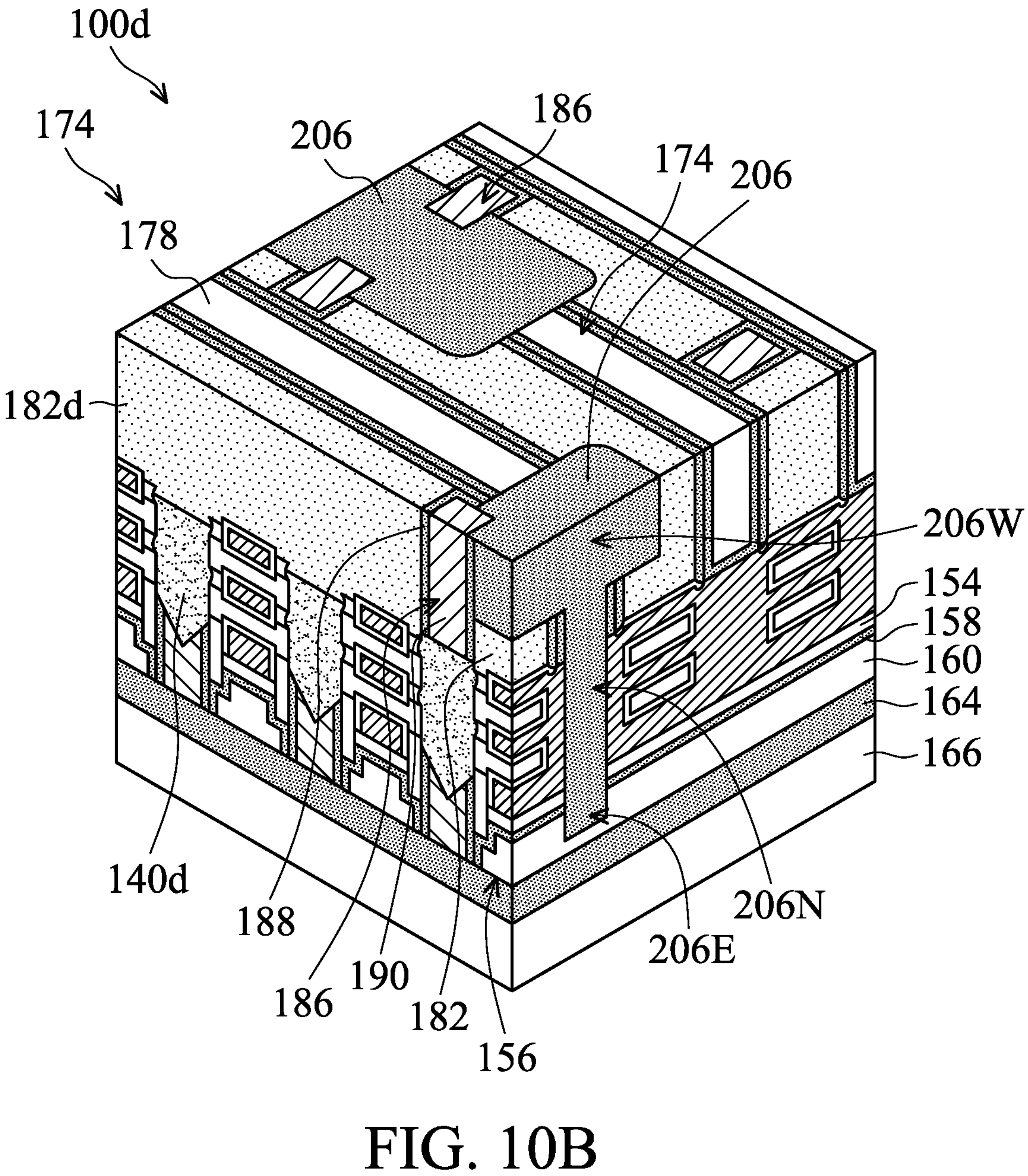

FIGS. 10A and 10B illustrate diagrammatic perspective views of intermediate stages of manufacturing a semiconductor structure in accordance with some embodiments.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistors.

Embodiments of semiconductor structures and methods for forming the same are provided. The semiconductor structures may include first nanostructures and second nanostructures formed over a substrate and a gate structure wraps around the first nanostructures and the second nanostructures. A source/drain structure may be formed attached to both the first nanostructures and second nanostructures first, and then separated into two source/drain structures by a backside source/drain isolation feature. Since the source/drain structures attached to the first nanostructures and the second nanostructures can be separated by the backside source/drain isolation features formed afterwards, the distance between the first nanostructures and the second nanostructures may be reduced without the concern of the merging of the source/drain structures. Accordingly, the device size may be reduced.

Figure 1U:
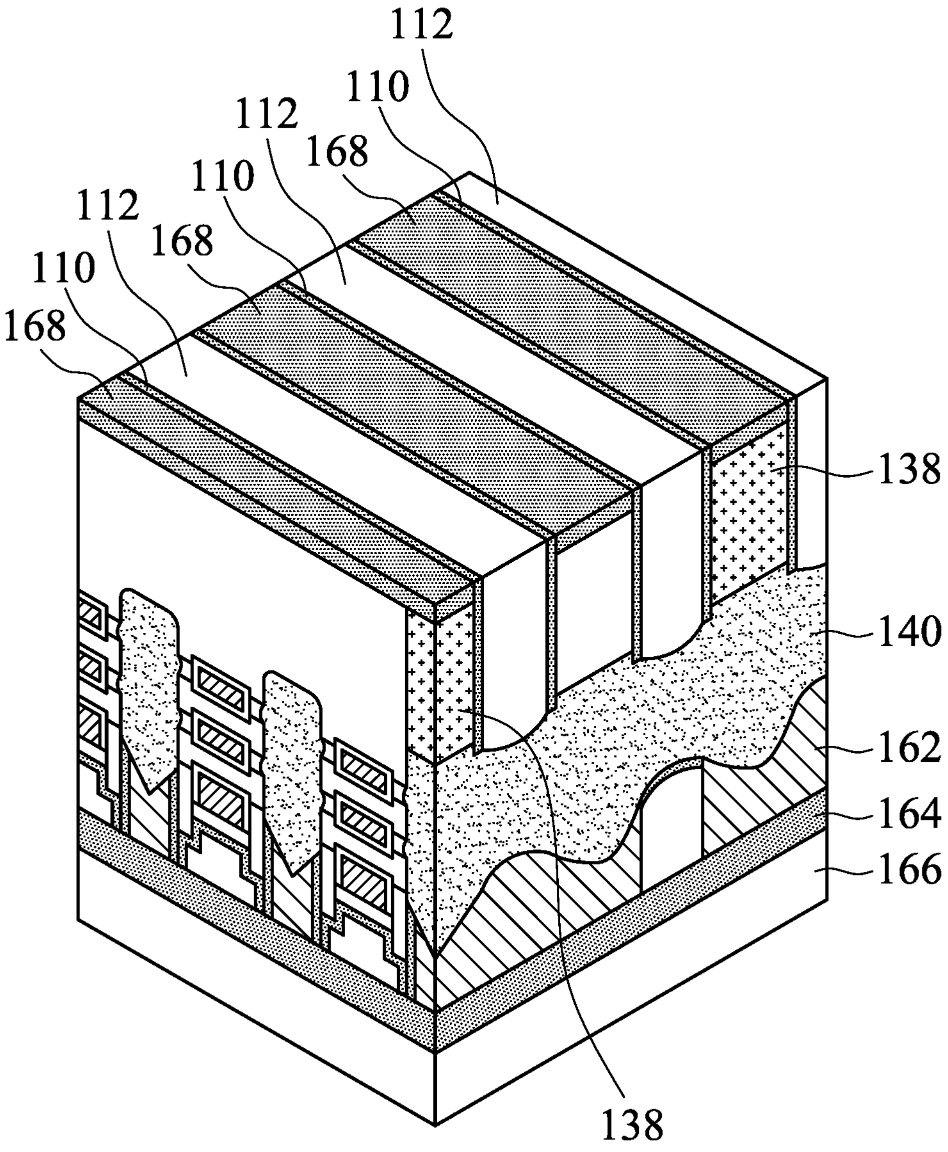
Figures 1, 1U:
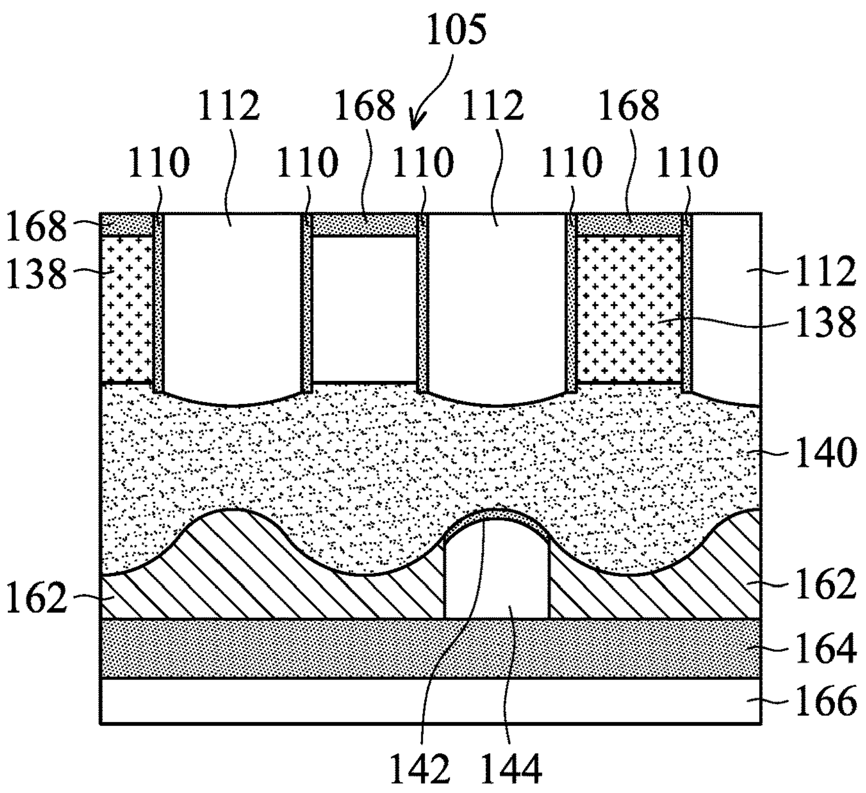
Figures 1, 1U, 2:
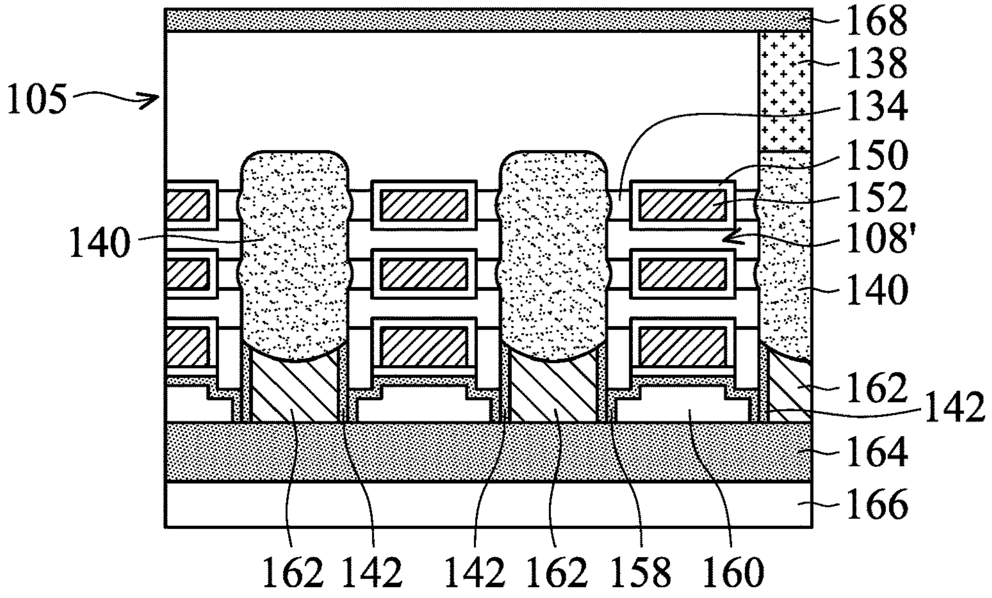
Figure 1V:
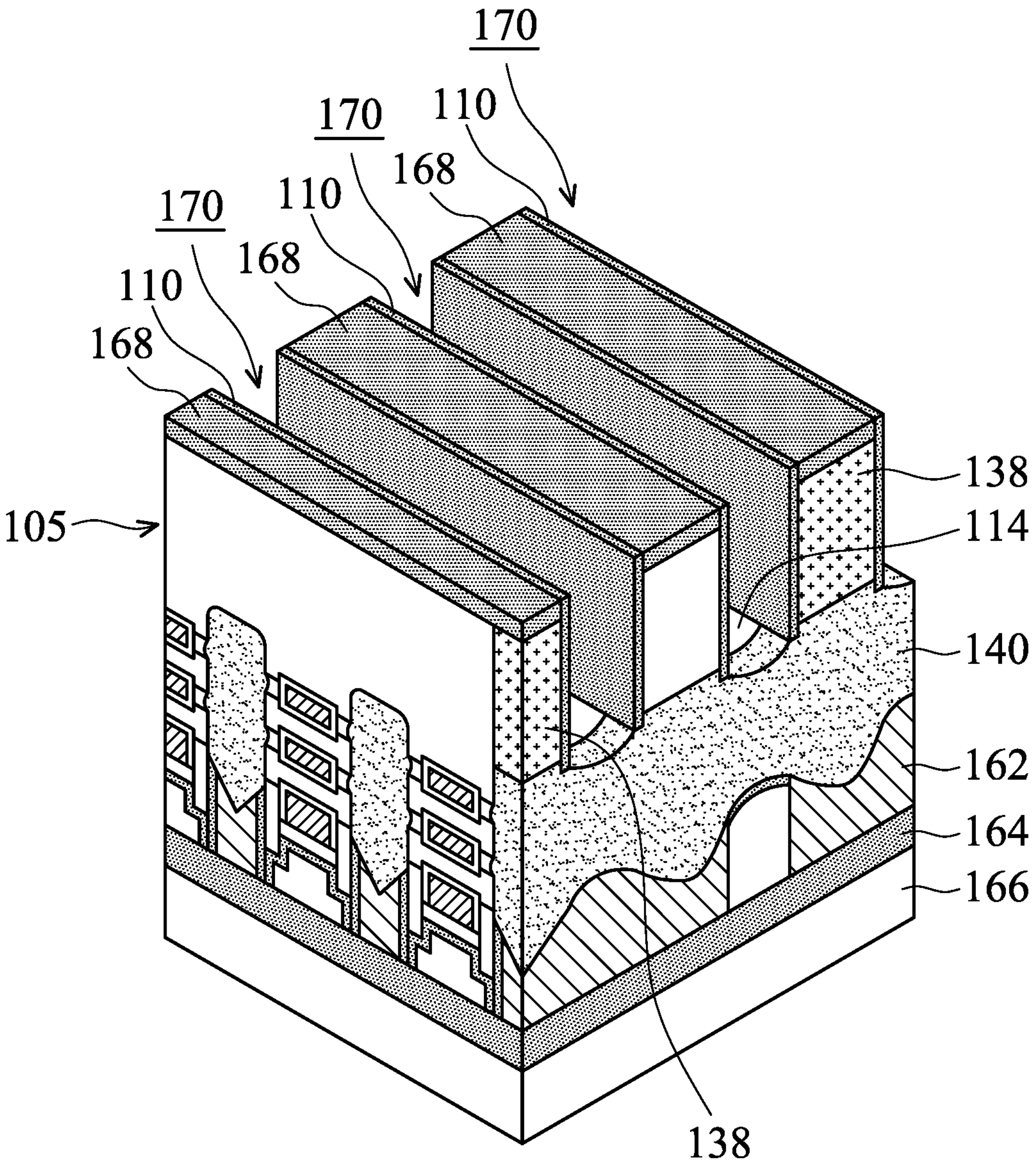
Figures 1, 1V:
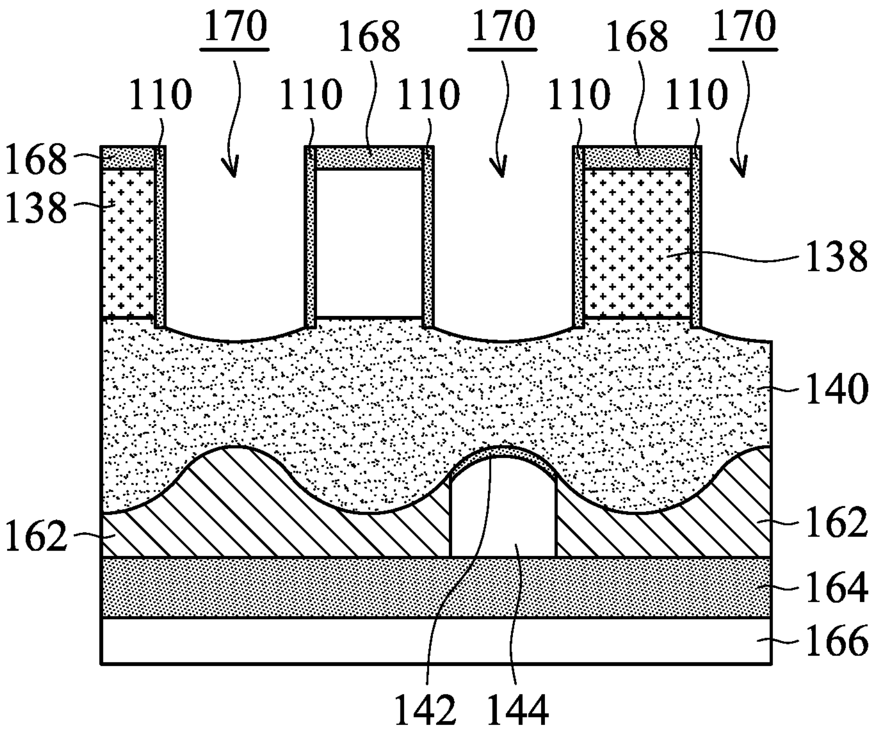
Figures 1, 1V, 2:
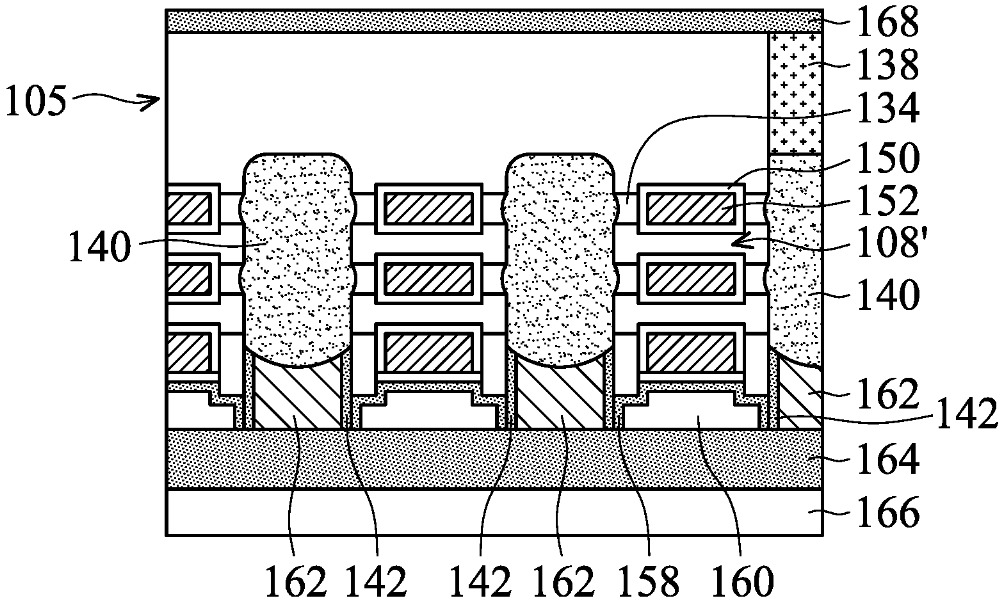
Figure 1W:
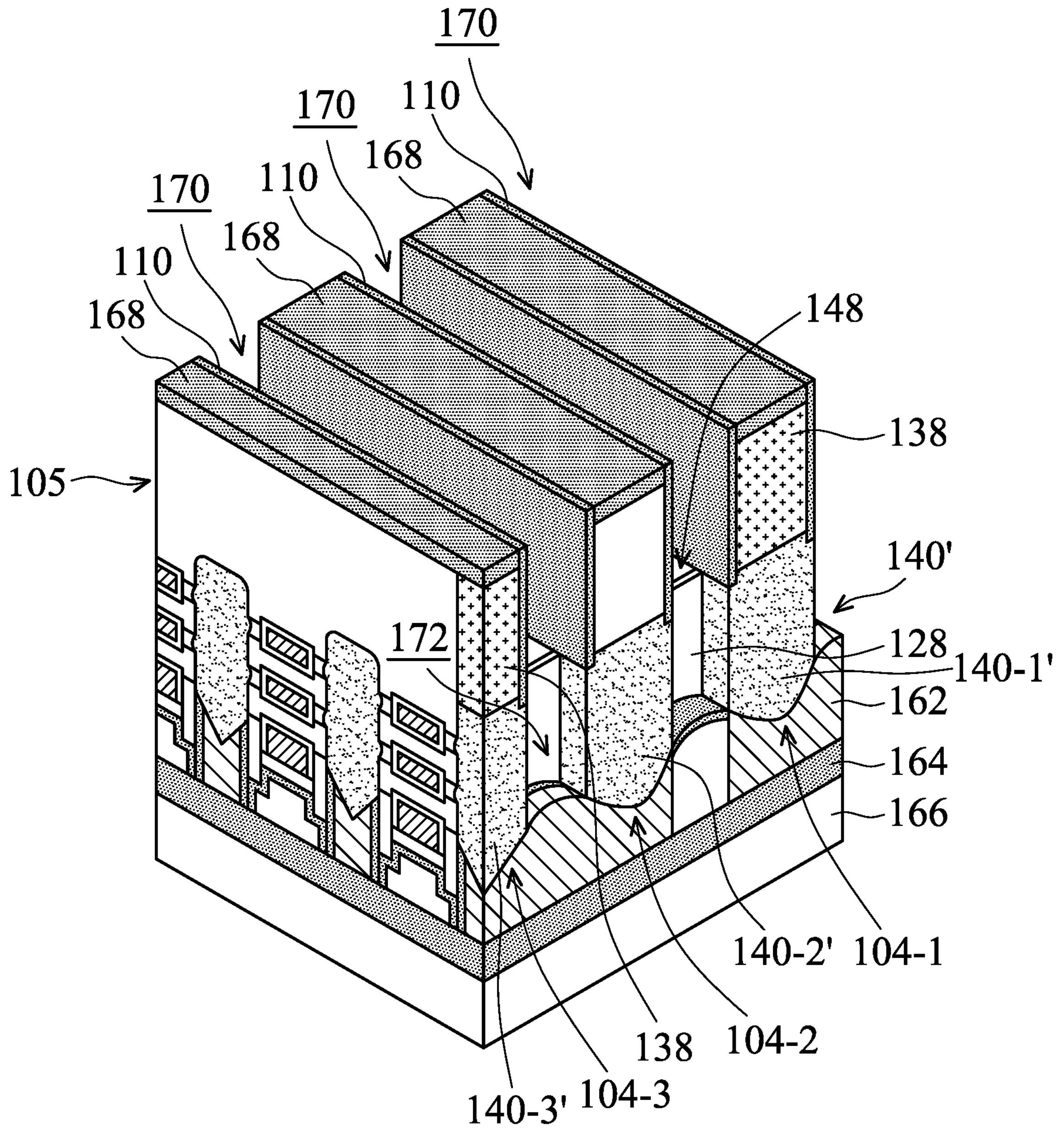
Figures 1, 1W:
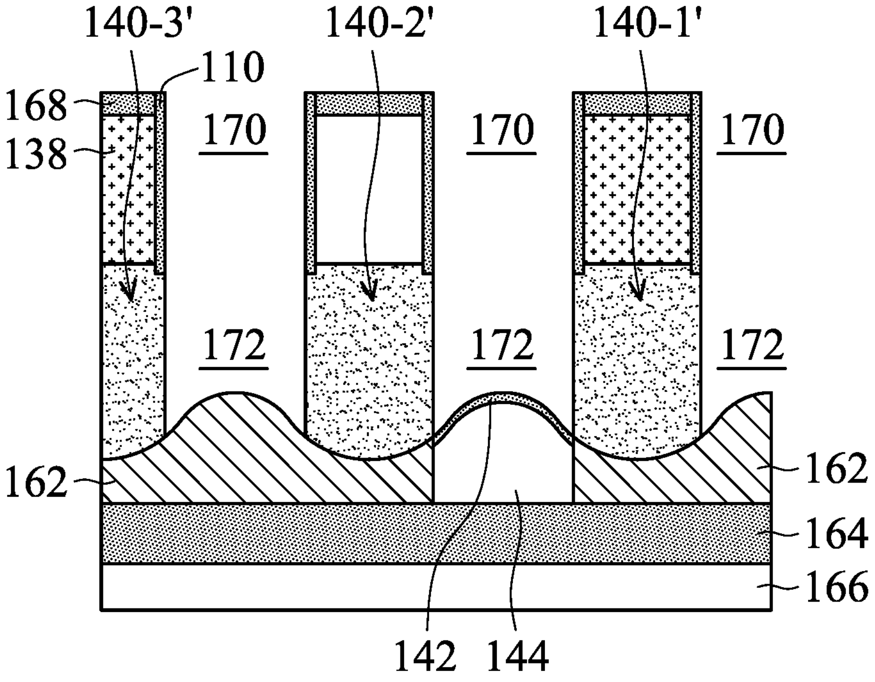
Figures 1, 1W, 2:
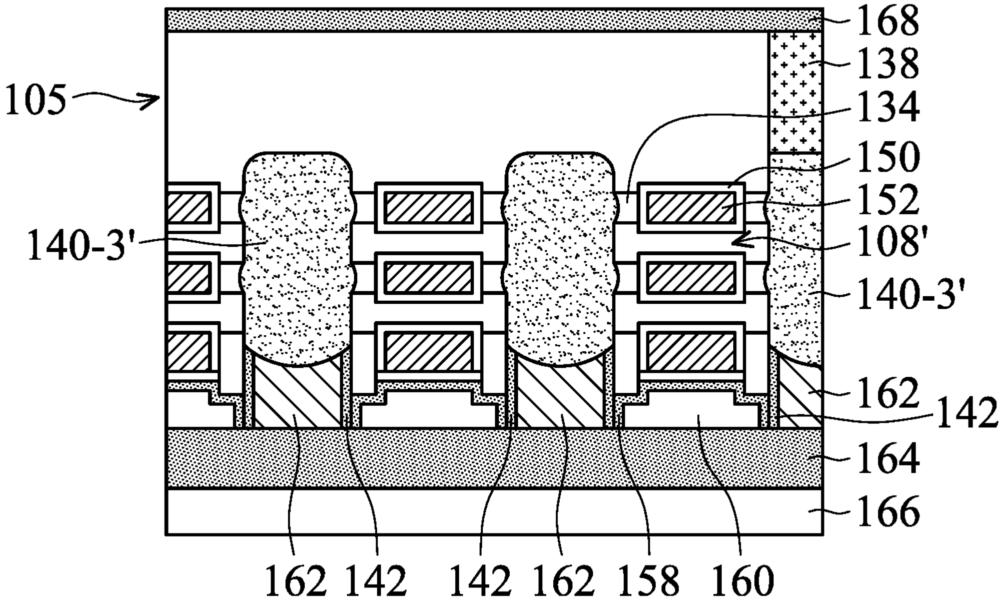
Figure 1X:
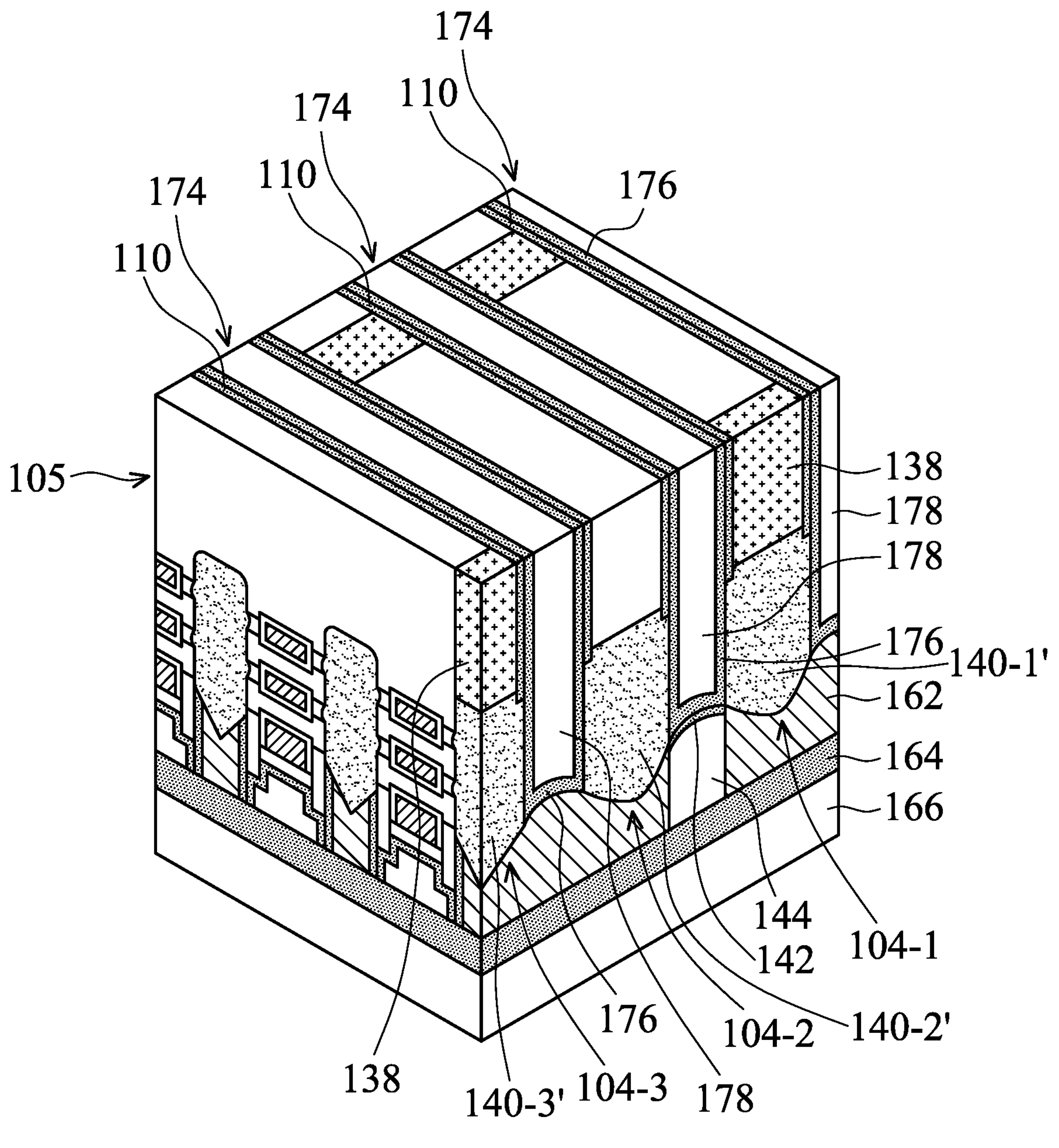
Figures 1, 1X:
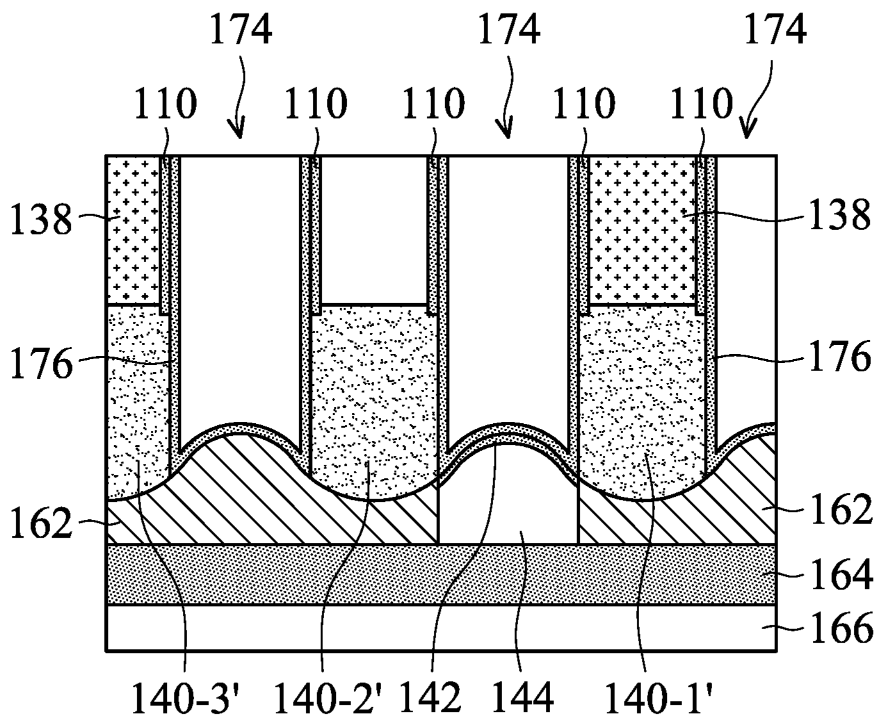
Figures 1, 1X, 2:
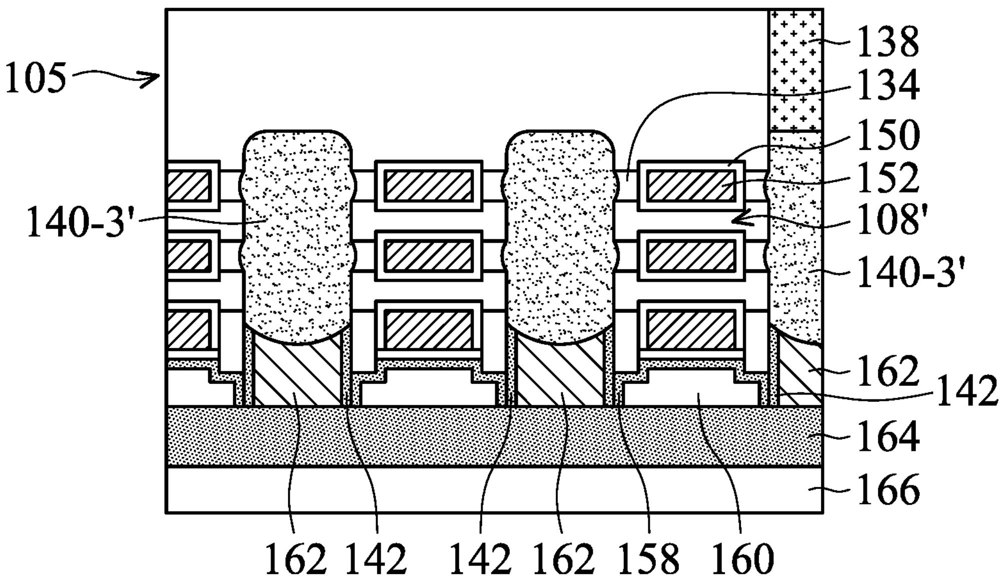
Figure 1Y:
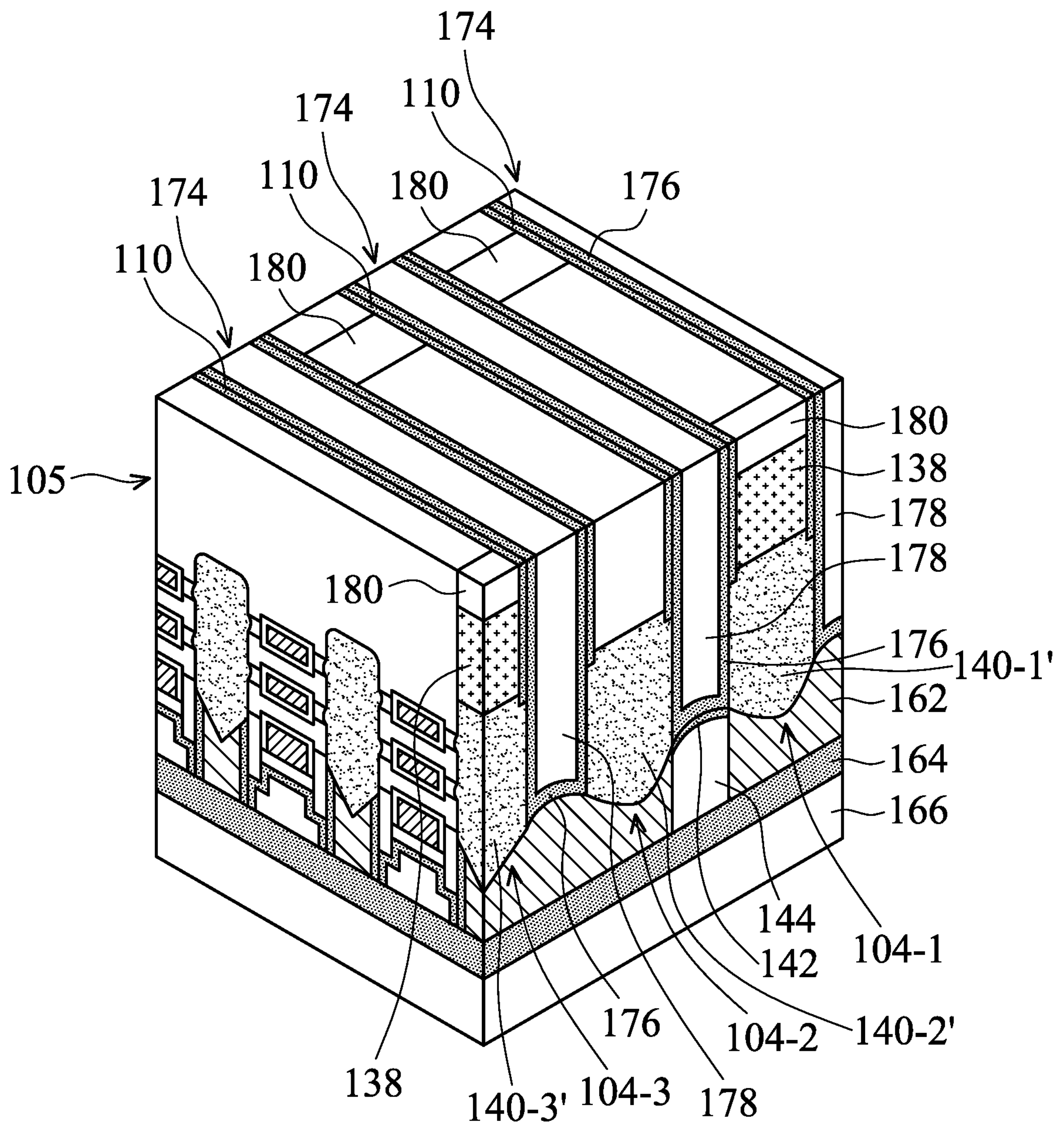
Figures 1, 1Y:
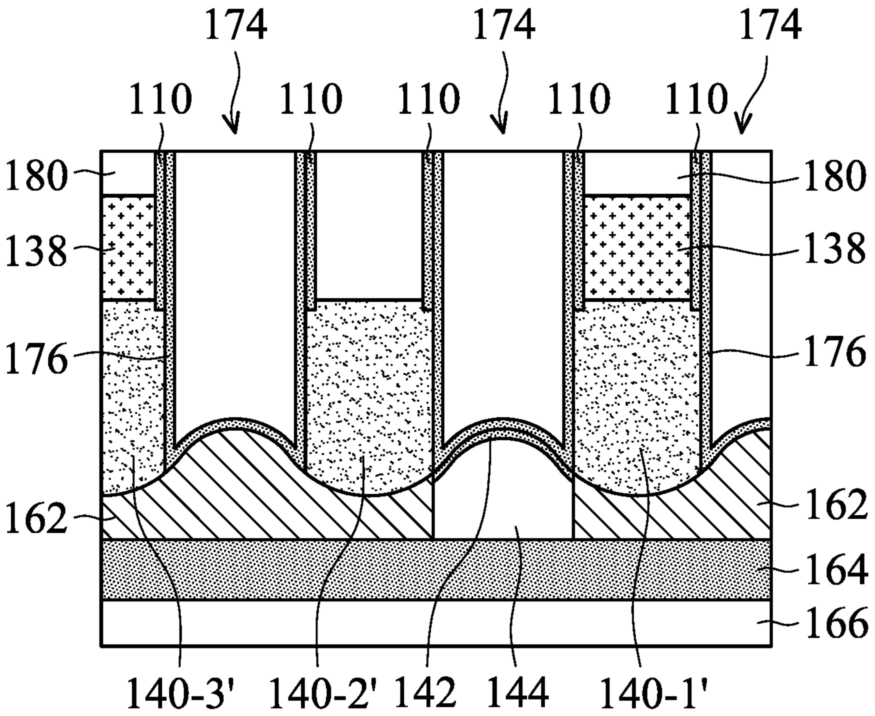
Figures 1, 1Y, 2:
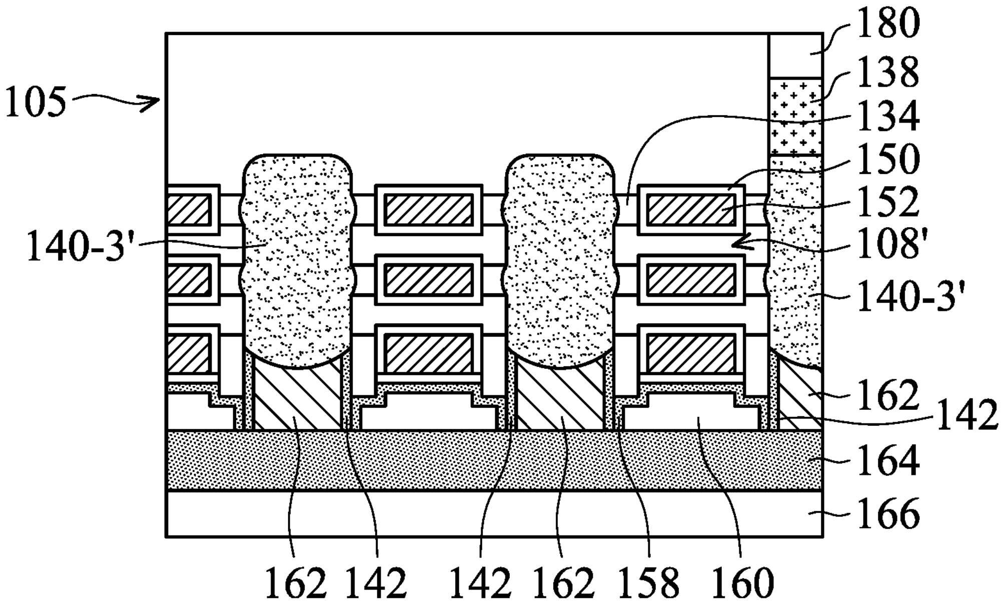
Figure 1Z:
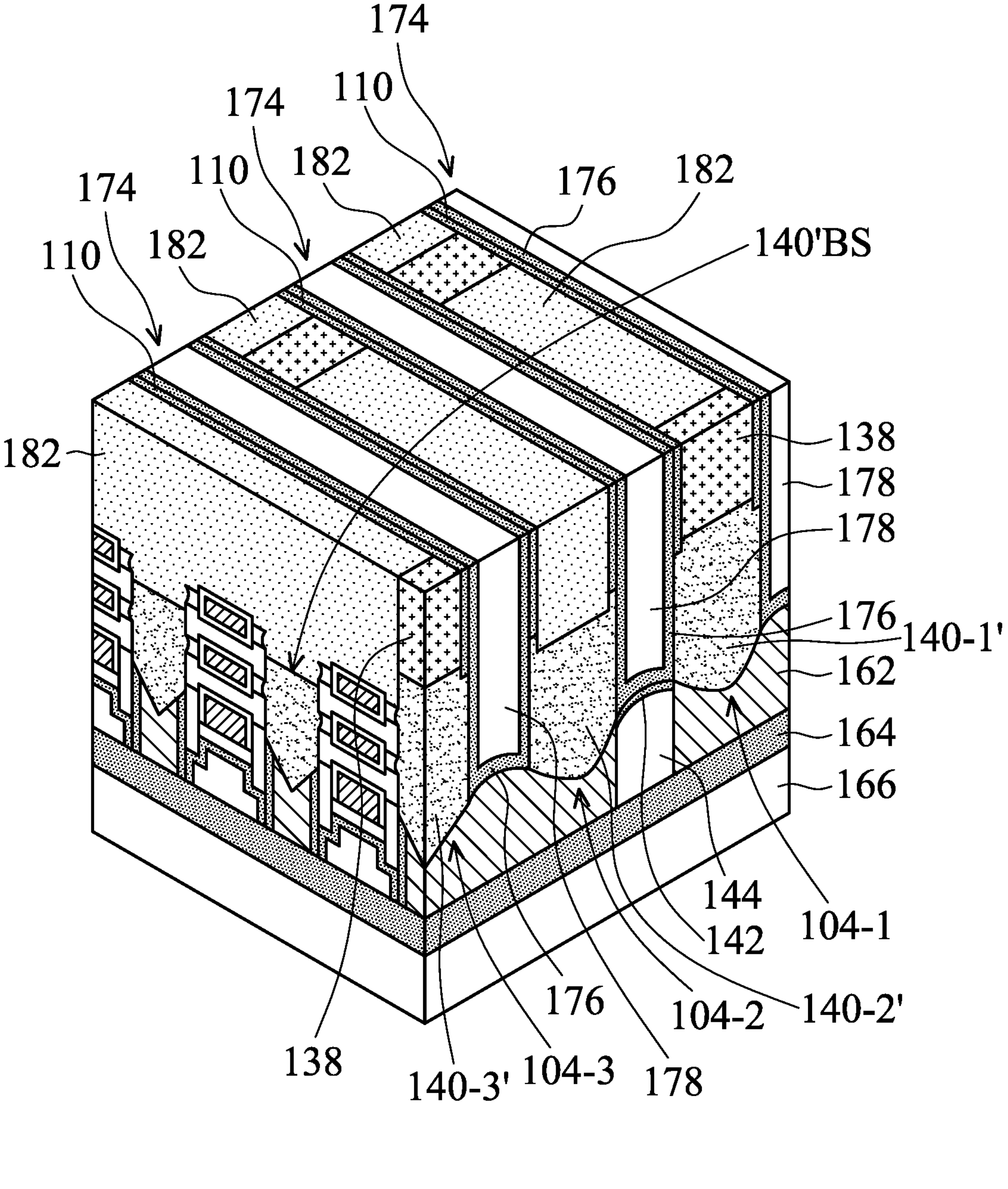
Figures 1, 1Z:
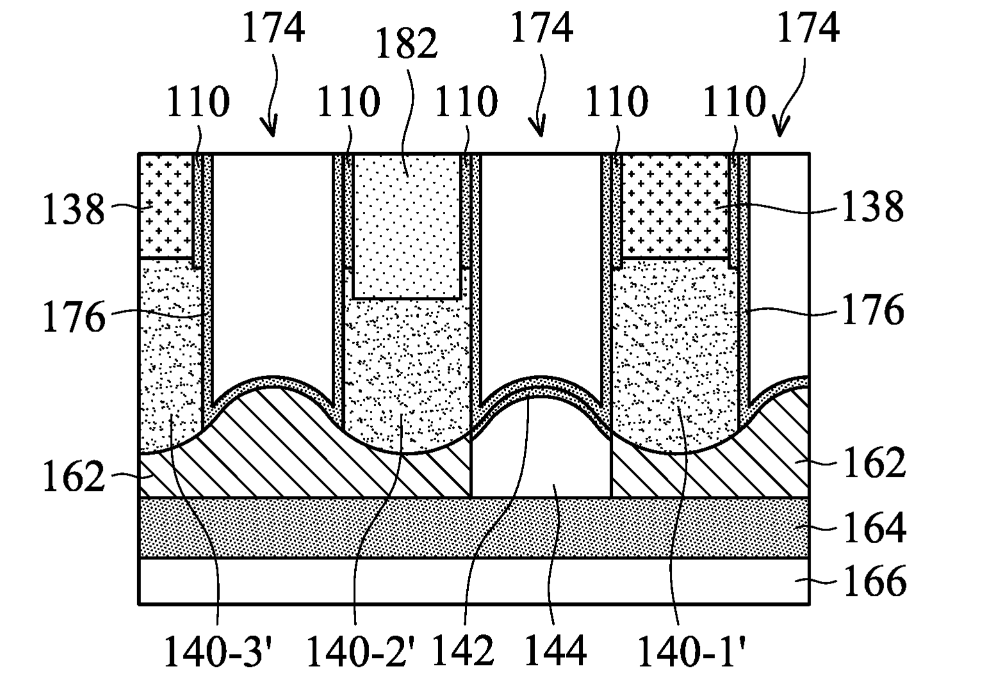
Figures 1, 1Z, 2:
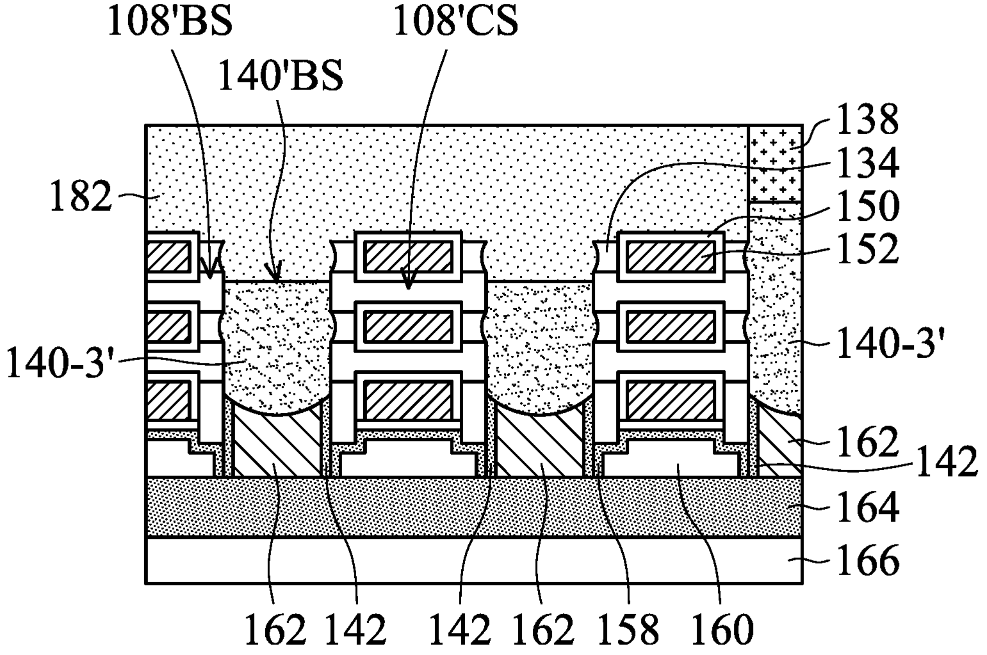
Figure 1Z:
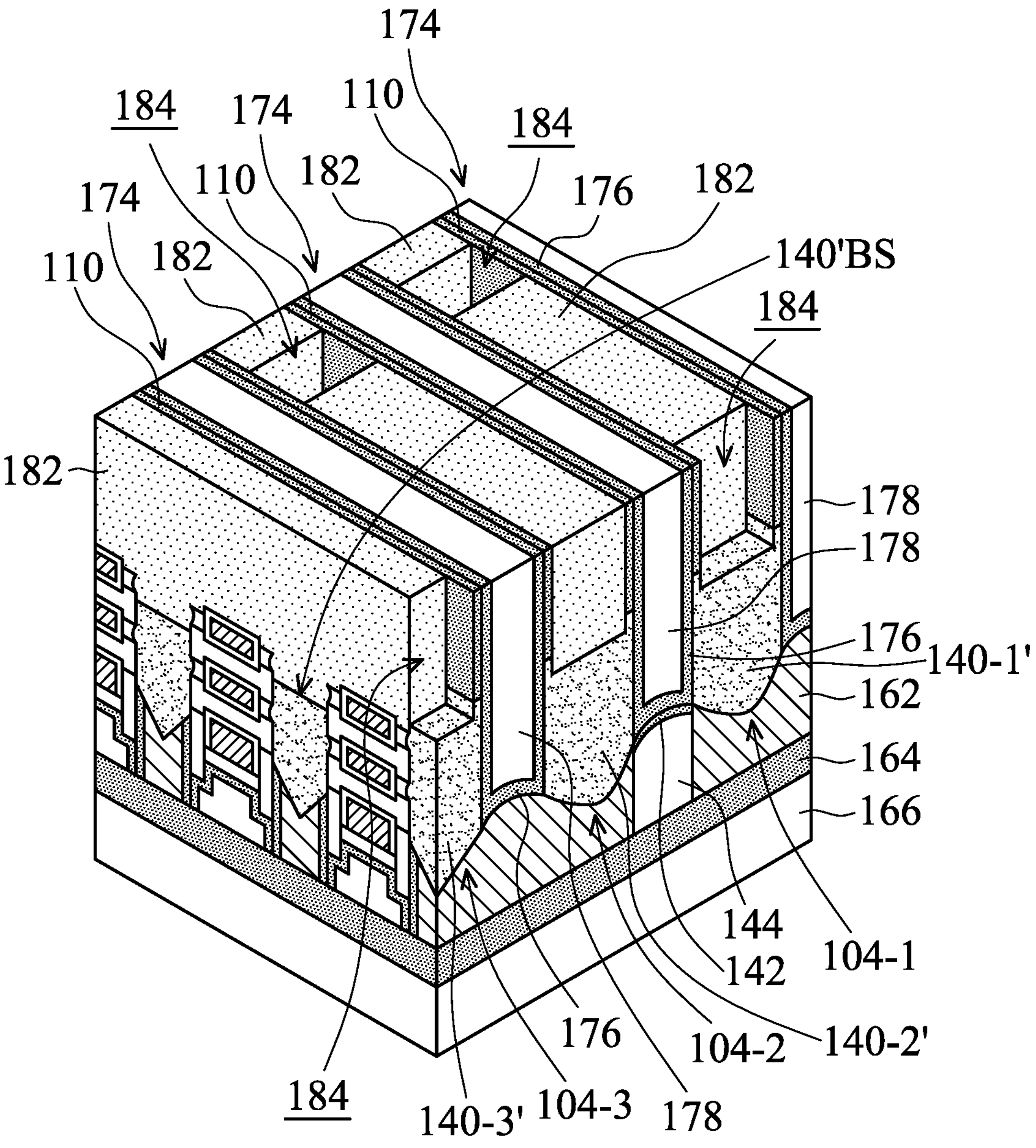
Figure 1Z:
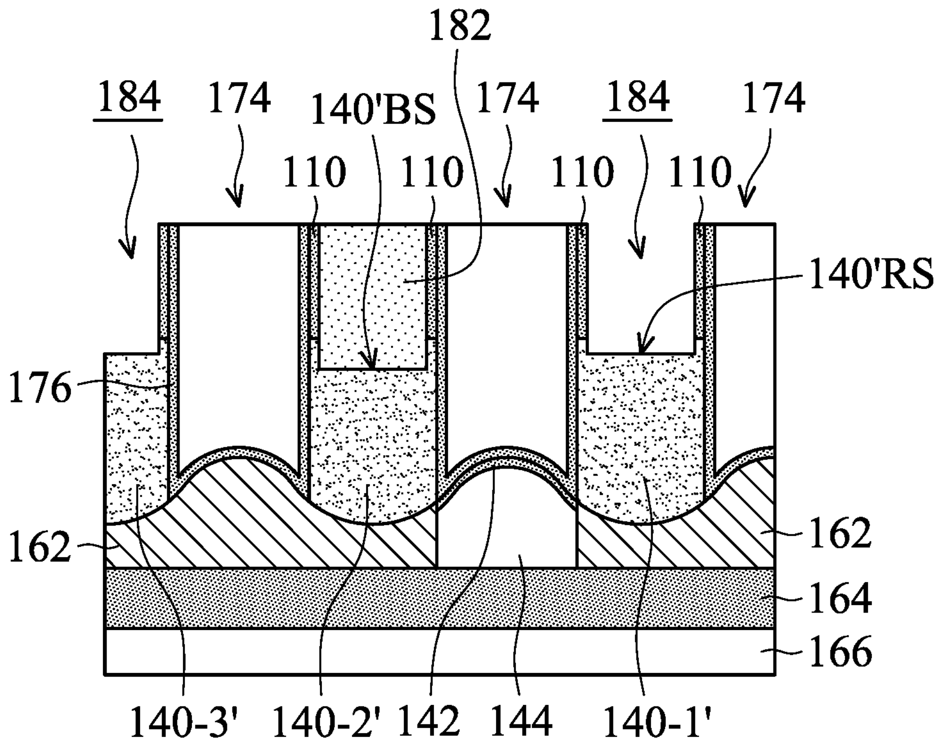
Figure 1Z:
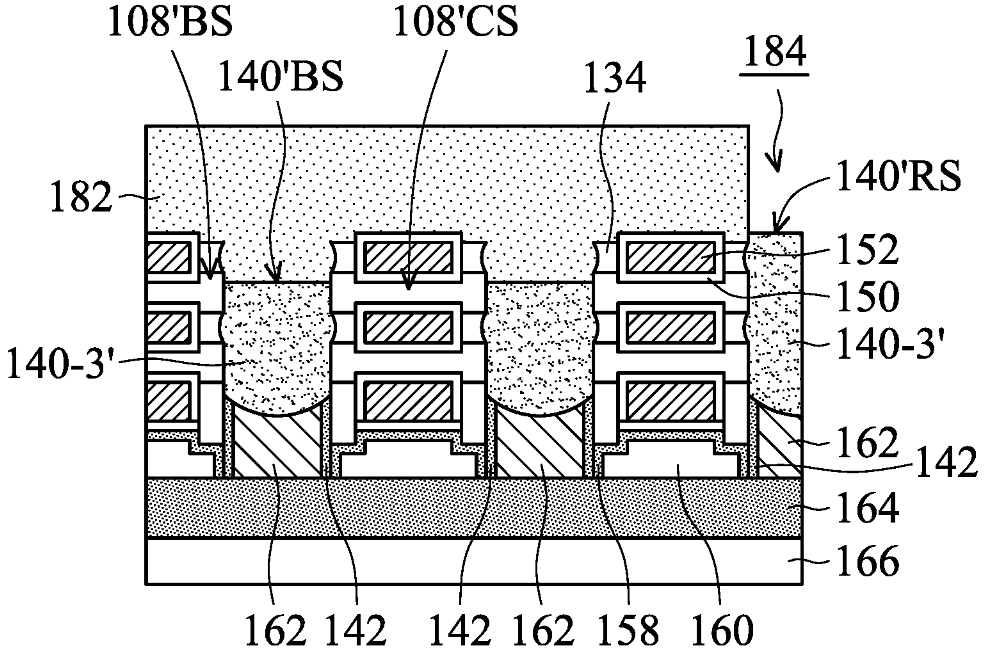
Figure 1Z:
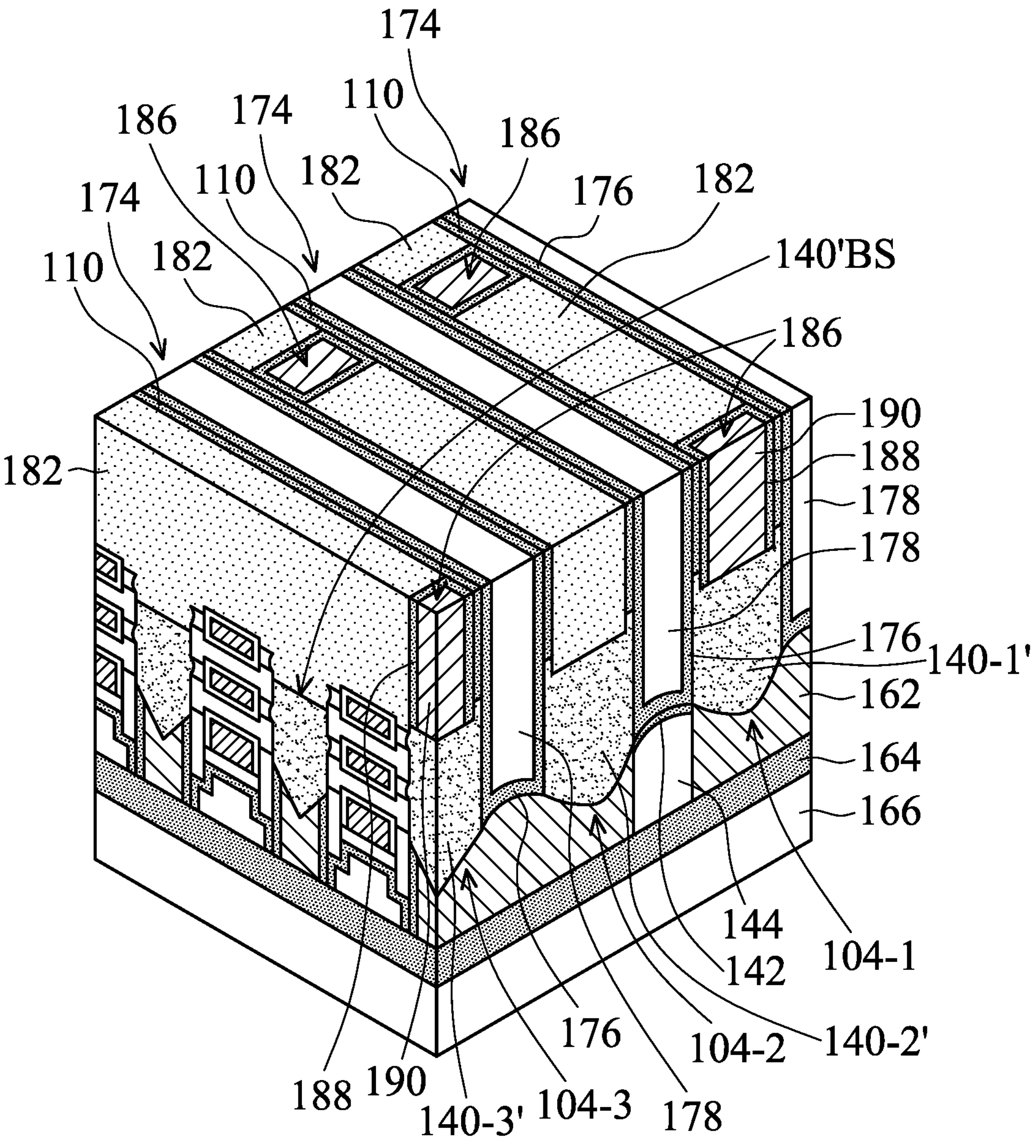
Figure 1Z:
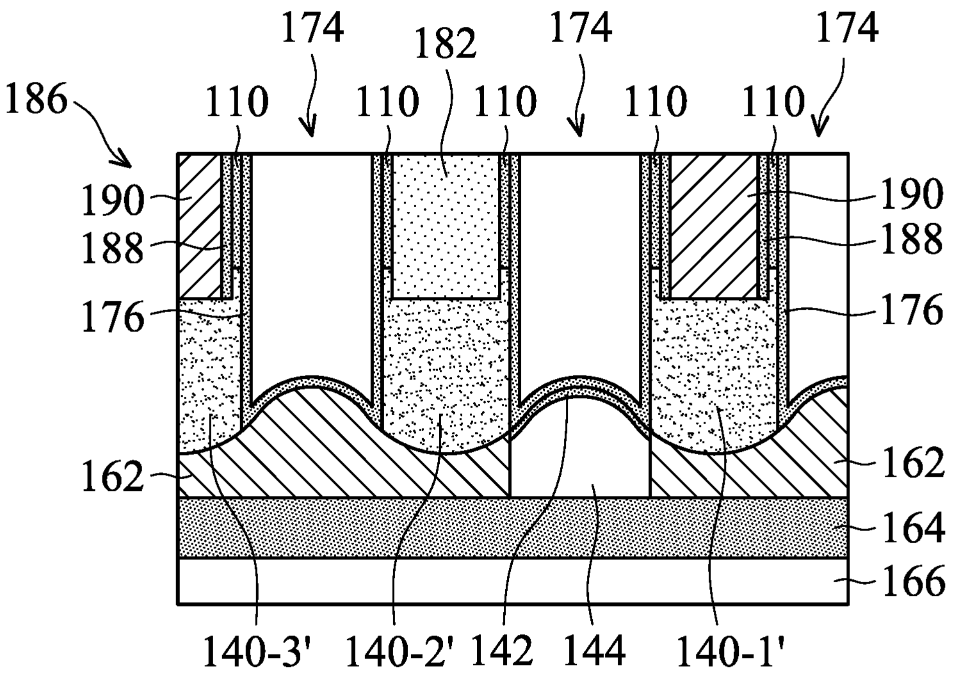
Figure 1Z:
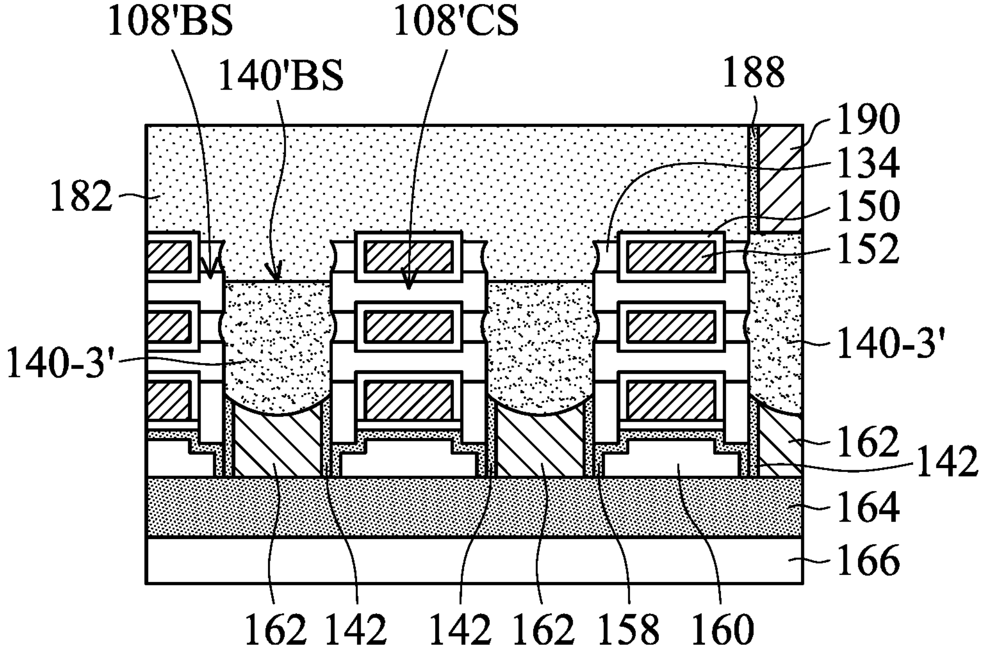
Figure 1Z:
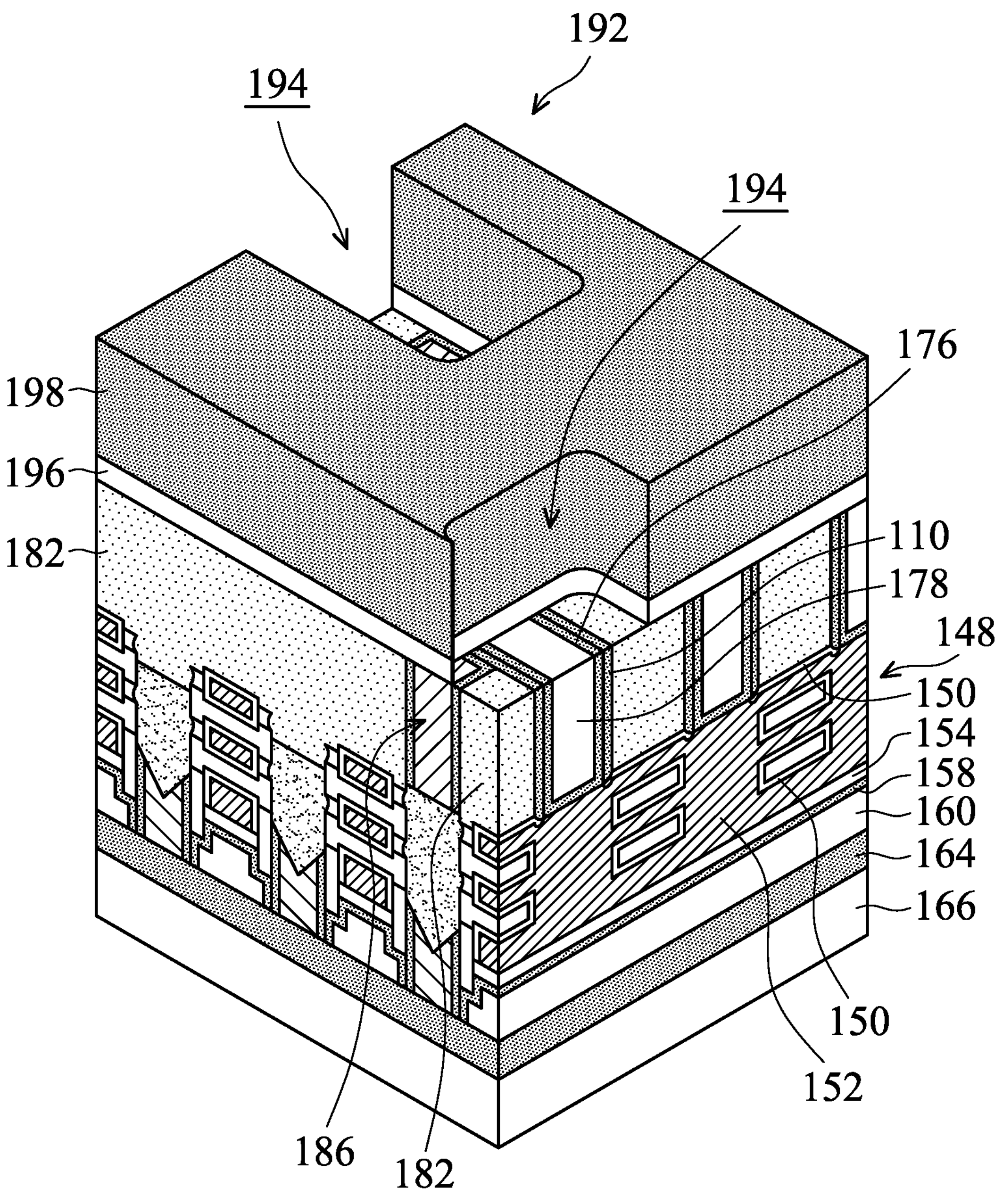
Figure 1Z:
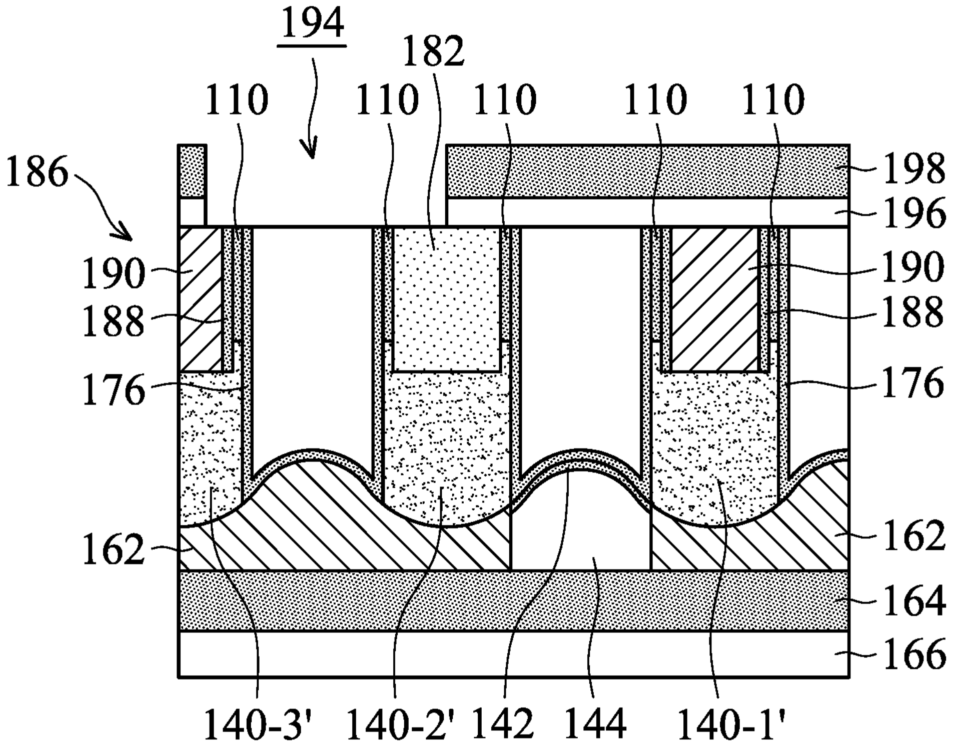
Figure 1Z:
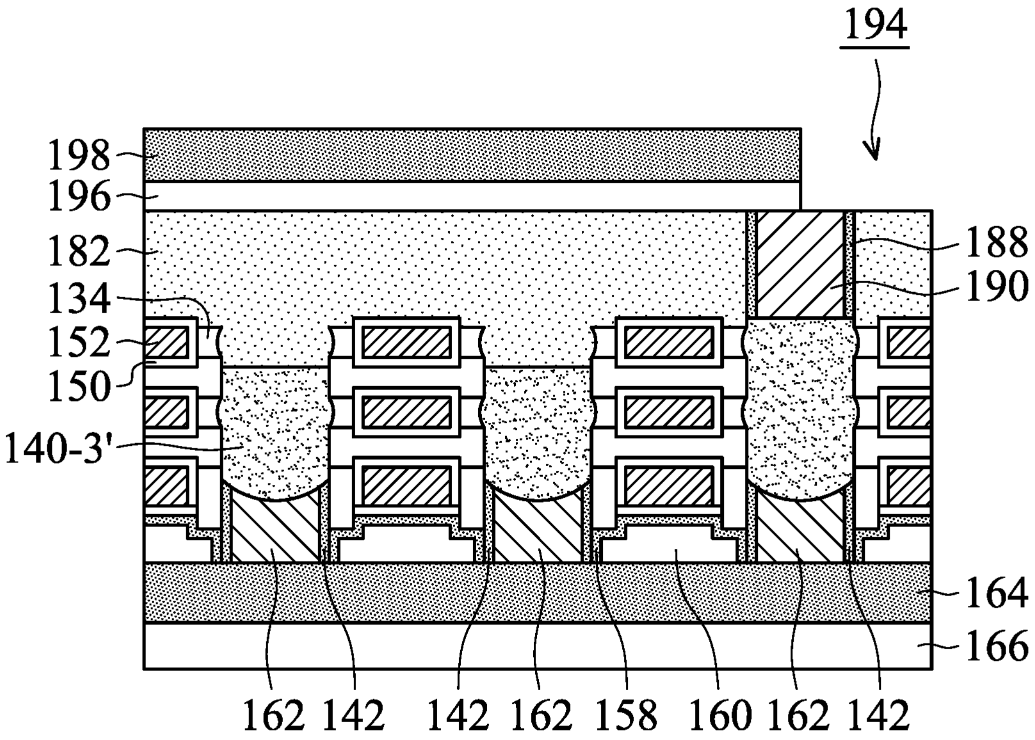
Figure 1Z:
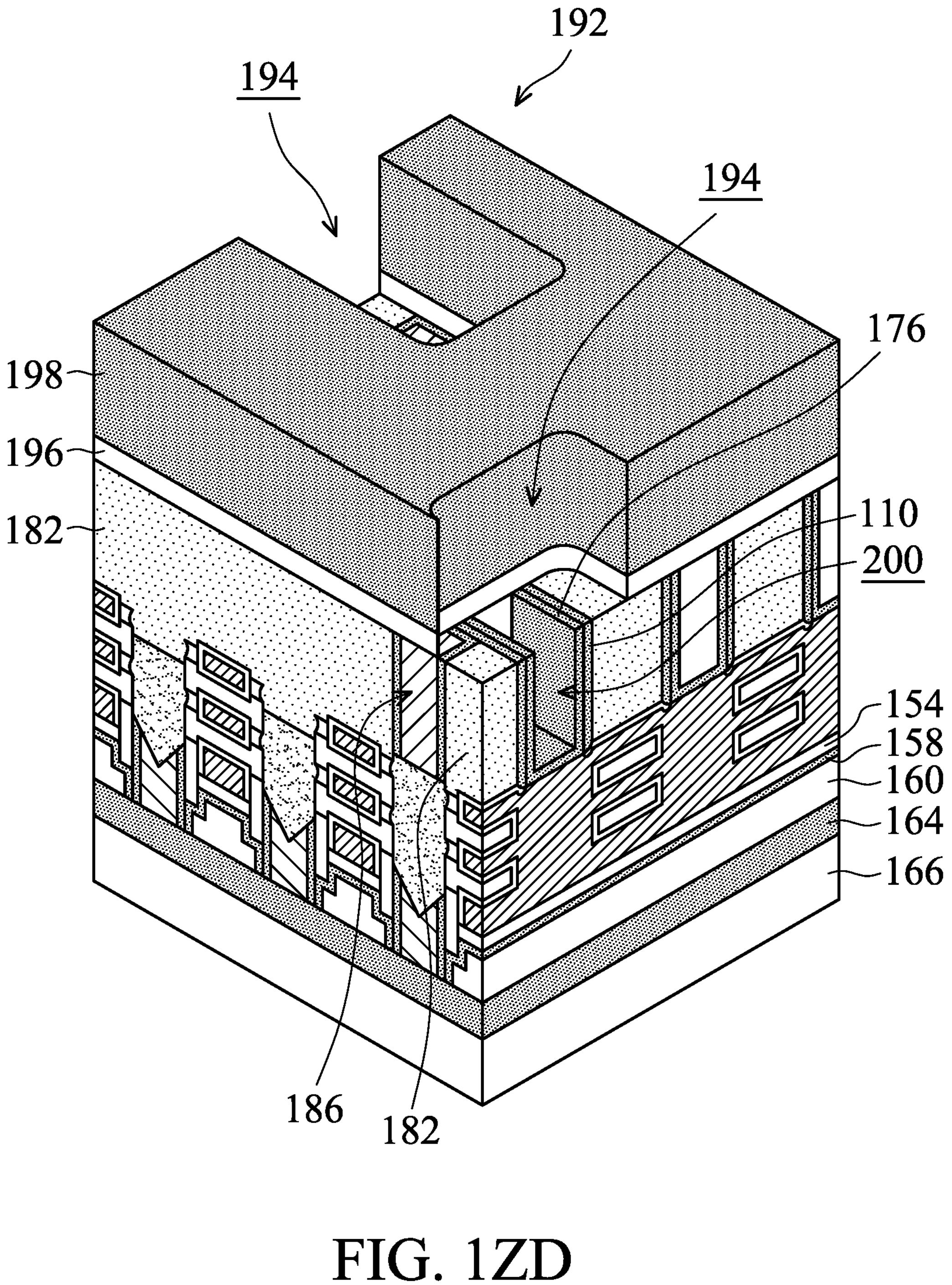
Figure 1Z:
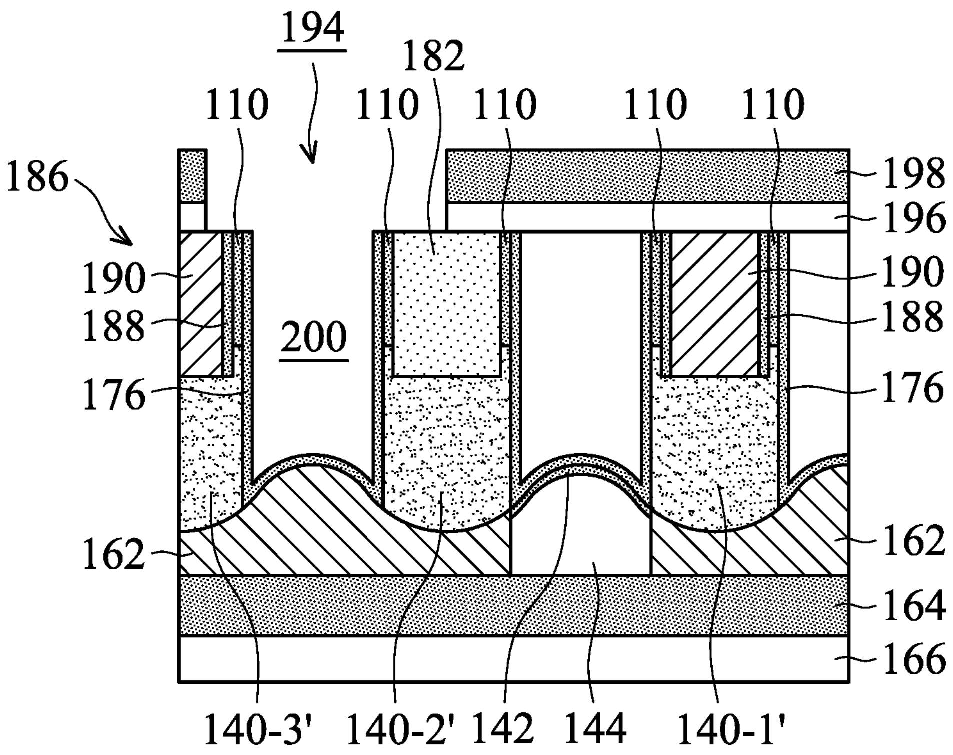
Figure 1Z:
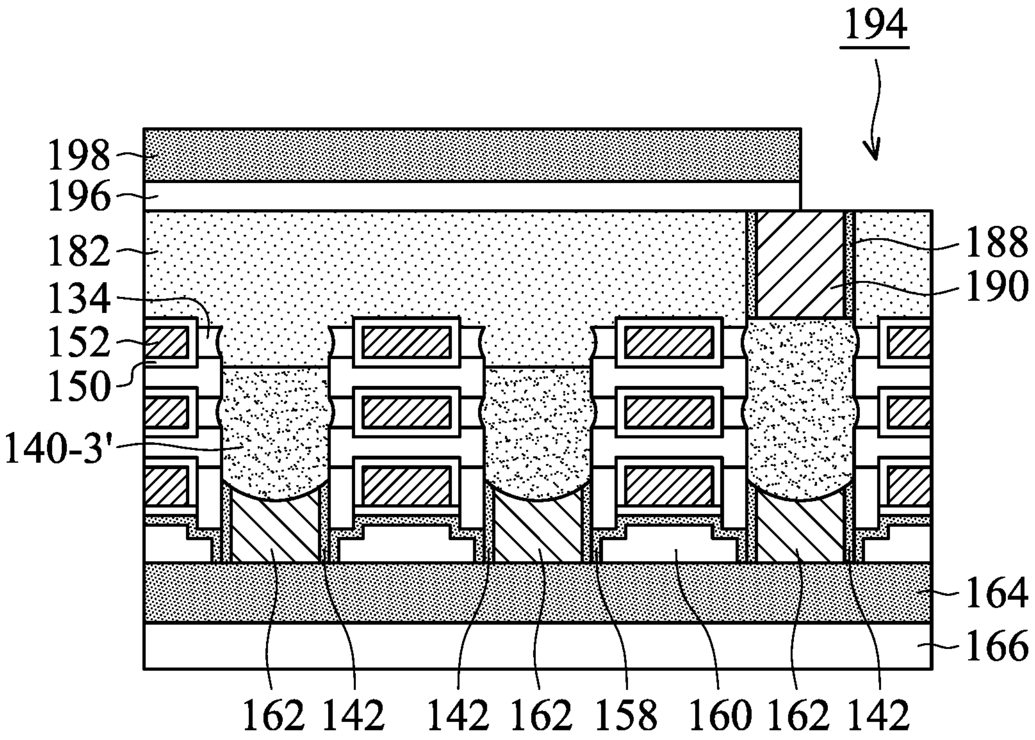
Figure 1Z:
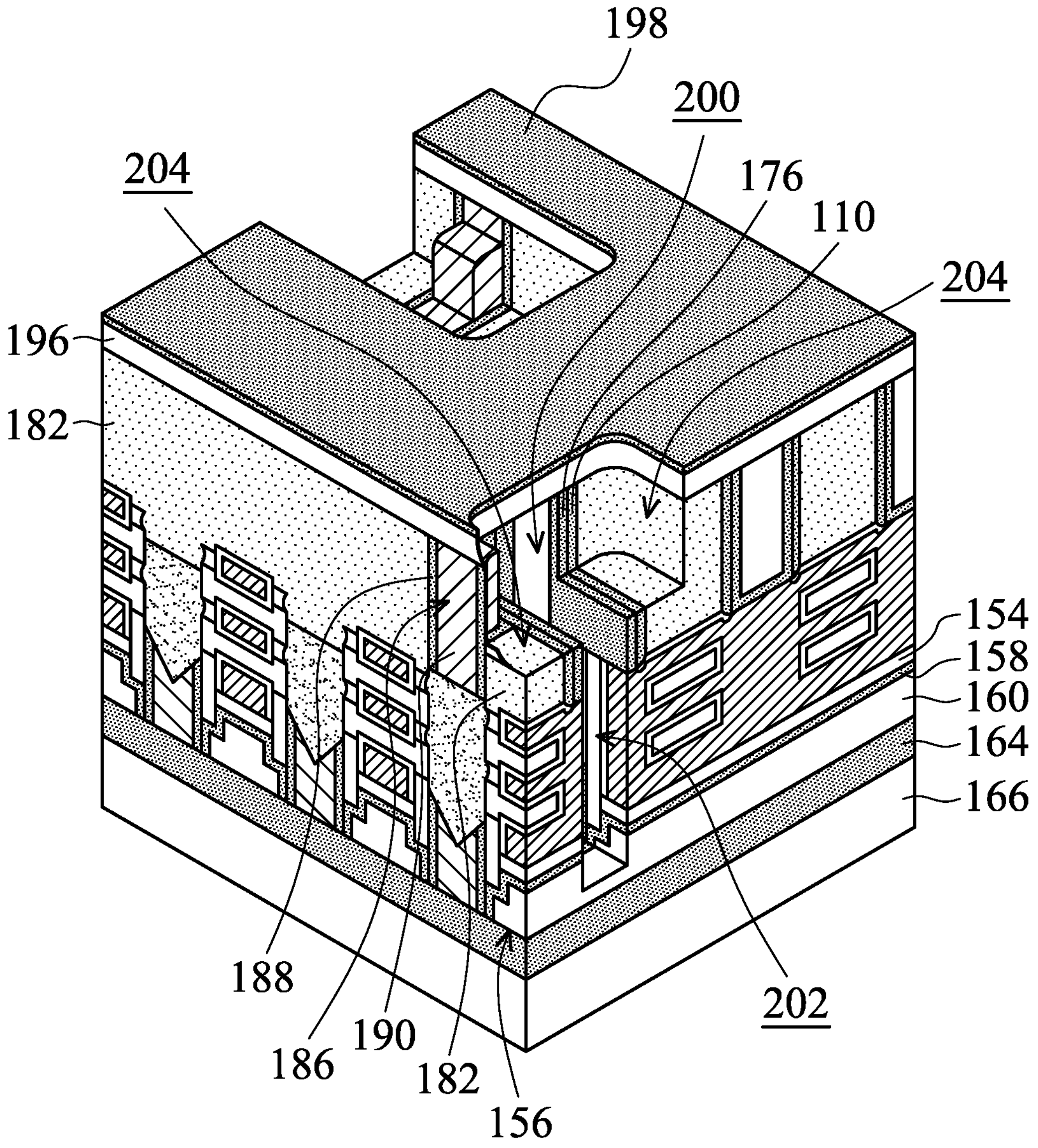
Figure 1Z:
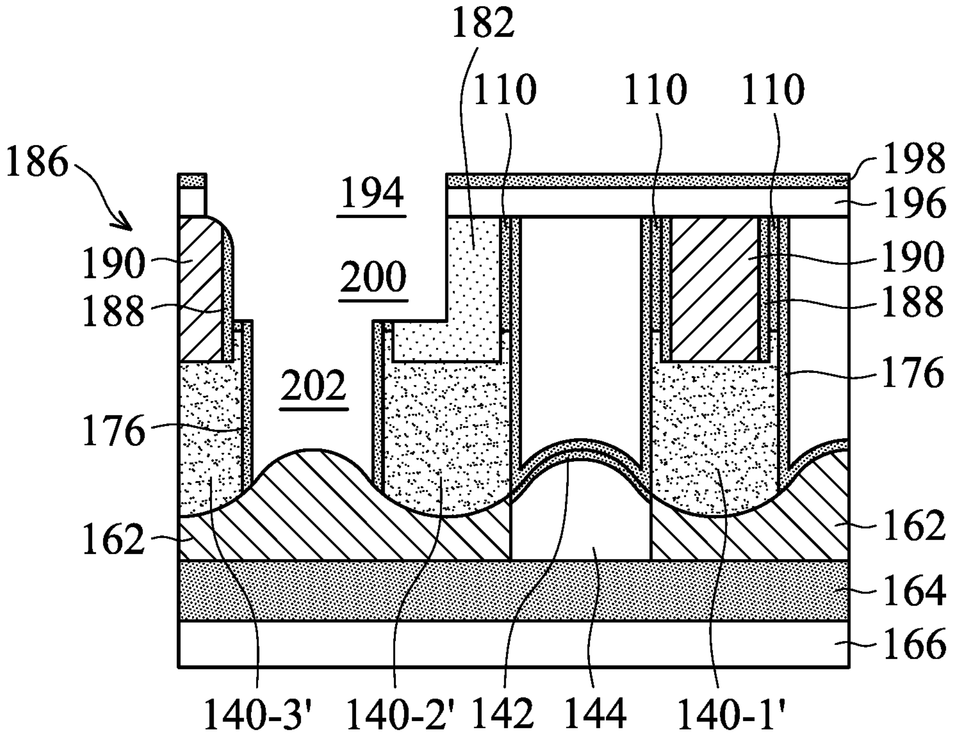
Figure 1Z:
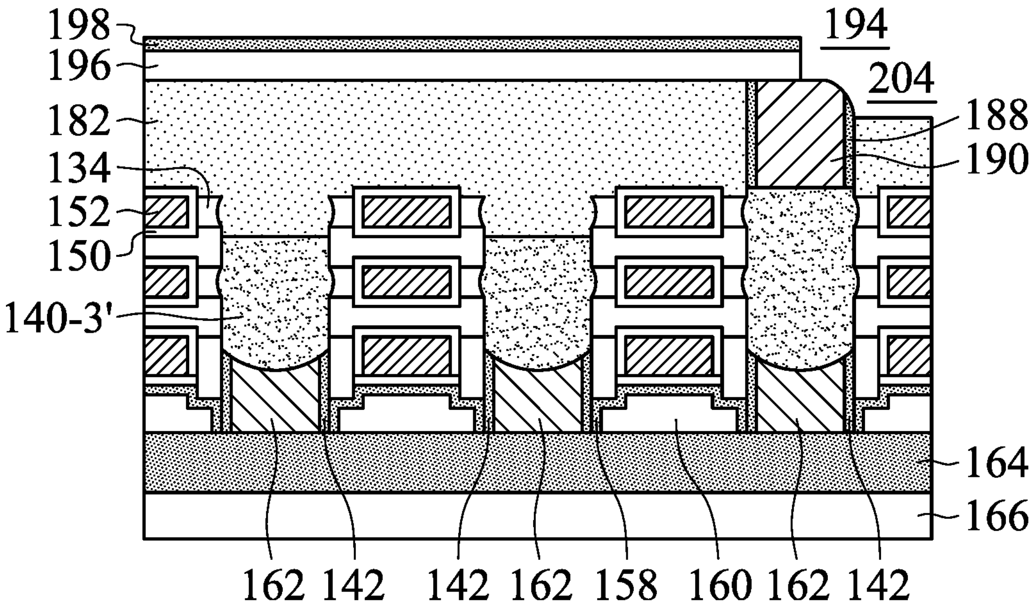
Figure 1Z:
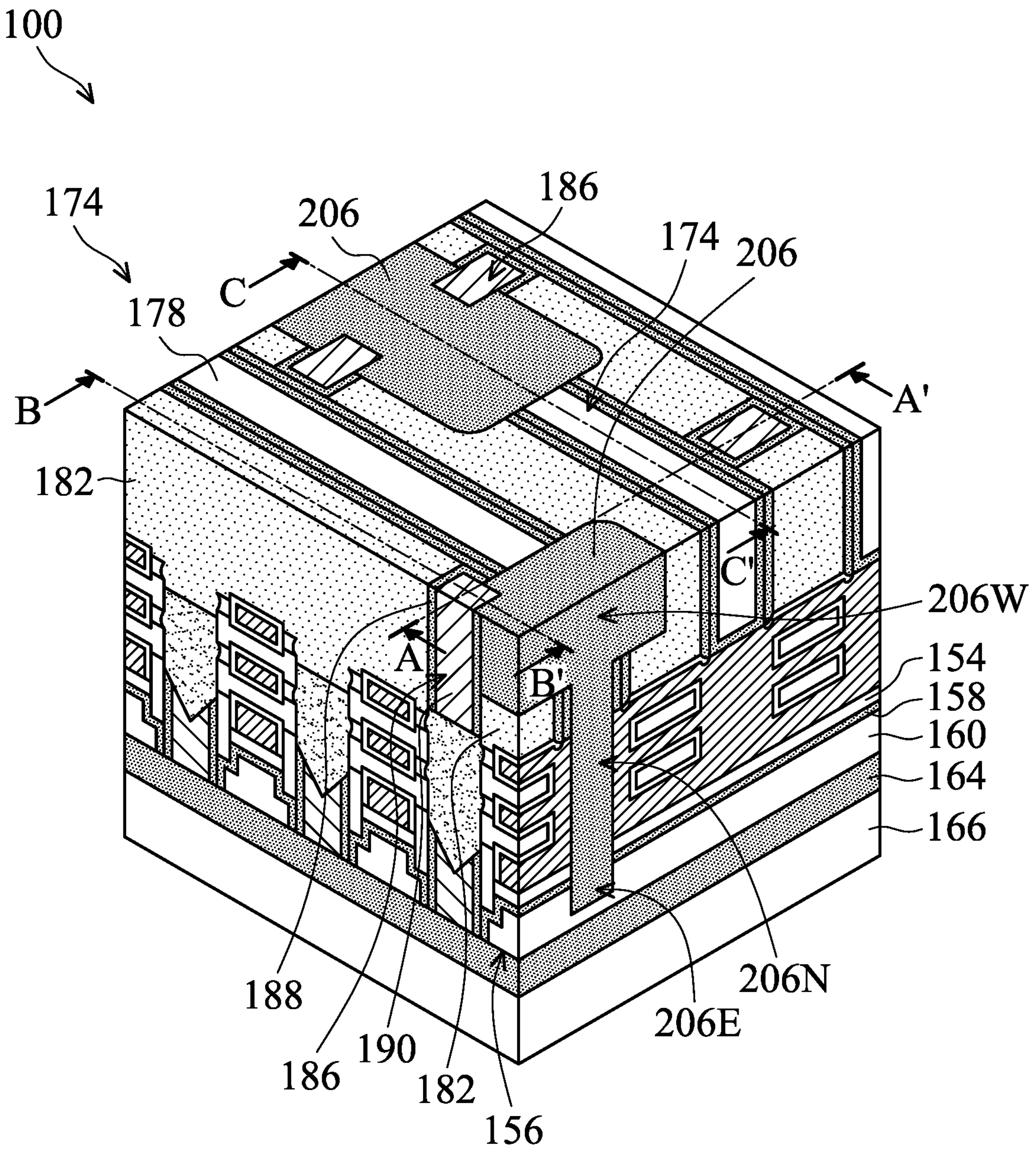
Figure 1Z:
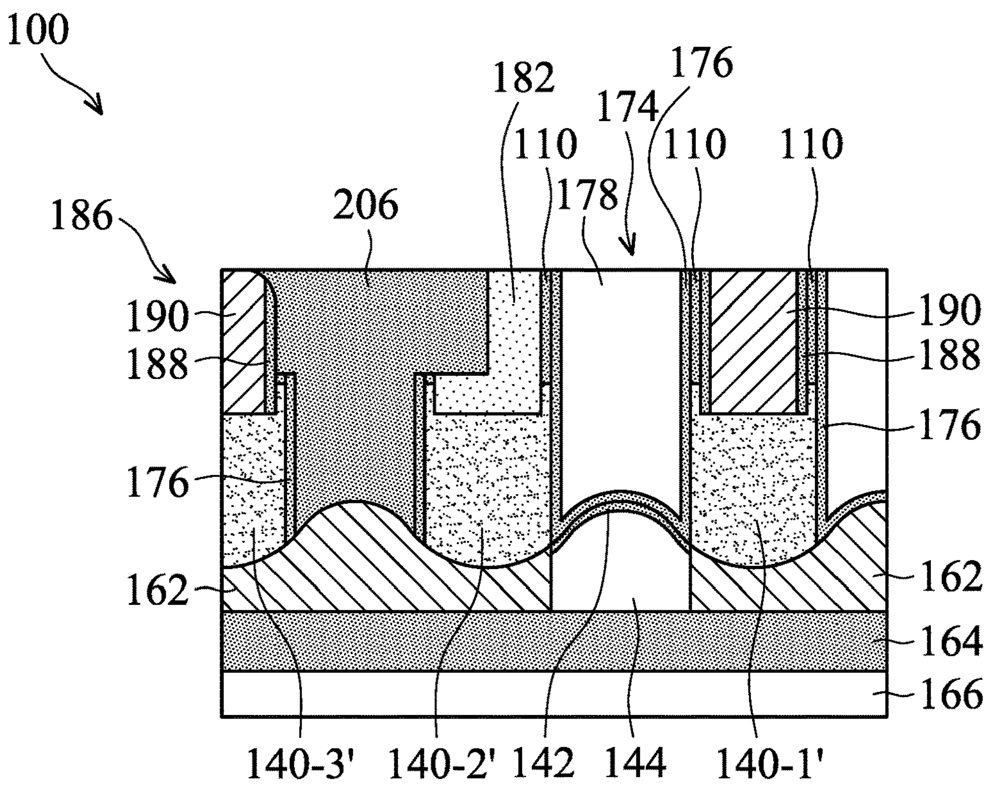
Figure 1Z:
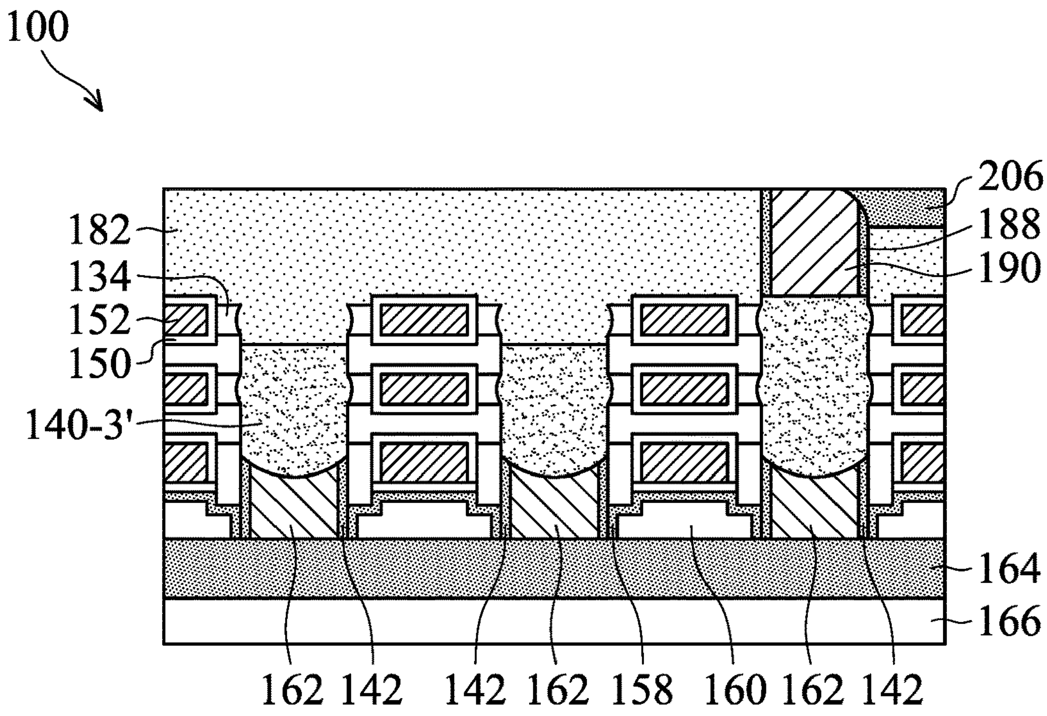
Figure 1Z:
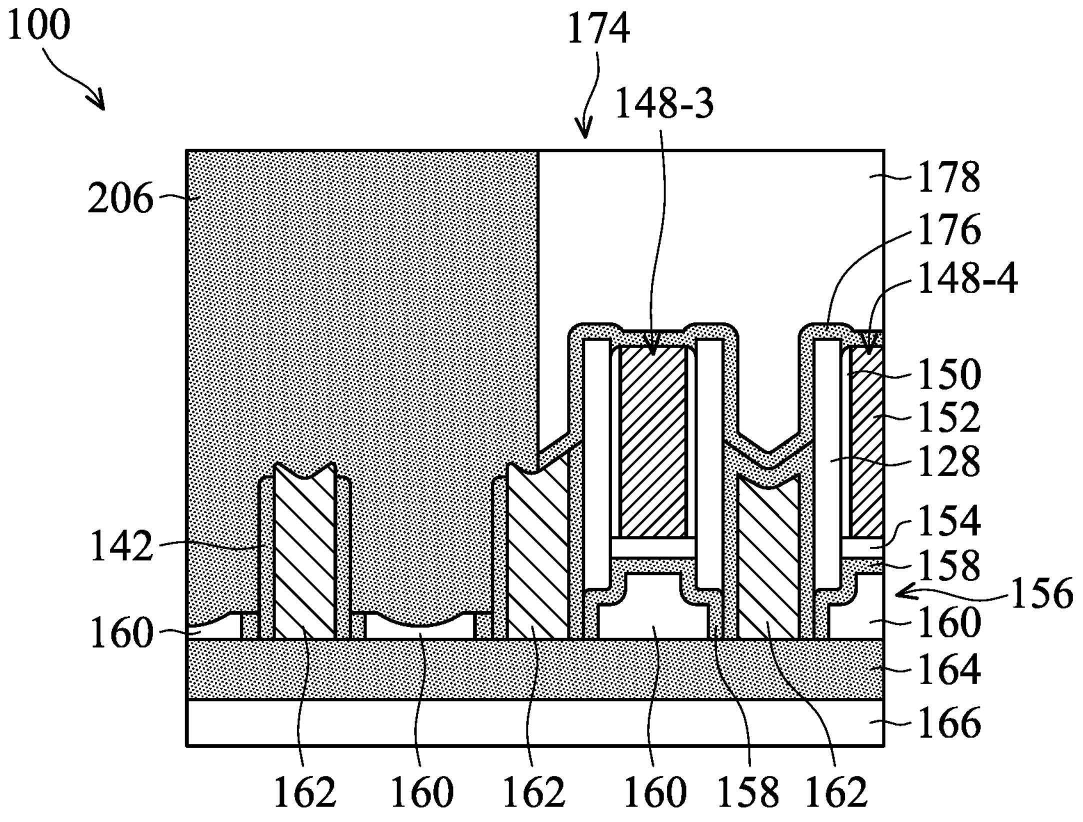
Figure 2:
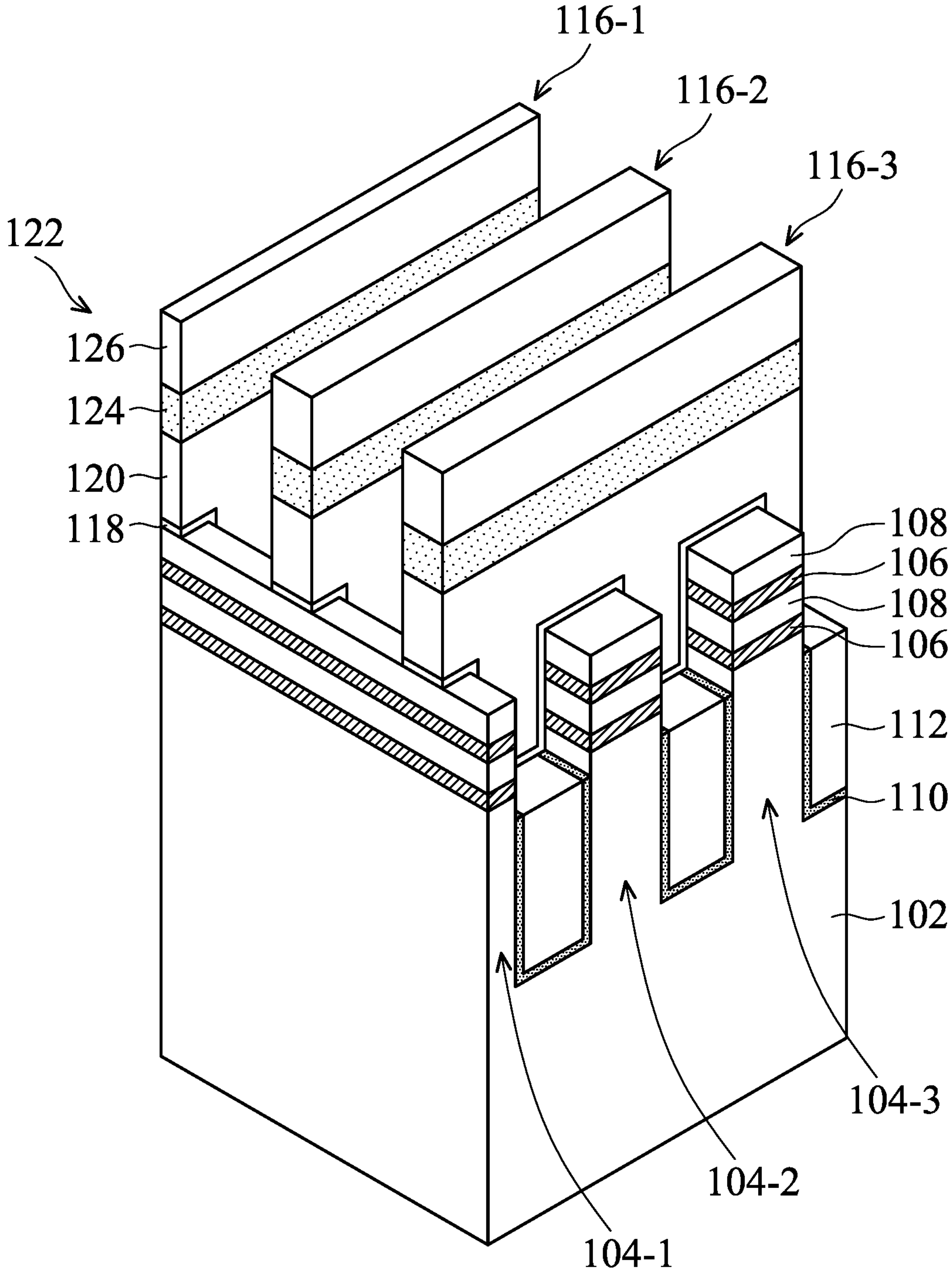

FIGS. 1A to 1ZF illustrate diagrammatic perspective views of intermediate stages of manufacturing a semiconductor structure 100 in accordance with some embodiments. Some diagrammatic top views and cross-sectional views of the intermediate stages of the semiconductor structure 100 are also illustrated corresponding to the manufacturing processes shown in FIGS. 1A to 1ZF and will be explained in more details afterwards. In addition, the figures may have been simplified for the sake of clarity to better understand the inventive concepts of the present disclosure. Additional features may be added in the semiconductor structure 100, and some of the features described below may be replaced, modified, or eliminated.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

First, a semiconductor stack, including first semiconductor material layers 106 and second semiconductor material layers 108, is formed over a substrate 102, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102 to form the semiconductor stack. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although two first semiconductor material layers 106 and two second semiconductor material layers 108 are shown in FIG. 1A, the semiconductor structure may include more or fewer first semiconductor material layers 106 and second semiconductor material layers 108. For example, the semiconductor structure may include two to five of the first semiconductor material layers 106 and two to five of the second semiconductor material layers 108.

The first semiconductor material layers 106 and the second semiconductor material layers 108 may be formed using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor material stack over the substrate 102, the semiconductor material stack is patterned to form fin structures 104-1, 104-2, and 104-3 extending in a first direction (i.e. X direction), as shown in FIG. 1B in accordance with some embodiments. FIG. 1B-T illustrates a diagrammatic top view of the inter-medium stage of the semiconductor structure 100, and the block $B_1$ shown in FIG. 1B-T corresponds to the structure shown in FIG. 1B in accordance with some embodiments.

In some embodiments, the fin structures 104-1, 104-2, and 104-3 are protruding from the front side of the substrate 102. In some embodiments, the fin structures 104-1, 104-2, and 104-3 include base fin structures 105 and the semiconductor material stacks, including the first semiconductor material layers 106 and the second semiconductor material layers 108, formed over the base fin structure 105.

In some embodiments, the patterning process includes forming mask structures over the semiconductor material stack and etching the semiconductor material stack and the underlying substrate 102 through the mask structure. In some embodiments, the mask structures are a multilayer structure including a pad oxide layer and a nitride layer formed over the pad oxide layer. The pad oxide layer may be made of silicon oxide, which may be formed by thermal oxidation or CVD, and the nitride layer may be made of silicon nitride, which may be formed by CVD, such as LPCVD or plasma-enhanced CVD (PECVD).

After the fin structures 104-1, 104-2, and 104-3 are formed, an isolation liner 110 is formed to cover the lower sidewalls of the fin structures 104-1, 104-2, and 104-3 and an isolation structure 112 is formed over the isolation liner 110, as shown in FIG. 1C in accordance with some embodiments. In some embodiments, the isolation liner 110 is made of a single or multiple dielectric materials. In some embodiments, the isolation liner 110 includes an oxide layer and a nitride layer formed over the oxide layer. In some embodiments, the isolation structure 112 is made of silicon oxide, silicon nitride, silicon oxynitride (SiON), other applicable insulating materials, or a combination thereof.

The isolation liner 110 and the isolation structure 112 may be formed by conformally forming a liner layer covering the fin structures 104-1, 104-2, and 104-3, forming an insulating material over the liner layer, and recessing the liner layer and the insulating material to form the isolation liner 110 and the isolation structure 112. The isolation structure 112 is configured to electrically isolate active regions (e.g. the fin structures 104-1, 104-2, and 104-3) of the semiconductor structure and is also referred to as shallow trench isolation (STI) feature in accordance with some embodiments. In some embodiments, the isolation structure 112 is directly formed over the substrate 102 around the fin structures 104-1, 104-2, and 104-3 without forming the isolation liner 110.

After the isolation structure 112 is formed, a cap layer 114 is formed over the top surface of the isolation structure 112, as shown in FIG. 1D in accordance with some embodiments. The cap layer 114 may be configured to protect the gate structure formed afterwards in subsequent manufacturing processes. In some embodiments, the cap layer 114 is made of a high k dielectric material. In some embodiments, the cap layer 114 is made of a dielectric material having a k value greater than 7. In some embodiments, the cap layer 114 is made of $HfO_2$, $ZrO_2$, $HfAlO_x$, $HfSiO_x$, $Al_2O_3$, or the like. In some embodiments, the cap layer 114 has a thickness in a range from about 5 nm to about 15 nm.

After the cap layer 114 is formed, dummy gate structures 116-1, 116-2, 116-3, and 116-4 are formed across the fin structure 104-1, 104-2, and 104-3 and extending over the cap layer 114 in a second direction (i.e. Y direction), as shown in FIGS. 1E and 1E-T in accordance with some embodiments. More specifically, FIG. 1E-T illustrates a diagrammatic top view of an intermediate stage of the semiconductor structure 100, and the structure shown in FIG. 1E corresponds to the region shown in block $B_1$ in FIG. 1E-T in accordance with some embodiments.

The dummy gate structures 116-1, 116-2, 116-3, and 116-4 may be used to define the source/drain regions and the channel regions of the resulting semiconductor structure 100. In some embodiments, the dummy gate structures 116-1, 116-2, 116-3, and 116-4 includes a dummy gate dielectric layer 118 and a dummy gate electrode layer 120. In some embodiments, the dummy gate dielectric layer 118 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 118 is formed using thermal oxidation, CVD, ALD, physical vapor deposition (PVD), another suitable method, or a combination thereof.

In some embodiments, the dummy gate electrode layer 120 is made of conductive material includes polycrystalline-silicon (poly-Si), poly-crystalline silicon-germanium (poly-SiGe), or a combination thereof. In some embodiments, the dummy gate electrode layer 120 is formed using CVD, PVD, or a combination thereof.

The formation of the dummy gate structures 116-1, 116-2, 116-3, and 116-4 may include conformally forming a dielectric material as the dummy gate dielectric layers 118. Afterwards, a conductive material may be formed over the dielectric material as the dummy gate electrode layers 120, and a hard mask layer 122 may be formed over the conductive material. Next, the dielectric material and the conductive material may be patterned through the hard mask layer 122 to form the dummy gate structures 116-1, 116-2, 116-3, and 116-4. In some embodiments, the hard mask layers 122 include multiple layers, such as an oxide layer 124 and a nitride layer 126. In some embodiments, the oxide layer 124 is silicon oxide, and the nitride layer 126 is silicon nitride.

After the dummy gate structures 116-1, 116-2, 116-3, and 116-4 are formed, gate spacers 128 are formed along and covering opposite sidewalls of the dummy gate structures 116-1, 116-2, 116-3, and 116-4, as shown in FIG. 1F in accordance with some embodiments. The gate spacers 128 may be configured to separate source/drain structures (formed afterwards) from the dummy gate structure 116-1, 116-2, 116-3, and 116-4. In some embodiments, the gate spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

After the gate spacers 128 are formed, source/drain recesses 130 are formed adjacent to the gate spacers 128, as shown in FIG. 1G in accordance with some embodiments. More specifically, the fin structures 104-1, 104-2, and 104-3 not covered by the dummy gate structures 116-1, 116-2, 116-3, and 116-4 and the gate spacers 128 are recessed in accordance with some embodiments.

In some embodiments, the fin structures 104-1, 104-2, and 104-3 are recessed by performing an etching process. The etching process may be an anisotropic etching process, such as dry plasma etching, and the dummy gate structure 116-1, 116-2, 116-3, and 116-4 and the gate spacers 128 may be used as etching masks during the etching process.

After the source/drain recesses 130 are formed, the first semiconductor material layers 106 exposed by the source/drain recesses 130 are laterally recessed to form notches 132, as shown in FIG. 1H in accordance with some embodiments.

In some embodiments, an etching process is performed to laterally recess the first semiconductor material layers 106 of the fin structure 104-1, 104-2, and 104-3 from the source/drain recesses 130. In some embodiments, during the etching process, the first semiconductor material layers 106 have a greater etching rate (e.g. etching amount) than the second semiconductor material layers 108, thereby forming notches 132 between the adjacent second semiconductor material layers 108. In some embodiments, the etching process is an isotropic etching such as dry chemical etching, remote plasma etching, wet chemical etching, another suitable technique, and/or a combination thereof.

Next, inner spacers 134 are formed in the notches 132 between the second semiconductor material layers 108, as shown in FIG. 1I in accordance with some embodiments. The inner spacers 134 may be configured to separate the source/drain structures and the gate structures formed in subsequent manufacturing processes. In some embodiments, the inner spacers 134 have curved sidewalls. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 134 are formed, the cap layer 114 not covered by the dummy gate structures 116-1, 116-2, 116-3, and 116-4 and the gate spacers 128 are removed, as shown in FIG. 1J in accordance with some embodiments. In some embodiments, the etching process is an isotropic etching such as dry chemical etching, remote plasma etching, wet chemical etching, another suitable technique, and/or a combination thereof.

After the exposed portions of the cap layer 114 are removed, sacrificial structures may be formed and embedded in the fin structures 104-1, 104-2, and 104-3, so they can be replaced in the formation of backside conductive vias in subsequent manufacturing processes. More specifically, deep trenches 136 are formed in some portions of the fin structures 104-1, 104-2, and 104-3, as shown in FIGS. 1K and 1K-T in accordance with some embodiments. FIG. 1K-T illustrates a diagrammatic top view of an intermediate stage of the semiconductor structure 100, and the structure shown in FIG. 1K corresponds to the region shown in block $B_1$ in FIG. 1K-T in accordance with some embodiments.

The deep trenches 136 may be formed by forming a mask layer with patterned openings and etching the fin structures 104-1, 104-2, and 104-3 through the openings. In some embodiments, the fin structures 104-1, 104-2, and 104-3 are etching by performing an isotropic etching such as dry chemical etching, remote plasma etching, wet chemical etching, another suitable technique, and/or a combination thereof. In some embodiments, the bottommost surface of the deep trench 136 is lower than the bottommost surface of the isolation structure 112.

Afterwards, deep sacrificial structures 138 are formed in the deep trenches 136, as shown in FIG. 1L in accordance with some embodiments. The deep sacrificial structures 138 are configured to be removed and replaced by backside conductive vias afterwards. In some embodiments, the deep sacrificial structures 138 are made of epitaxial materials. In some embodiments, the deep sacrificial structures 138 are made of undoped SiGe. In some embodiments, the bottommost surface of the deep sacrificial structure 138 is lower than the bottommost surface of the isolation structure 112.

Next, source/drain structures 140 are formed in the source/drain recesses 130, as shown in FIGS. 1M and 1M-T in accordance with some embodiments. FIG. 1M-T illustrates a diagrammatic top view of an intermediate stage of the semiconductor structure 100, and the structure shown in FIG. 1M corresponds to the region shown in block $B_1$ in FIG. 1M-T in accordance with some embodiments.

In some embodiments, each of the source/drain structures 140 is formed over the fin structures 104-1, 104-2, and 104-3 and extends continuously over the fin structures 104-1, 104-2, and 104-3. That is, the source/drain structures 140 formed over the fin structures 104-1, 104-2, and 104-3 are merged with each other to form the continuous source/drain structures 140 in accordance with some embodiments. In some embodiments, the source/drain structures 140 are in direct contact with the deep sacrificial structures 138.

In some embodiments, the source/drain structures 140 are formed using an epitaxial growth process, such as MBE, MOCVD, VPE, other applicable epitaxial growth process, or a combination thereof. In some embodiments, the source/drain structures 140 are made of any applicable material, such as Ge, Si, GaAs, AlGaAs, SiGe, GaAsP, SiP, SiC, SiCP, or a combination thereof. In some embodiments, the source/drain structures 140 are in-situ doped during the epitaxial growth process. For example, the source/drain structures 140 may be the epitaxially grown SiGe doped with boron (B). For example, the source/drain structures 140 may be the epitaxially grown Si doped with carbon to form silicon: carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 140 are doped in one or more implantation processes after the epitaxial growth process.

After the source/drain structures 140 are formed, a contact etch stop layer (CESL) 142 is conformally formed to cover the source/drain structures 140 and dummy gate structures 116-1, 116-2, 116-3, and 116-4, and an interlayer dielectric (ILD) layer 144 is formed over the contact etch stop layers 142, as shown in FIG. 1N in accordance with some embodiments.

In some embodiments, the contact etch stop layer 142 is made of a dielectric materials, such as silicon nitride, silicon oxide, silicon oxynitride, another suitable dielectric material, or a combination thereof. The dielectric material for the contact etch stop layers 142 may be conformally deposited over the semiconductor structure by performing CVD, ALD, other application methods, or a combination thereof.

The interlayer dielectric layer 144 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 144 may be formed by chemical vapor deposition (CVD), physical vapor deposition, (PVD), atomic layer deposition (ALD), or other applicable processes.

After the contact etch stop layer 142 and the interlayer dielectric layer 144 are deposited, a planarization process such as CMP or an etch-back process is performed until the gate electrode layers 120 of the dummy gate structures 116-1, 116-2, 116-3, and 116-4 are exposed, as shown in FIG. 1O in accordance with some embodiments.

Afterwards, the dummy gate structures 116-1, 116-2, 116-3, and 116-4 and the first semiconductor material layers 106 of the fin structures 104-1, 104-2, and 104-3 are removed to form gate trenches 146, as shown in FIG. 1P in accordance with some embodiments. More specifically, the dummy gate structures 116-1, 116-2, 116-3, and 116-4 and the first semiconductor material layers 106 of the fin structures 104-1, 104-2, and 104-3 are removed to form nanostructures 108' (including nanostructures 108-1', 108-2', and 108-3' shown in FIG. 1Q-T) with the second semiconductor material layers 108 of the fin structures 104-1, 104-2, and 104-3 respectively, in accordance with some embodiments.

The removal process may include one or more etching processes. For example, when the dummy gate electrode layers 120 are polysilicon, a wet etchant such as a tetramethylammonium hydroxide (TMAH) solution may be used to selectively remove the dummy gate electrode layers 120. Afterwards, the dummy gate dielectric layers 118 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, gate structures 148, including gate structures 148-1, 148-2, 148-3, and 148-4, are formed wrapping around the nanostructures 108', as shown in FIGS. 1Q and 1Q-T in accordance with some embodiments. More specifically, FIG. 1Q-T illustrates a diagrammatic top view of an intermediate stage of the semiconductor structure 100, and the structure shown in FIG. 1Q corresponds to the region shown in block $B_1$ in FIG. 1Q-T in accordance with some embodiments.

The gate structures 148 wrap around the nanostructures 108' to form gate-all-around transistor structures in accordance with some embodiments. In some embodiments, the gate structures 148 include conductive materials such as Ti, TiN, and/or W with dopants such as La, Zr, Hf, or the like.

In some embodiments, a trimming process is performed before forming the gate structures 148, so that the nanostructures 108' at the channel region wrapped by the gate structures 148 are narrower than the nanostructures under the gate spacers 128 and between the inner spacers 134.

In some embodiments, each of the gate structure 148 includes a gate dielectric layer 150 and a gate electrode layer 152. In some embodiments, an interfacial layer is formed before the gate dielectric layer 150 is formed, although not shown in FIG. 1Q. In some embodiments, the interfacial layer is an oxide layer formed around the nanostructures 108' and on the exposed portions of the base fin structures 105. In some embodiments, the interfacial layer is formed by performing a thermal process.

In some embodiments, the gate dielectric layer 150 is formed over the interfacial layer, so that the nanostructures 108' are surrounded (e.g. wrapped) by the gate dielectric layer 150. In addition, the gate dielectric layer 150 also covers the sidewalls of the gate spacers 128, the inner spacers 134, and the nanostructures 108' in accordance with some embodiments. In some embodiments, the gate dielectric layers 150 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. In some embodiments, the gate dielectric layers 150 are formed using CVD, ALD, other applicable methods, or a combination thereof.

In some embodiments, the gate electrode layers 152 are formed on the gate dielectric layers 150. In some embodiments, the gate electrode layers 152 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 152 are formed using CVD, ALD, electroplating, another applicable method, or a combination thereof. Other conductive layers, such as work function metal layers, may also be formed in the gate structures 148, although they are not shown in the figures. After the gate dielectric layers 150 and the gate electrode layers 152 are formed, a planarization process such as CMP or an etch-back process may be performed until the protection layers 164 are exposed.

After the gate structures 148 are formed, an etch back process is performed to formed recesses over the gate structures 148, and metal cap layers 154 and mask structures 156 are formed in the recesses, as shown in FIG. 1R in accordance with some embodiments. In some embodiments, an etching process is performed to form the recesses. In some embodiments, the etching process is an isotropic etching such as dry chemical etching, remote plasma etching, wet chemical etching, another suitable technique, and/or a combination thereof. In some embodiments, the gate spacers 128 are partially removed during the etching process, so that the recesses have T shape in the cross-sectional views.

After the recesses are formed, the metal cap layers 154 are formed over the top surfaces of the gate structures 148 in accordance with some embodiments. In some embodiments, the metal cap layers 154 are made of metal such as W, Re, Ir, Co, Ni, Ru, Mo, Al, Ti, Ag, Al, other applicable metals, or multilayers thereof. In some embodiments, the metal cap layers 154 and the metal gate electrode layer 152 are made of different materials. In some embodiments, the metal cap layers 154 covers both the gate dielectric layers 150 and the gate electrode layers 152 and are in contact with the sidewalls of the gate spacers 128. In some embodiments, the top surfaces of the metal cap layers 154 are lower than the top portions of the gate spacers 128.

After the metal cap layers 154 are formed, the mask structures 156 are formed in the recesses over the metal cap layers 154 and over the gate spacers 128, as shown in FIG. 1R, in accordance with some embodiments. In some embodiments, the mask structures are bi-layered structure including a lining layer 158 and a bulk layer 160 over the lining layer 158. The mask structures 156 are configured to protect the gate spacer 128 and the gate structures 148 during the subsequent etching process for forming contact plugs. In some embodiments, the mask structures 156 have narrower bottom portions and wider top portions. In some embodiments, the mask structures 156 have T-shapes in cross-sectional views. In some embodiments, the mask structures 156 are in direct contact with the contact etch stop layers 142.

In some embodiments, the lining layer 158 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the dielectric material for forming the lining layer 158 is conformally deposited using such as ALD, CVD (such as LPCVD, PECVD, HDP-CVD, or HARP), or the like.

In some embodiments, the bulk layer 160 is made of dielectric material such as silicon oxide ($SiO_2$), silicon nitride (SiN), silicon oxynitride (SiON), silicon carbon nitride (SiCN), silicon oxycarbonitride (SiOCN), oxygen-doped silicon carbonitride (Si(0)CN), or a combination thereof. In some embodiments, the dielectric material for the bulk layer 160 is formed over the lining layer 158 to overfill the recesses using such as CVD (such as FCVD, LPCVD, PECVD, HDP-CVD or HARP), ALD, or the like. In some embodiments, the bulk layer 160 and the lining layer 158 are made of different materials. In some embodiments, the bulk layer 160 is made of an oxide (such as silicon oxide) and the lining layer 158 is made of a nitrogen-containing dielectric (such as silicon nitride or silicon oxynitride). Afterward, a planarization process is performed on the bulk layer 160 and the lining layer 158 until the interlayer dielectric layer 144 is exposed, as shown FIG. 1R in accordance with some embodiments. The planarization may be CMP, an etching back process, or a combination thereof.

After the mask structures 156 are formed, source/drain contacts 162 are formed through the interlayer dielectric layer 144 and the contact etching stop layer 142 over the source/drain structures 140, as shown in FIGS. 1S and 1S-T in accordance with some embodiments. More specifically, FIG. 1S-T illustrates a diagrammatic top view of an intermediate stage of the semiconductor structure 100, and the structure shown in FIG. 1S corresponds to the region shown in block $B_1$ in FIG. 1S-T in accordance with some embodiments.

In some embodiments, some of the source/drain contacts 162 overlap more than one of the fin structures 104-1, 104-2, and 104-3. The formation of the source/drain contacts 162 may include patterning the interlayer dielectric layer 144 and the contact etching stop layer 142 to form contact openings partially exposing the source/drain structures 140, forming a silicide layer (not shown), and forming a conductive material over the silicide layer. The patterning process may include forming a patterned mask layer using a photolithography process over the interlayer dielectric layer 144 followed by an anisotropic etching process. The silicide layers may be formed by forming metal layers over the top surface of the source/drain structures 140 and annealing the metal layers so the metal layers react with the source/drain structures 140 to form the silicide layers. The unreacted metal layers may be removed after the silicide layers are formed. The silicide layers may be made of WSi, NiSi, TiSi, TaSi, PtSi, WSi, CoSi, or the like.

After the silicide layer is formed, the conductive material may be formed in the contact openings to form the source/drain contacts 162. The conductive material may include aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the conductive material for forming the source/drain contacts 162 is different from that for forming the gate structures. The conductive material may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Liners and/or barrier layers (not shown) may be formed before forming the conductive materials of the source/drain contacts 162. The liners may be made of silicon nitride, although any other applicable dielectric may be used as an alternative. The barrier layer may be made of tantalum nitride, although other materials, such as tantalum, titanium, titanium nitride, or the like, may also be used.

After the source/drain contacts 162 are formed, a front end structure 164 is formed over the mask structures 156, the interlayer dielectric layer 144, and the source/drain contacts 162, and a carrier substrate 166 is formed over the front end structure 164, as shown in FIG. 1T in accordance with some embodiments. In some embodiments, the front end structure 164 includes an etch stop layer and various features (not shown), such as a multilayer interconnect structure (e.g., contacts to gate, vias, lines, inter metal dielectric layers, passivation layers, etc.), formed thereon. After the front end structure 164 is formed, the carrier substrate 166 is attached to the front end structure 164 to support the semiconductor structure in subsequent manufacturing process.

FIGS. 1T-1 to 1ZF-1 illustrate cross-sectional views of intermediate stages of manufacturing the semiconductor structure 100 shown along line A-A' of FIGS. 1T to 1ZF (e.g. shown along and over the source/drain structure and in a direction parallel to the extending direction of the gate structures) in accordance with some embodiments. FIGS. 1T-2 to 1ZF-2 illustrate cross-sectional views of intermediate stages of manufacturing the semiconductor structure 100 shown along line B-B' of FIGS. 1T to 1ZF (e.g. shown along and over the source/drain structures and in a direction parallel to the extending direction of the nanostructures) in accordance with some embodiments. FIG. 1T-T illustrates a diagrammatic top view of an intermediate stage of the semiconductor structure 100, and the structure shown in FIG. 1T corresponds to the region shown in block $B_2$ in FIG. 1T-T in accordance with some embodiments.

After the carrier substrate 166 is attached to the front end structure 164, the substrate 102 is turned upside down, and a planarization is performed to the backside of the substrate 102, as shown in FIGS. 1T, 1T-1, and 1T-2 in accordance with some embodiments. More specifically, a planarization is performed to the substrate 102 until the isolation structure 112 and the deep sacrificial structures 138 are exposed, as shown in FIGS. 1T, 1T-1, and 1T-2 in accordance with some embodiments. The planarization process may be an etching process, a CMP process, a mechanical grinding process, a dry polishing process, or a combination thereof.

It is appreciated that although the structures in FIGS. 1T to 1ZF, 1T-1 to 1ZF-1, and 1T-2 to 1ZF-2 are shown in upside down for better understanding the manufacturing processes, the spatial positions of the elements (e.g. top portions, bottom portions, topmost, bottommost, or the like) are described according to the original positions shown in FIGS. 1A to 1S so they can be in consistence with those described previously for clarity. For example, the top surface of the source/drain structure 140 is referred to the surface in contact with the source/drain contacts 162, and the bottom surface of the source/drain structures 140 is referred to the surface in contact with the base fin structures 105, since the structure shown in FIG. 1T is upside down.

After the substrate 102 is removed, the source/drain structures 140 are cut into isolated portions by backside source/drain isolation features from the backside of the structure. More specifically, the base fin structures 105 of the fin structures 104-1, 104-2, and 104-3 and the deep sacrificial structures 138 are etched to form recesses, and mask structures 168 are formed in the recesses, as shown in FIGS. 1U, 1U-1, and 1U-2 in accordance with some embodiments. In some embodiments, the mask structures 168 are made of a dielectric material different from that for forming the isolation structure 112. In some embodiments, the mask structures 168 are made of SiN, SiCN, SiOC, SiOCN, $HfO_2$, $ZrO_2$, HfAlOx, HfSiOx, Al2O3, or the like. In some embodiments, the mask structures 168 are made of a nitride and the isolation structure is made of an oxide.

After the mask structures 168 are formed, the isolation structures 112 are removed to form openings 170, as shown in FIGS. 1V, 1V-1, and 1V-2 in accordance with some embodiments. In some embodiments, the isolation structures 112 are removed by performing an isotropic etching such as dry chemical etching, remote plasma etching, wet chemical etching, another suitable technique, and/or a combination thereof. During the etching process, the base fin structures 105 and the deep sacrificial structures 138 are protected by the mask structures 168 and the isolation liner 110. In addition, the source/drain structures 140 are partially exposed by the openings 170, as shown in FIG. 1V-1 in accordance with some embodiments.

Afterwards, the source/drain structures 140 exposed by the openings 170 are etched to form deep openings 172, as shown in FIGS. 1W, 1W-1, and 1W-2 in accordance with some embodiments. More specifically, the deep openings 172 are formed through the source/drain structures 140 to form separate source/drain structures 140' including individual source/drain structures 140-1', 140-2', and 140-3' in accordance with some embodiments. In some embodiments, the source/drain structures 140-1' are attached to the nanostructures 108-1' of the fin structure 104-1, the source/drain structures 140-2' are attached to the nanostructures 108-2' of the fin structure 104-2, and the source/drain structures 140-3' are attached to the nanostructures 108-3' of the fin structure 104-3. In some embodiments, the sidewalls of the source/drain structures 140-1', 140-2', and 140-3' are substantially aligned with the sidewalls of the isolation liner 110.

In some embodiments, the source/drain contacts 162 are partially exposed by the deep openings 172. In some embodiments, the contact etch stop layer 142 is exposed by the deep openings 172. Meanwhile, the gate structures 148 are protected by the cap layer 114 and the gate spacers 128, and therefore the gate structures 148 will not be damaged too much during the etching process. In some embodiments, the cap layer 114 is completely removed during the etching process. In some embodiments, the portions of the gate dielectric layer 150 exposed by the openings 170 are also removed during the etching process. In some embodiments, the etching process is an isotropic etching such as dry chemical etching, remote plasma etching, wet chemical etching, another suitable technique, and/or a combination thereof.

Next, backside source/drain isolation features 174 are formed in the openings 170 and the deep openings 172, as shown in FIGS. 1X, 1X-T, 1X-1, and 1X-2 in accordance with some embodiments. FIG. 1X-T illustrates a diagrammatic top view of an intermediate stage of the semiconductor structure 100, and the structure shown in FIG. 1X corresponds to the region shown in block $B_2$ in FIG. 1X-T in accordance with some embodiments.

In some embodiments, each of the backside source/drain isolation features 174 includes a liner layer 176 and an isolation material 178 formed over the liner layer 176. The liner layer 176 is configured to protect the source/drain structures 140-1', 140-2', and 140-3' in subsequent manufacturing processes. In some embodiments, the liner layer 176 covers the sidewalls of the isolation liner 110 and the exposed sidewalls of the source/drain structures 140-1', 140-2', and 140-3', as shown in FIG. 1X-1. In addition, the liner layer 176 also covers and in direct contact with the exposed surfaces of the source/drain contacts 162 and the contact etch stop layer 142 in accordance with some embodiments. In some embodiments, the liner layer 176 is made of nitride (e.g. SiN). In some embodiments, the liner layer 176 and the isolation liner 110 are made of the same material.

After the liner layer 176 is formed, the isolation material 178 is formed over the liner layer 176, and the openings 170 and 172 are completely filled by the isolation material 178, as shown in FIG. 1X in accordance with some embodiments. In some embodiments, the isolation material 178 and the liner layer 176 are made of different dielectric materials. In some embodiments, the isolation material 178 is silicon oxide, silicon nitride, silicon oxynitride (SiON), other applicable insulating materials, or a combination thereof. The liner layer 176 and the isolation material 178 may be formed by performing chemical vapor deposition (CVD), physical vapor deposition, (PVD), atomic layer deposition (ALD), or other applicable processes. After the liner layer 176 and the isolation material 178 are formed, a polish process (e.g. CMP) may be performed until the deep sacrificial structures 138 are exposed, as shown in FIG. 1X in accordance with some embodiments.

The backside source/drain isolation features 174 are formed through the source/drain structures 140 to separate them into the source/drain structures 140-1', 140-2', and 140-3' in accordance with some embodiments. In some embodiments, the backside source/drain isolation features 174 are formed along the first direction, which is parallel to the extending direction of the nanostructures 108'. Accordingly, although the source/drain structures 140 originally formed over the fin structures 104-1, 104-2, and 104-3 are merged together, it can be separated into isolated portions by the backside source/drain isolation features 174 formed afterwards. That is, the distance between the fin structures 104-1, 104-2, and 104-3 can be relatively small, without the concern of the merging of the source/drain structures 140-1', 140-2', and 140-3'. In some embodiments, the source/drain contacts 162 covers two source/drain structures 140' (e.g. the source/drain structures 140-2' and 140-3') and one backside source/drain isolation feature 174.

After the backside source/drain isolation features 174 are formed to cut the source/drain structures 140 from the backside, the base fin structures 105 may be replaced by a dielectric layer. More specifically, the top portions of the deep sacrificial structures 138 are removed to form recesses, and via mask structures 180 are formed in the recesses over the deep sacrificial structures 138, as shown in FIGS. 1Y, 1Y-1, and 1Y-2 in accordance with some embodiments. The via mask structures 180 are configured to protect the deep sacrificial structures 138 during subsequent etching process. In some embodiments, via mask structures 180 are made of a dielectric material having etching selectivity with the base fin structures 105. In some embodiments, the via mask structures 180 are made of $SiO_2$, SiN, SiCN, SiOC, SiOCN, $HfO_2$, $ZrO_2$, $HfAlO_x$, $HfSiO_x$, $Al_2O_3$, or the like.

Next, the base fin structures 105 are removed to form trenches and a backside dielectric layer 182 is formed in the trenches, as shown in FIGS. 1Z, 1Z-1, and 1Z-2 in accordance with some embodiments. In some embodiments, the base fin structures 105 are removed by performing an etching process. In some embodiments, the etching process is an isotropic etching such as dry chemical etching, remote plasma etching, wet chemical etching, another suitable technique, and/or a combination thereof. After the base fin structures 105 are removed, the gate structures 148, the inner spacers 134, and the source/drain structures 140' may be exposed by the trenches. In some embodiments, the source/drain structures 140' are also etched during the etching processes, such that the bottom portions of the source/drain structures 140' are removed.

After the base fin structures 105 are removed, the backside dielectric layer 182 is formed in the trenches, and a polishing process (e.g. CMP) is performed until the deep sacrificial structures 138 are exposed, as shown in FIGS. 1Z, 1Z-1, and 1Z-2 in accordance with some embodiments. In some embodiments, the via mask structures 180 are removed during the polishing process. As shown in FIGS. 1Z, 1Z-1, and 1Z-2, the base fin structures 105 are replaced by the backside dielectric layer 182 in accordance with some embodiments. The replacement of the base fin structures 105 may reduce the leakage of the resulting device, thereby enhancing the performance of the device (e.g., off-state current). In some embodiments, the backside dielectric layer 182 is in direct contact with the gate structures 148, the inner spacers 134, the nanostructures 108', and the source/drain structures 140'.

In some embodiments, the bottommost surfaces 140'BS of the source/drain structures 140' (i.e. the top surface of the backside dielectric layer 182) are higher than the bottommost surfaces 108'BS of the bottommost nanostructures 108', as shown in FIG. 1Z-2 in accordance with some embodiments. In some embodiments, the bottommost surfaces 140'BS of the source/drain structures 140' (i.e. the top surface of the backside dielectric layer 182) are substantially level with the bottommost surfaces 108'CS of the bottommost nanostructures 108' at the channel regions. In addition, the bottommost surfaces 140'BS of the source/drain structures 140' (i.e. the top surface of the backside dielectric layer 182) are also higher than the bottommost inner spacers 134 and the bottom surface of the gate structures 148 in accordance with some embodiments.

In some embodiments, the backside dielectric layer 182 is made of dielectric material such as silicon nitride (SiN), silicon oxynitride (SiON), silicon oxide, other applicable insulating material, multilayers thereof, and/or a combination thereof. In some embodiments, the backside dielectric layer 182 is made of a dielectric material different from that for forming the via mask structures 180 and the backside source/drain isolation features 174. For example, the via mask structures 180 and the backside source/drain isolation features 174 are made of an oxide (such as silicon oxide) and the backside dielectric layer 182 is made of a nitrogen-containing dielectric (such as silicon nitride or silicon oxynitride). In some embodiments, the formation of the backside dielectric layer 182 includes depositing a dielectric material to overfill the trenches, and planarizing a portion of the dielectric material afterwards. The deposition process may be CVD (such as FCVD, LPCVD, PECVD, HDP-CVD or HARP), ALD, other applicable technique, and/or a combination thereof.

After base fin structures 105 are replaced by the backside dielectric layer 182, the deep sacrificial structures 138 are removed to form backside conductive via openings 184 exposing the source/drain structures 140', as shown in FIGS. 1ZA, 1ZA-1, and 1ZA-2 in accordance with some embodiments. In some embodiments, the deep sacrificial structures 138 are removed by performing an etching process. In some embodiments, the etching process is an isotropic etching such as dry chemical etching, remote plasma etching, wet chemical etching, other applicable technique, and/or a combination thereof.

In some embodiments, the source/drain structures 140' are also partially removed during the etching process. In some embodiments, the backside conductive via openings 184 are narrower than the source/drain structures 140', and therefore the source/drain structures 140' have recessed portions under the backside conductive via openings 184 and higher portions around the backside conductive via openings 184. In some embodiments, the bottommost surface 140'RS of the recessed portions of the source/drain structures 140' overlapping the backside conductive via openings 184 is lower than the bottommost surface 140'BS of the source/drain structures 140 overlapping the backside dielectric layer 182. In some embodiments, the bottommost surface 140'RS of the recessed portions of the source/drain structures 140' overlapping the backside conductive via openings 184 is lower than the bottommost surface 108'BS of the bottommost nanostructures 108'. In some embodiments, the bottommost surface 140'RS of the recessed portions of the source/drain structures 140' overlapping the backside conductive via openings 184 is lower than the bottommost inner spacers 134.

Next, backside conductive vias 186 are formed in the backside conductive via openings 184, as shown in FIGS. 1ZB, 1ZB-T, 1ZB-1, and 1ZB-2 in accordance with some embodiments. FIG. 1 ZB-T illustrates a diagrammatic top view of an intermediate stage of the semiconductor structure 100, and the structure shown in FIG. 1ZB corresponds to the region shown in block $B_2$ in FIG. 1ZB-T in accordance with some embodiments.

In some embodiments, the backside conductive vias 186 include a liner 188 formed on the sidewalls of the backside conductive via openings 184 and a conductive layer 190 completely filled the backside conductive via openings 184. In some embodiments, the conductive layer 190 is surrounded by the liner 188 and is in contact with the source/drain structures 140'.

In some embodiments, the liner 188 is made of Ti, Ta, TiN, TaN, or the like. In some embodiments, the conductive layer 190 is made of Ru, W, Co, Al, Mo, or materials containing the metal described above. The liner 188 and the conductive layer 190 may be formed by performing chemical vapor deposition (CVD), physical vapor deposition, (PVD), atomic layer deposition (ALD), or other applicable processes.

After the backside conductive vias 186 are formed, a patterning process is performed to form backside gate isolation features. More specifically, a patterned mask structure 192 with openings 194 is formed to cover the backside of the structure, as shown in FIGS. 1ZC, 1ZC-T, 1ZC-1, and 1ZC-2 in accordance with some embodiments. FIG. 1ZC-T illustrates a diagrammatic top view of an intermediate stage of the semiconductor structure 100, and the structure shown in FIG. 1ZC corresponds to the region shown in block $B_3$ in FIG. 1ZC-T in accordance with some embodiments.

In some embodiments, the patterned mask structure 192 includes a first mask layer 196 and a second mask layer 198, and both of them have the openings 194. In some embodiments, the openings 194 vertically overlap some portions of the gate structures (e.g. the gate structures 148-1, 148-2, and 148-4 shown in FIG. 1ZC-T). In some embodiments, the openings 194 partially exposed the backside source/drain isolation features 174 and the backside dielectric layer 182. In some embodiments, the openings 194 also partially exposed the backside conductive vias 186. In some embodiments, the openings 194 expose more than one backside conductive vias 186. In some embodiments, one of the openings 194 exposes one backside conductive via 186, and one of the openings 194 exposes two backside conductive vias 186.

In some embodiments, the first mask layer 196 is made of titanium nitride (TiN), carbon-doped silicon dioxide (e.g., $SiO_2$:C), titanium oxide (TiO), boron nitride (BN), other applicable materials, and/or a combination thereof. In some embodiments, the second mask layer 198 is made of silicon nitride (SiN), silicon oxynitride (SiON), and/or a combination thereof. The materials for the first mask layer 196 and the second mask layer 198 may be sequentially deposited over the backside source/drain isolation features 174 and the backside dielectric layer 182. A photoresist may be formed over the second mask layer 198 such as by using spin-on coating and the photoresist may be patterned by being exposed to light using an appropriate photomask. Exposed (or unexposed portions) of the photoresist may be removed, depending on whether a positive or negative resist is used. The materials for forming the first mask layer 196 and the second mask layer 198 may be etched using the photoresist to form the openings 194.

After the patterned mask structure 192 is formed, a first etching process is performed to remove the isolation material 178 of the backside source/drain isolation features 174 exposed by the openings 194 to form trenches 200, as shown in FIGS. 1ZD, 1ZD-1, and 1ZD-2 in accordance with some embodiments. In some embodiments, the first etching process is an isotropic etching such as dry chemical etching, remote plasma etching, wet chemical etching, other applicable technique, and/or a combination thereof. During the first etching process, the isolation material 178 of the backside source/drain isolation features 174 has good etching selectivity with those for forming the liner layer 176, the backside dielectric layer 182, and the backside conductive vias 186, and therefore the liner layer 176, the backside dielectric layer 182, and the backside conductive vias 186 remain un-etched or slightly etched. That is, the source/drain structures 140' are protected by the liner layer 176 during the first etching process in accordance with some embodiments.

Afterwards, a second etching process is performed through the openings 194 of the patterned mask structure 192 and the trenches 200, as shown in FIGS. 1ZE, 1ZE-1, and 1ZE-2 in accordance with some embodiments. More specifically, the portions of the gate structures 148-1, 148-2, and 148-4 vertically overlap the trenches 200 are etched to form trenches 202 through the gate structures 148-1, 148-2, and 148-4 in accordance with some embodiments. In some embodiments, the trenches 202 are formed to separate the gate structures 148-1, 148-2, and 148-4 into various isolated portions. In addition, the metal cap layers 154 and the mask structures 156, including the lining layer 158 and the bulk layer 160, vertically overlap the trenches 200 are also partially etched during the second etching process to ensure that the gate structures 148-1, 148-2, and 148-4 are completely cut through by the trenches 202 in accordance with some embodiments. That is, the trenches 202 pass through the gate structures 148-1, 148-2, and 148-4 and extend into the mask structures 156 in accordance with some embodiments.

In addition, the backside dielectric layer 182, the isolation liner 110, the liner layer 176, and the liner 188, and corners of the conductive layer 190 of the backside conductive vias 186 exposed by the openings 194 are also partially etched to formed recesses 204 during the second etching process in accordance with some embodiments. In some embodiments, the source/drain contacts 162 are also partially etched during the second etching process. In some embodiments, the backside conductive vias 186 and the source/drain contacts 162 overlapping the openings 194 have rounded corners after the second etching process is performed. In some embodiments, the second mask layer 198 of the patterned mask structure 192 are also etched (i.e. thinned) during the second etching process.

Next, a dielectric material is formed in the openings 194, the trenches 200, the trenches 202, and the recesses 204, and a planarization process is performed to form backside gate isolation features 206, as shown in FIGS. 1ZF, 1ZF-T, 1ZF-1, 1ZF-2, and 1ZF-3 in accordance with some embodiments. FIG. 1ZF-T illustrates a diagrammatic top view of the semiconductor structure 100, and the structure shown in FIG. 1ZF corresponds to the region shown in block $B_3$ in FIG. 1ZF-T in accordance with some embodiments. FIG. 1ZF-3 illustrates a cross-sectional view of the semiconductor structure 100 shown along line C-C' of FIG. 1ZF-T in accordance with some embodiments.

The backside gate isolation features 206 are configured to separate the gate structures 148-1, 148-2, and 148-4 into various electrically isolated portions in accordance with some embodiments. In some embodiments, the dielectric material for forming the backside gate isolation features 206 has a dielectric constant less than about 7. In some embodiments, the dielectric material for forming the backside gate isolation features 206 is dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide (SiO2), or a combination thereof.

In some embodiments, the dielectric material for forming backside gate isolation features 206 is deposited to overfill the openings 194, the trenches 200, the trenches 202, and the recesses 204, and the planarization process is performed to remove the portion of the dielectric material until the backside conductive vias 186 are exposed in accordance with some embodiments. In some embodiments, the first mask layers 196 and the second mask layer 198 are also removed. The planarization process may be CMP or etching back process. After the planarization process is performed, the bottom surfaces of the backside gate isolation features 206, the backside dielectric layer 182, the backside conductive vias 186, and the backside source/drain isolation features 174 are substantially level with each other in accordance with some embodiments.

As described previously, the source/drain structures 140 attaching to the nanostructures 108-1', 108-2', and 108-3' are merged into one continuous source/drain structures 140 during the manufacturing processes in the front side of the structure, and the continuous source/drain structures 140 are divided into separate source/drain structures 140' by the backside source/drain isolation features 174 during the manufacturing processes in the backside of the structure afterwards. More specifically, the source/drain structures 140-1' are attached to the nanostructures 108-1', the source/drain structures 140-2' are attached to the nanostructures 108-2', the source/drain structures 140-3' are attached to the nanostructures 108-3', and the source/drain structures 104-1, 140-2', and 140-3' are separated from each other in accordance with some embodiments.

In addition, since the source/drain structures 140 are patterned to form separate source/drain structures 140-1', 140-2', and 140-3', the source/drain structures 140-1', 140-2', and 140-3' have substantially straight sidewalls, as shown in FIG. 1ZF-1 in accordance with some embodiments.

In addition, the backside conductive vias 186 are formed and are connected to the source/drain structures 140' (e.g. the source/drain structures 140-1' and 140-3' shown in FIG. 1ZF-1) from the backside of the structure in accordance with some embodiments. In some embodiments, the backside conductive via 186 has a thickness in a range from about 10 nm to about 30 nm.

Furthermore, some of the gate structures (e.g. the gate structures 148-1, 148-2, and 148-4) are divided into separate portions by the backside gate isolation features 206 from the backside of the structure, as shown in FIG. 1ZF in accordance with some embodiments. In some embodiments, the backside gate isolation feature 206 has a wider portion 206W in the backside dielectric layer 182 and a narrower portion 206N in the gate structure 148-4, as shown in FIG. 1ZF. In some embodiments, a distance between the wider portion 206W and the gate structure (e.g. the gate structure 148-4) is greater than about 0.5 nm. In some embodiments, the backside gate isolation feature 206 has an extending portion 206E extending into the mask structures 156. In some embodiments, the extending portion 206E has a thickness smaller than about 200 nm.

In some embodiments, the backside gate isolation features 206 are in contact with the backside source/drain isolation features 174, the gate structures 148, and the backside conductive via 186. In some embodiments, the backside gate isolation features 206 vertically overlap the source/drain contacts 162. In some embodiments, the source/drain contacts 162 under the backside gate isolation features 206 have curved top surfaces, as shown in FIG. 1ZF-3 in accordance with some embodiments.

FIG. 2 illustrates a cross-sectional view of an intermediate stage of manufacturing the semiconductor structure 100 in accordance with some other embodiments. Materials and processes for manufacturing the semiconductor structure 100 may be similar to, or the same as, those shown in FIGS. 1A to 1ZF and described previously, except the cap layer 114 shown in FIG. 1D is not formed, as shown in FIG. 2 in accordance with some embodiments.

More specifically, the processes shown in FIGS. 1A to 1C are performed to formed the isolation structure 112 around the fin structures 104-1, 104-2, and 104-3, and then the dummy gate structures 116-1, 116-2, 116-3, and 116-4 are formed across the fin structure 104-1, 104-2, and 104-3 and directly covering the isolation structure 112, as shown in FIG. 2 in accordance with some embodiments. Afterwards, the processes shown in FIGS. 1E to 1ZF are performed to form the semiconductor structure 100, which is similar to, or the same as the semiconductor structure 100 shown in FIGS. 1ZF, 1ZF-T, 1ZF-1, and 1ZF-2 in accordance with some embodiments and are not repeated herein.

Figure 3:
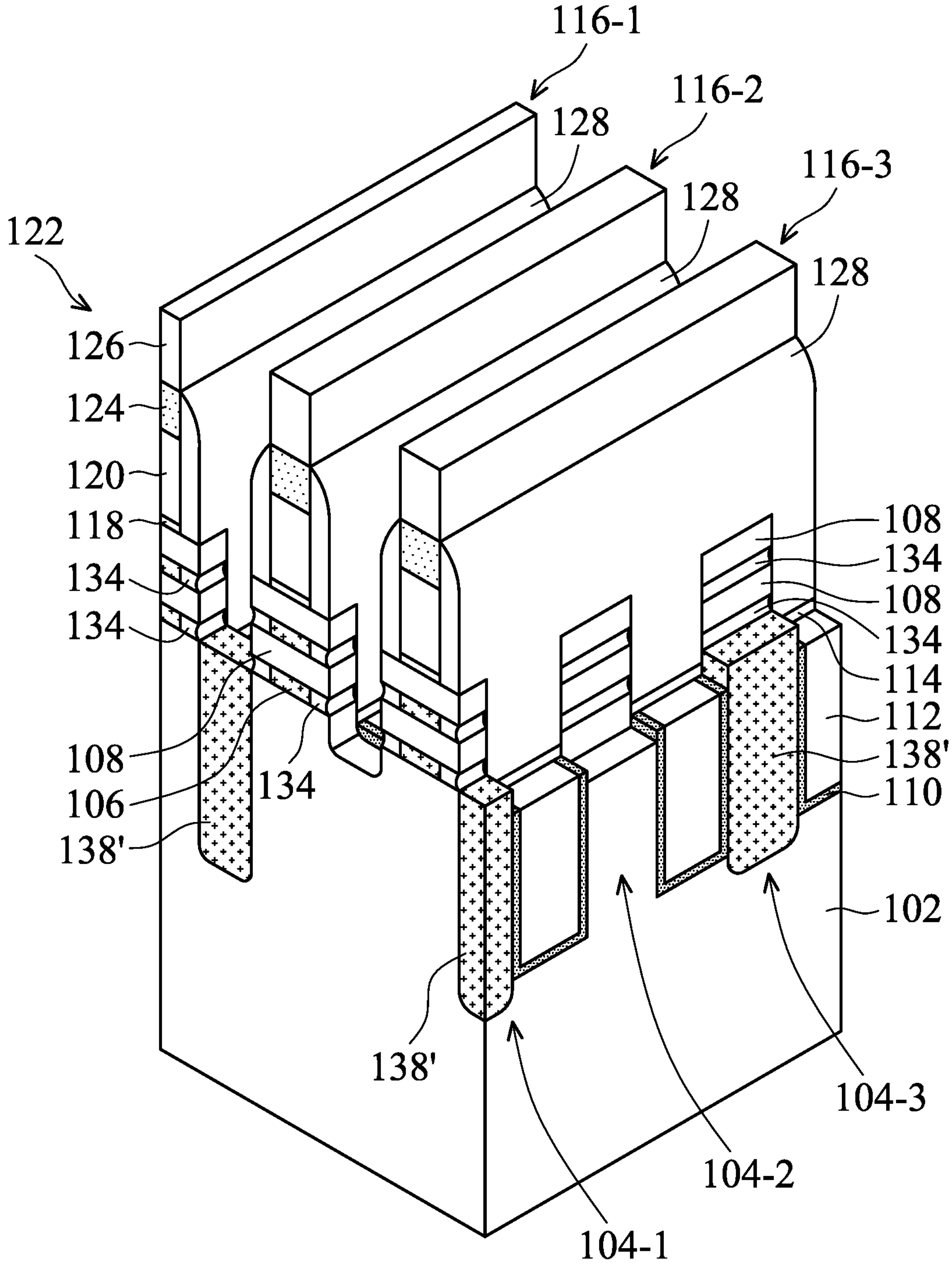

FIG. 3 illustrates a cross-sectional view of an intermediate stage of manufacturing the semiconductor structure 100 in accordance with some other embodiments. Materials and processes for manufacturing the semiconductor structure 100 may be similar to, or the same as, those shown in FIGS. 1A to 1ZF and described previously, except its deep sacrificial structures are thicker (e.g. measured along the Z direction perpendicular to X direction and Y direction) than that shown in FIG. 1L.

More specifically, the processes shown in FIGS. 1A to 1K are performed, and then deep sacrificial structures 138' are formed in the deep trenches, as shown in FIG. 3 in accordance with some embodiments. The processes materials for forming the deep sacrificial structures 138' are the same as those for forming the deep sacrificial structures 138 described previously, except the deep sacrificial structures 138' are thicker than the deep sacrificial structures 138. In some embodiments, the top surfaces of the deep sacrificial structures 138' are higher than the top surfaces of the isolation structures 112, and the bottom surfaces of the deep sacrificial structures 138' are lower than the bottom surfaces of the isolation structures 112. After the deep sacrificial structures 138' are formed, the processes shown in FIGS. 1M to 1ZF are performed to form the semiconductor structure 100, which is similar to, or the same as the semiconductor structure 100 shown in FIGS. 1ZF, 1ZF-T, 1ZF-1, and 1ZF-2 in accordance with some embodiments and are not repeated herein.

Figure 4:
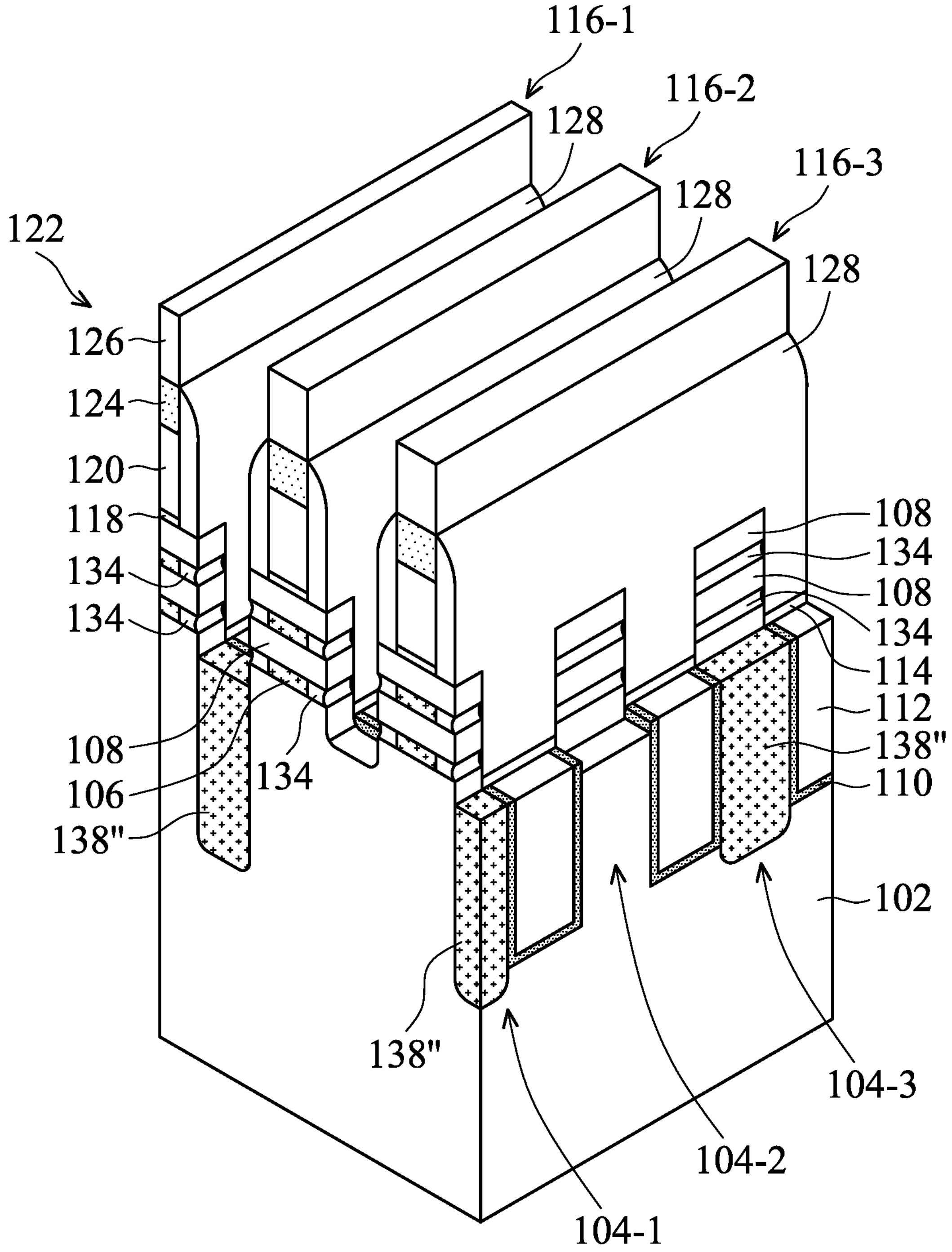

FIG. 4 illustrates a cross-sectional view of an intermediate stage of manufacturing the semiconductor structure 100 in accordance with some other embodiments. Materials and processes for manufacturing the semiconductor structure 100 may be similar to, or the same as, those shown in FIGS. 1A to 1ZF and described previously, except its deep sacrificial structures are thicker (e.g. measured along the Z direction perpendicular to X direction and Y direction) than that shown in FIG. 1L.

More specifically, the processes shown in FIGS. 1A to 1K are performed, and then deep sacrificial structures 138" are formed in the deep trenches, as shown in FIG. 4 in accordance with some embodiments. The processes materials for forming the deep sacrificial structures 138" are the same as those for forming the deep sacrificial structures 138 described previously, except the deep sacrificial structures 138" are thicker than the deep sacrificial structures 138. In some embodiments, the top surfaces of the deep sacrificial structures 138" are substantially level with the top surfaces of the isolation structures 112, and the bottom surfaces of the deep sacrificial structures 138" are lower than the bottom surfaces of the isolation structures 112. After the deep sacrificial structures 138" are formed, the processes shown in FIGS. 1M to 1ZF are performed to form the semiconductor structure 100, which is similar to, or the same as the semiconductor structure 100 shown in FIGS. 1ZF, 1ZF-T, 1ZF-1, and 1ZF-2 in accordance with some embodiments and are not repeated herein.

Figure 5:
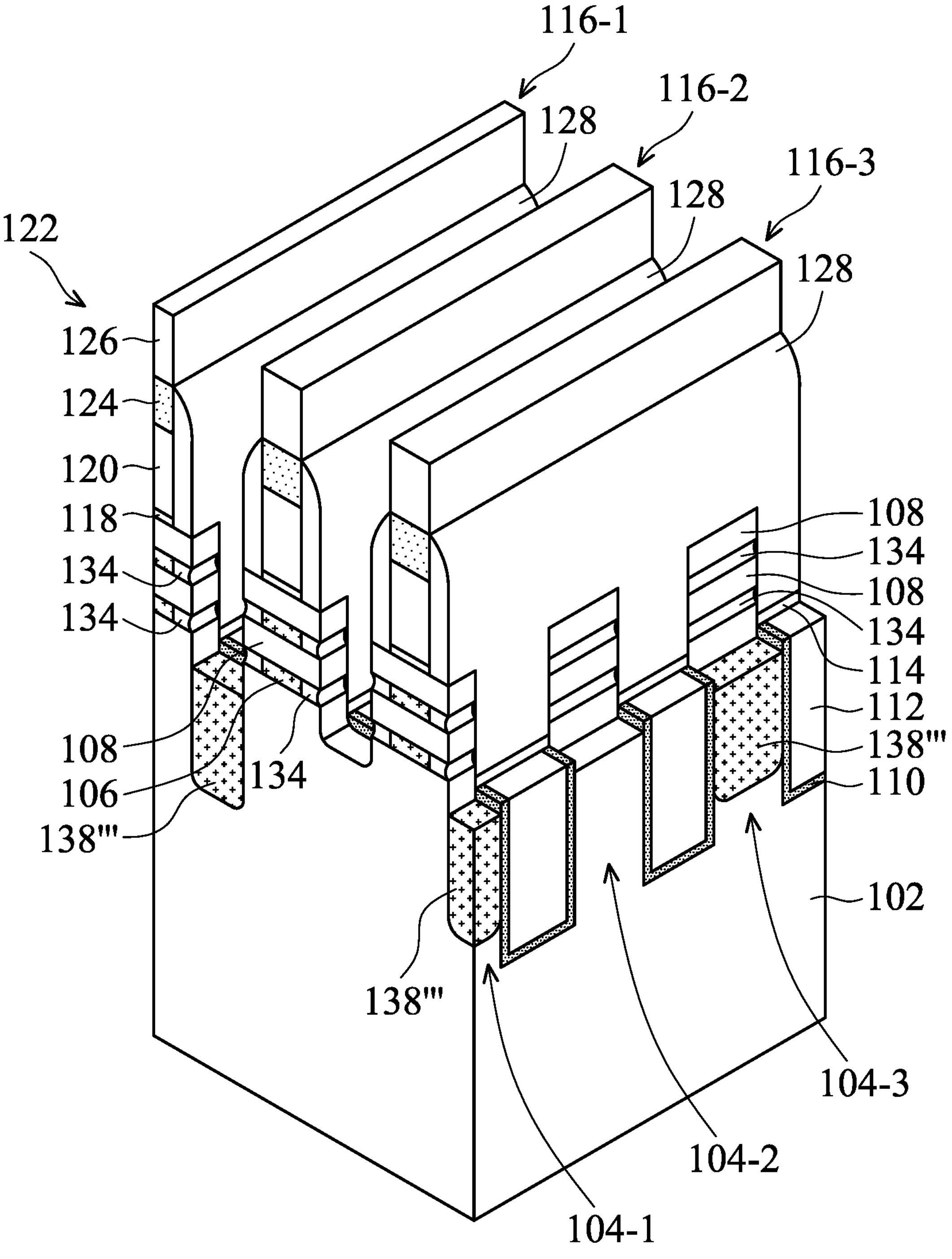

FIG. 5 illustrates a cross-sectional view of an intermediate stage of manufacturing the semiconductor structure 100 in accordance with some other embodiments. Materials and processes for manufacturing the semiconductor structure 100 may be similar to, or the same as, those shown in FIGS. 1A to 1ZF and described previously, except its deep sacrificial structures are thinner (e.g. measured along the Z direction perpendicular to X direction and Y direction) than that shown in FIG. 1L.

More specifically, the processes shown in FIGS. 1A to 1K are performed, and then deep sacrificial structures 138'" are formed in the deep trenches, as shown in FIG. 5 in accordance with some embodiments. The processes materials for forming the deep sacrificial structures 138'" are the same as those for forming the deep sacrificial structures 138 described previously, except the deep sacrificial structures 138'" are thinner than the deep sacrificial structures 138. In some embodiments, the top surfaces of the deep sacrificial structures 138'" are lower than the top surfaces of the isolation structures 112, and the bottom surfaces of the deep sacrificial structures 138'" are higher than the bottom surfaces of the isolation structures 112. Afterwards, the processes shown in FIGS. 1M to 1ZF are performed to form the semiconductor structure 100, which is similar to, or the same as the semiconductor structure 100 shown in FIGS. 1ZF, 1ZF-T, 1ZF-1, and 1ZF-2 in accordance with some embodiments and are not repeated herein.

Figure 6:
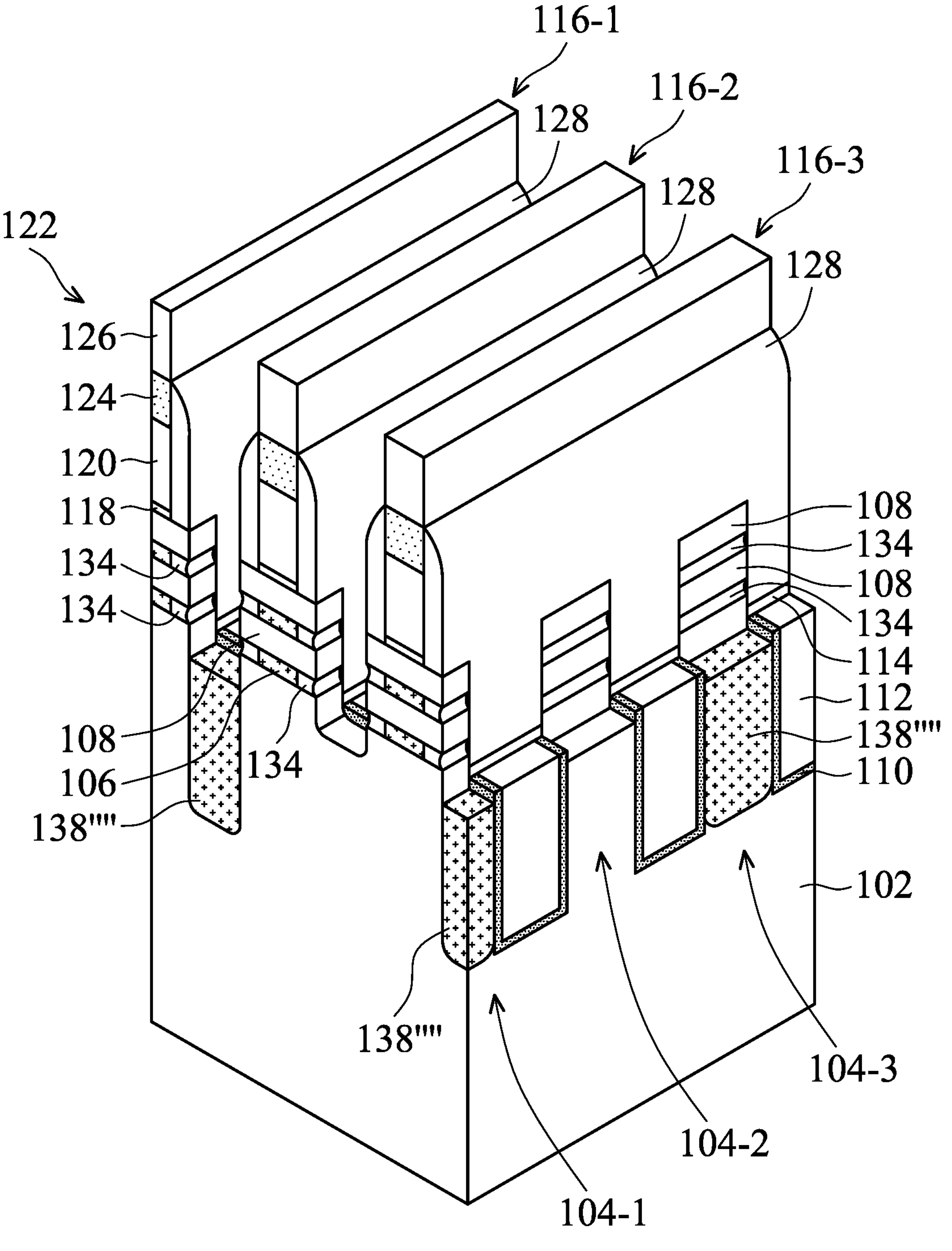

FIG. 6 illustrates a cross-sectional view of an intermediate stage of manufacturing the semiconductor structure 100 in accordance with some other embodiments. Materials and processes for manufacturing the semiconductor structure 100 may be similar to, or the same as, those shown in FIGS. 1A to 1ZF and described previously, except its deep sacrificial structures are thinner (e.g. measured along the Z direction perpendicular to X direction and Y direction) than that shown in FIG. 1L.

More specifically, the processes shown in FIGS. 1A to 1K are performed, and then deep sacrificial structures 138' are formed in the deep trenches, as shown in FIG. 6 in accordance with some embodiments. The processes materials for forming the deep sacrificial structures 138"" are the same as those for forming the deep sacrificial structures 138 described previously, except the deep sacrificial structures 138"" are thinner (e.g. measured along the Z direction perpendicular to X direction and Y direction) than the deep sacrificial structures 138. In some embodiments, the top surfaces of the deep sacrificial structures 138"" are lower than the top surfaces of the isolation structures 112, and the bottom surfaces of the deep sacrificial structures 138"" are substantially level with the bottom surfaces of the isolation structures 112. Afterwards, the processes shown in FIGS. 1M to 1ZF are performed to form the semiconductor structure 100, which is similar to, or the same as the semiconductor structure 100 shown in FIGS. 1ZF, 1ZF-T, 1ZF-1, and 1ZF-2 in accordance with some embodiments and are not repeated herein.

Figure 7A:
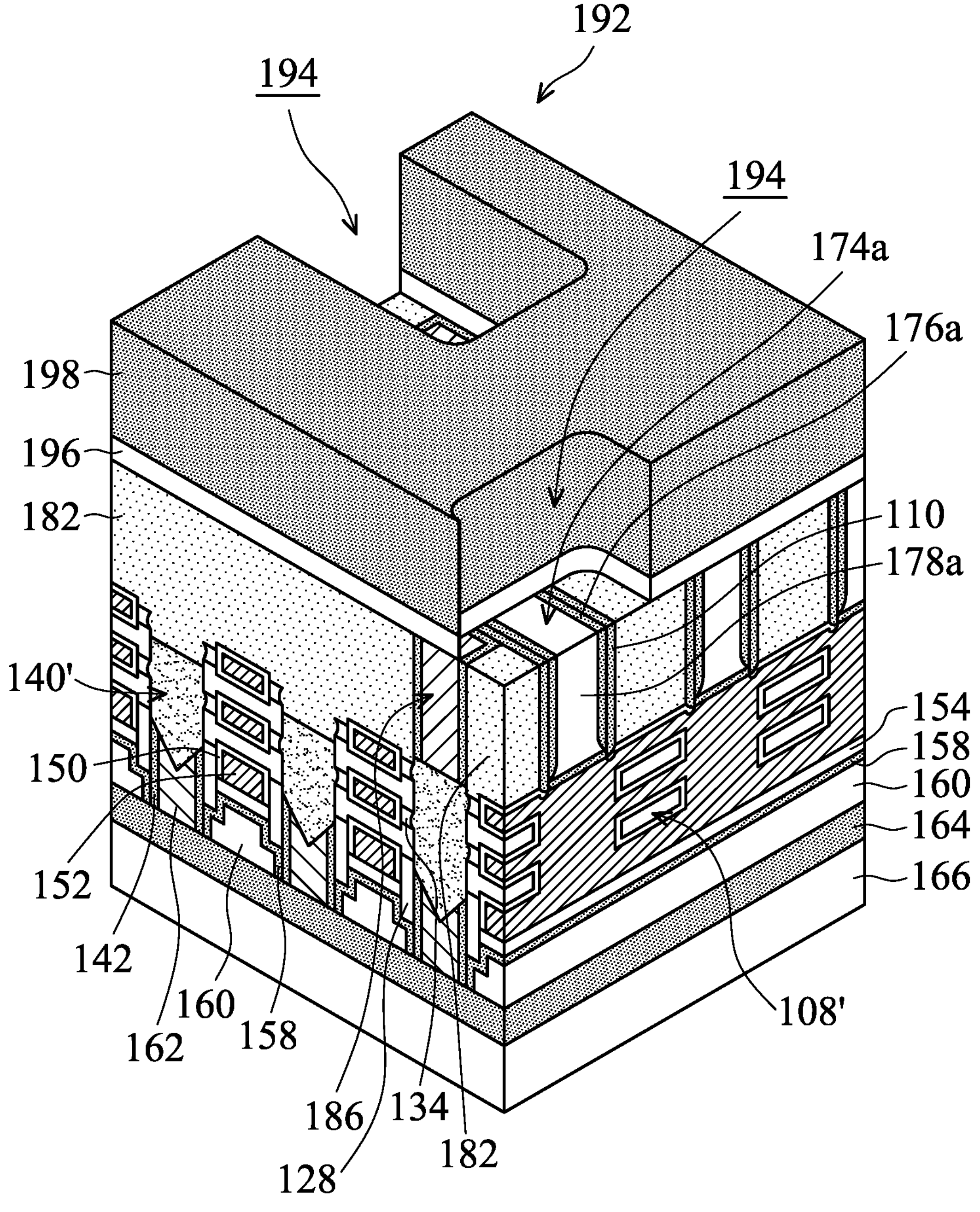
FIGS. 7A to 7C illustrate diagrammatic perspective views of intermediate stages of manufacturing a semiconductor structure in accordance with some embodiments.
Figure 7B:
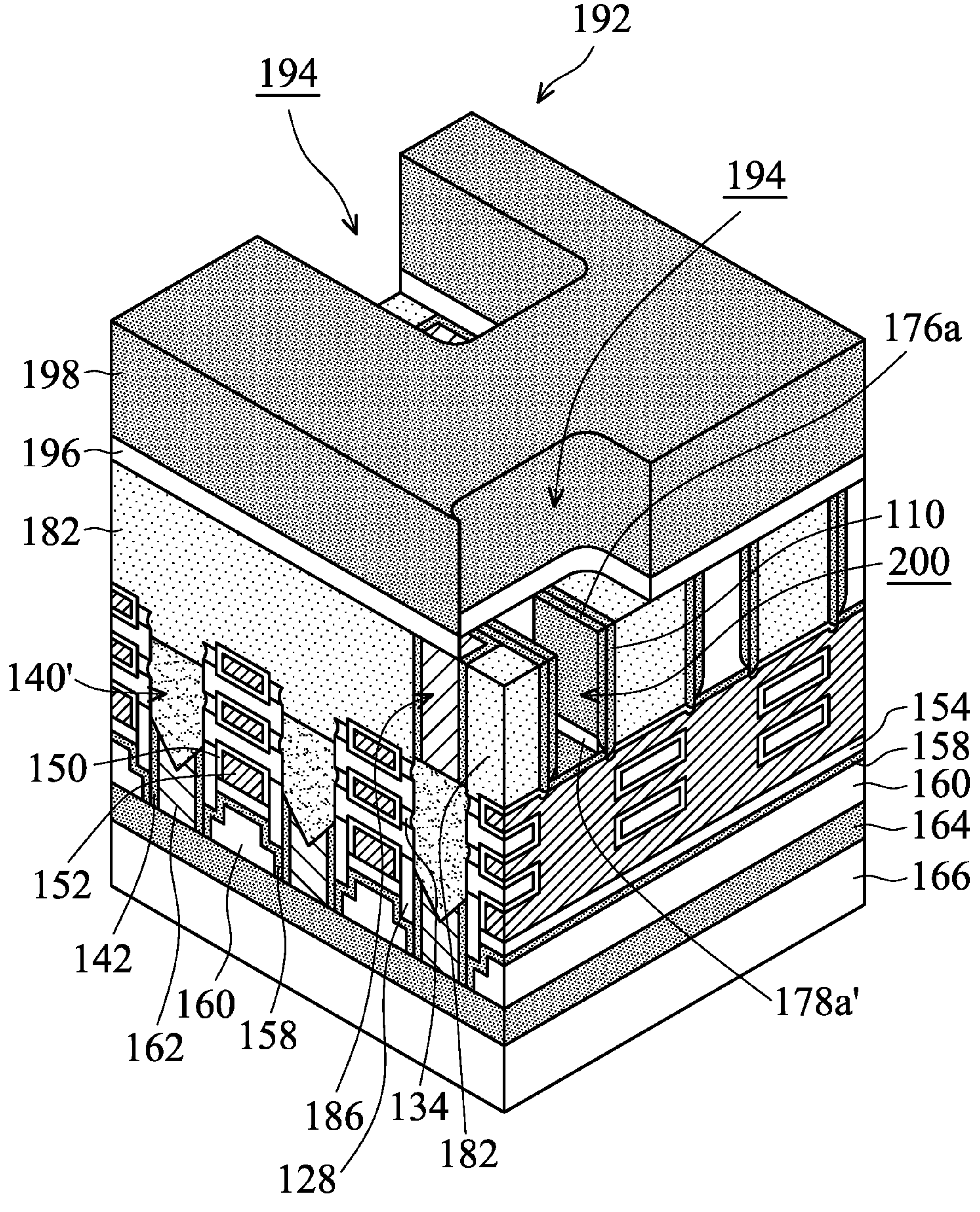
Figure 7C:
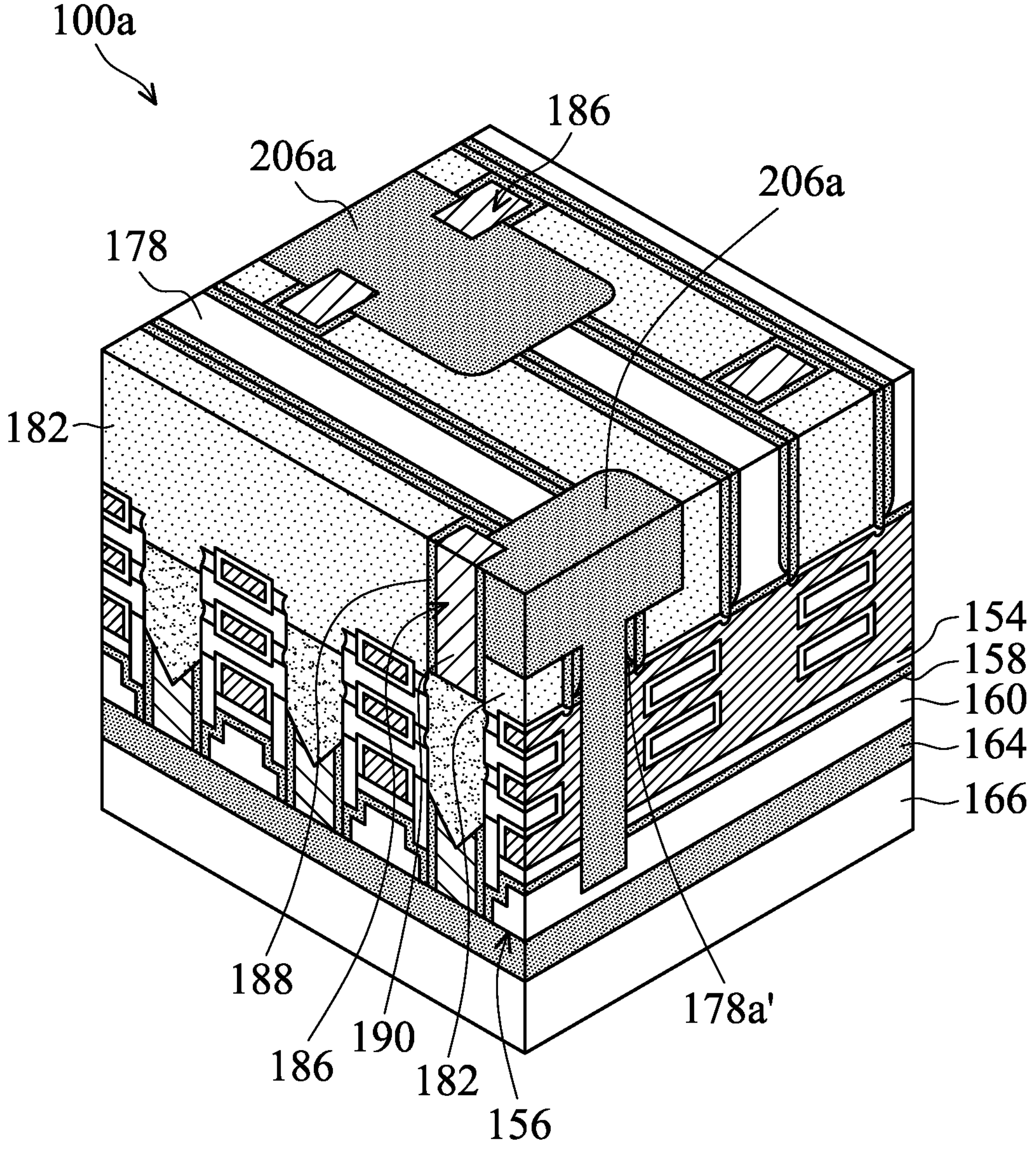

FIGS. 7A to 7C illustrate diagrammatic perspective views of intermediate stages of manufacturing a semiconductor structure 100*a* in accordance with some embodiments. The semiconductor structure 100*a* may be similar to the semiconductor structure 100 described previously, except the shape of its backside source/drain isolation features are different from that in the semiconductor structure 100. Some processes and materials for forming the semiconductor structure 100*a* may be similar to, or the same as, those for forming the semiconductor structure 100 described previously and are not repeated herein.

The processes similar to those shown in FIGS. 1A to 1ZC may be performed to form a semiconductor structure similar to that shown in FIG. 1ZC, but backside source/drain isolation features 174*a* have un-flat sidewalls over the gate structures 148, as shown in FIG. 7A in accordance with some embodiments. More specifically, a liner layer 176*a* of the backside source/drain isolation features 174*a* has a thinner portion (e.g. measured along the Y direction parallel to the extending direction of the gate structure) at the side attached to the gate structure 148-4, such that the isolation material 178*a* formed over it also has a wider portion (e.g. measured along the Y direction parallel to the extending direction of the gate structure) near the gate structure 148-4, as shown in FIG. 7A in accordance with some embodiments. In some embodiments, the isolation material 178*a* of the backside source/drain isolation features 174*a* of the continuously shrink from the side near the gate structure 148-4 to the side opposite to the gate structure 148-4.

Afterwards, the first etching process shown in FIG. 1ZD and described previously is performed to remove the isolation material 178*a* of the backside source/drain isolation features 174*a* exposed by the openings 194 to form trenches 200*a*, as shown in FIG. 7B in accordance with some embodiments. In some embodiments, the isolation material 178*a* of the backside source/drain isolation features 174*a* is not completely removed. That is, a remaining portion 178*a*' of the isolation material of the backside source/drain isolation features 174*a* remains in the openings 200*a*, as shown in FIG. 7B in accordance with some embodiments.

Next, the process shown in FIGS. 1ZE and 1ZF are performed to form the semiconductor structure 100*a*, as shown in FIG. 7C in accordance with some embodiments. Similarly, backside gate isolation features 206*a* are formed through the gate structure 148-4 to separate the gate structure 148-4 into two isolated portions in accordance with some embodiments. In addition, the remaining portion 178*a*' of the isolation material of the backside source/drain isolation features 174*a* is in direct contact with the backside gate isolation feature 206*a* and is sandwiched between the backside gate isolation feature 206*a* and the liner layer 176*a*, as shown in FIG. 7C in accordance with some embodiments. The processes and materials for forming the backside source/drain isolation features 174*a*, including the liner layer 176*a* and the isolation material 178*a*, and the backside gate isolation features 206*a* are similar to, or the same as, those for forming the backside source/drain isolation features 174, including the liner layer 176 and the isolation material 178, and the backside gate isolation feature 206 and are not repeated herein.

Figure 8A:
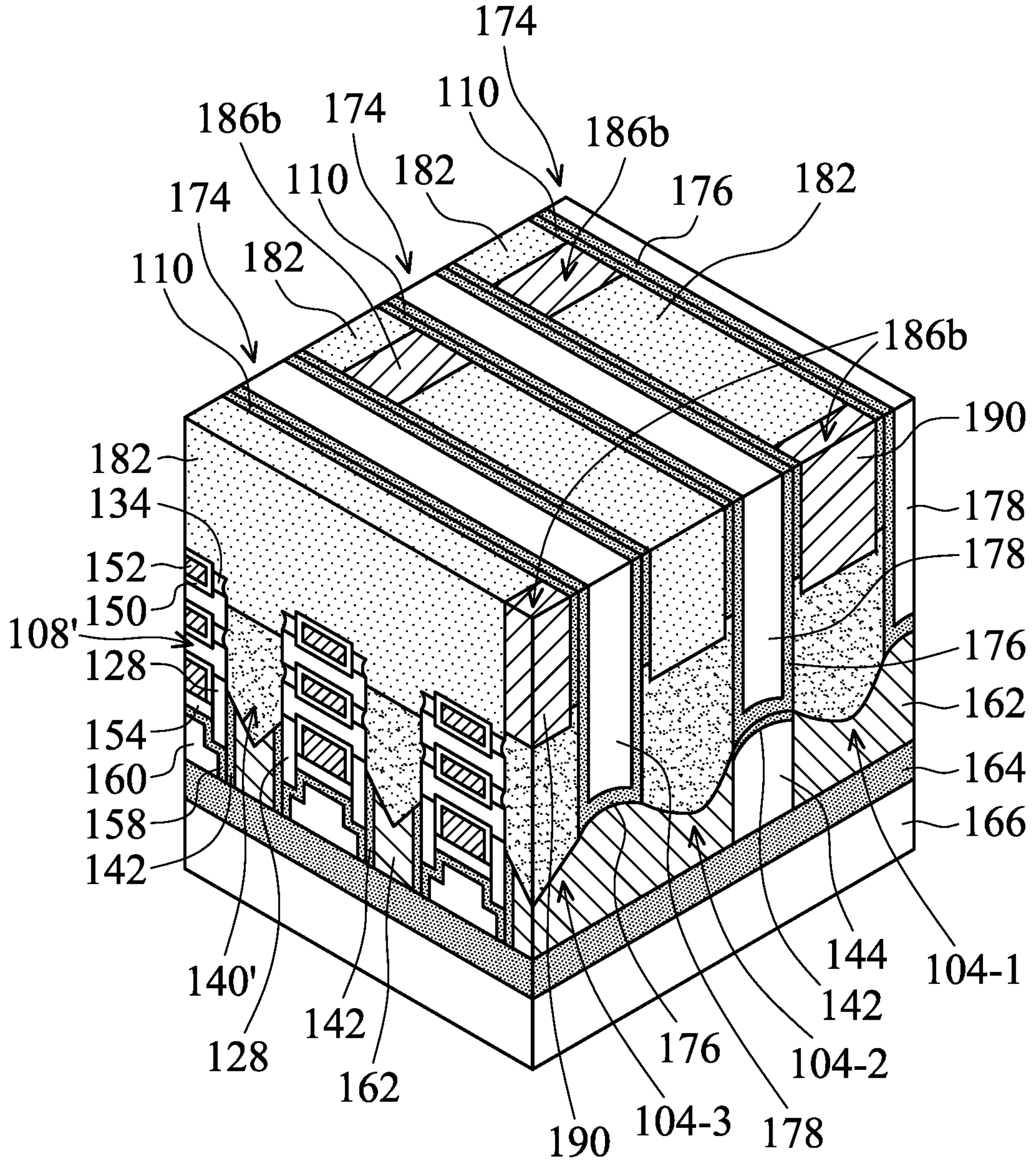
FIGS. 8A and 8B illustrate diagrammatic perspective views of intermediate stages of manufacturing a semiconductor structure in accordance with some embodiments.
Figure 8B:
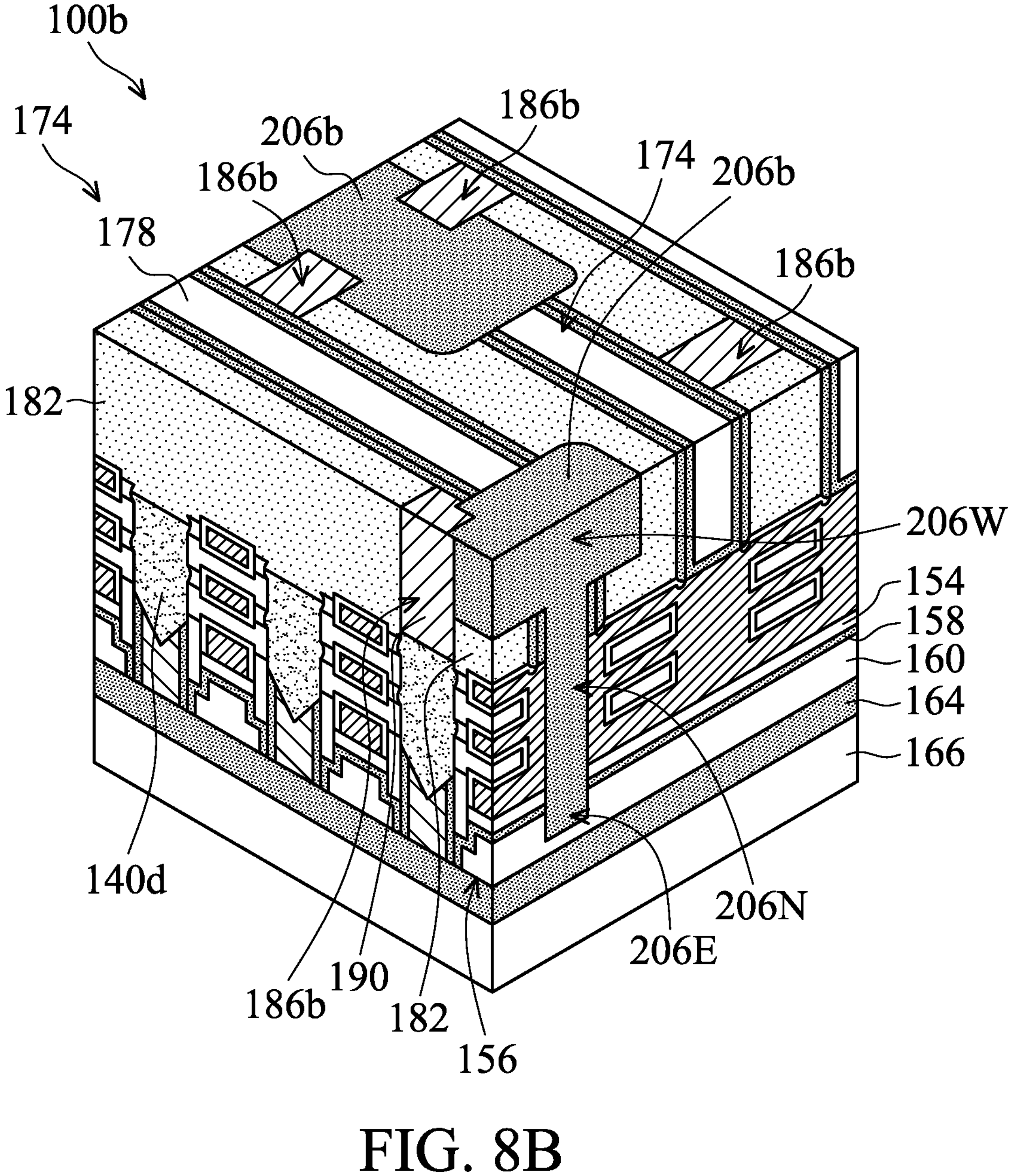
Figures 1, 8B:
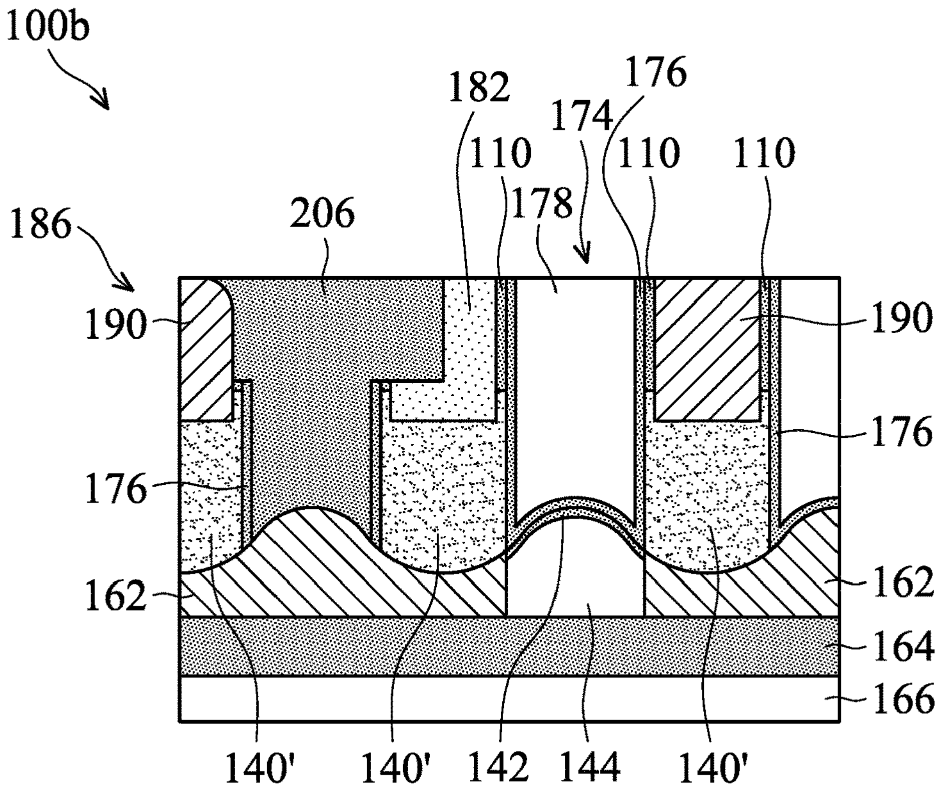
Figures 2, 8B:
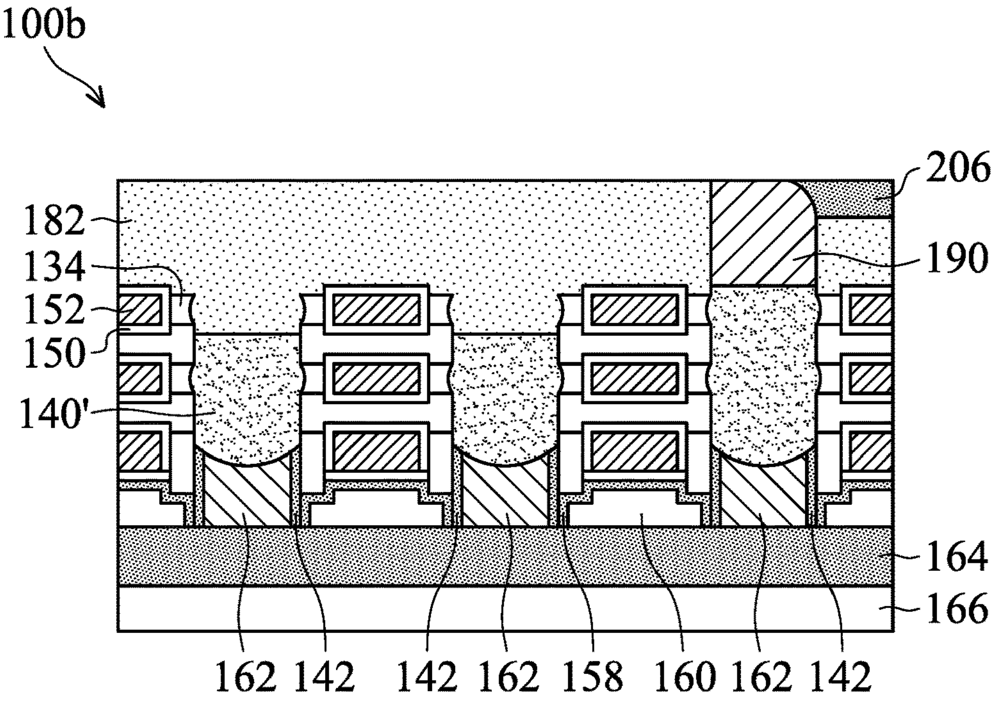

FIGS. 8A and 8B illustrate diagrammatic perspective views of intermediate stages of manufacturing a semiconductor structure 100*b* in accordance with some embodiments. The semiconductor structure 100*b* may be similar to the semiconductor structure 100 described previously, except its backside conductive vias do not have liner in accordance with some embodiments. Some processes and materials for forming the semiconductor structure 100*b* may be similar to, or the same as, those for forming the semiconductor structure 100 described previously and are not repeated herein.

The processes similar to those shown in FIGS. 1A to 1ZA may be performed, and then backside conductive vias 186*b* are formed in the backside via openings, as shown in FIG. 8A in accordance with some embodiments. In some embodiments, the backside conductive vias 186*b* are made of a single conductive material, such as Ru, W, Co, Al, Mo, or materials containing the metal described above. The conductive material may be formed by performing chemical vapor deposition (CVD), physical vapor deposition, (PVD), atomic layer deposition (ALD), or other applicable processes. In some embodiments, the conductive material of the backside conductive vias 186*b* is in direct contact with the backside dielectric layer 182 and the isolation liner 110.

After the backside conductive vias 186*b* are formed, processes shown in FIGS. 1ZC to 1ZF and described above are performed to form the semiconductor structure 100*b* having backside gate isolation features 206*b*, as shown in FIGS. 8B, 8B-1, and 8B-2 in accordance with some embodiments. FIG. 8B-1 illustrates a cross-sectional view of the semiconductor structure 100*b* shown along and over the source/drain structure parallel to the extending direction of the gate structures 148 in accordance with some embodiments. FIG. 8B-2 illustrates a cross-sectional view of the semiconductor structure 100*b* shown along and over the source/drain structure parallel to the extending direction of the nanostructures 108' in accordance with some embodiments.

In some embodiments, the conductive material of the backside conductive vias 186*b* is in direct contact with the backside gate isolation features 206*b*. The processes and materials for forming the backside gate isolation features 206*b* are similar to, or the same as, those for forming the backside gate isolation feature 206 and are not repeated herein.

FIGS. 9A and 9B illustrate diagrammatic perspective views of intermediate stages of manufacturing a semiconductor structure 100*c* in accordance with some embodiments. The semiconductor structure 100*c* may be similar to the semiconductor structure 100 described previously, except its backside conductive vias are shorter than (e.g. measured along the Z direction perpendicular to X direction and Y direction) that in semiconductor structure 100 in accordance with some embodiments. Some processes and materials for forming the semiconductor structure 100*c* may be similar to, or the same as, those for forming the semiconductor structure 100 described previously and are not repeated herein.

The processes similar to those shown in FIGS. 1A to 1Z may be performed, and then the deep sacrificial structures are removed to form backside conductive via openings 184*c*, as shown in FIG. 9A in accordance with some embodiments. In some embodiments, the deep sacrificial structures are removed by performing an etching process until the source/drain structures 140' are exposed. In addition, the source/drain structures 140' are not significantly recessed during the etching process.

After the backside conductive via openings 184*c* are formed, processes shown in FIGS. 1ZB to 1ZF and described above are performed to form the semiconductor structure 100*c* having backside conductive vias 186*c*, as shown in FIGS. 9B, 9B-1, and 9B-2 in accordance with some embodiments. FIG. 9B-1 illustrates a cross-sectional view of the semiconductor structure 100*c* shown along and over the source/drain structure parallel to the extending direction of the gate structures 148 in accordance with some embodiments. FIG. 9B-2 illustrates a cross-sectional view of the semiconductor structure 100*c* shown along and over the source/drain structure parallel to the extending direction of the nanostructures 108' in accordance with some embodiments.

In some embodiments, the top surface of the backside conductive vias 186*c* is lower than the bottommost surface of the gate structures 148-4, as shown in FIG. 9B-2 (upside down) in accordance with some embodiments. The processes and materials for forming the backside conductive vias 186*c* are similar to, or the same as, those for forming the backside conductive vias 186 and are not repeated herein.

FIGS. 10A and 10B illustrate diagrammatic perspective views of intermediate stages of manufacturing a semiconductor structure 100*d* in accordance with some embodiments. The semiconductor structure 100*d* may be similar to the semiconductor structure 100 described previously, except its source/drain structures under the backside dielectric layer are thicker than that of the semiconductor structure 100 in accordance with some embodiments. Some processes and materials for forming the semiconductor structure 100*d* may be similar to, or the same as, those for forming the semiconductor structure 100 described previously and are not repeated herein.

The processes similar to those shown in FIGS. 1A to 1Y may be performed, and then the base fin structures are removed to form trenches and a backside dielectric layer 182*d* is formed in the trenches, as shown in FIG. 10A in accordance with some embodiments. Similar to those described in FIG. 1Z, the base fin structures may be removed by performing an etching process, and the gate structures 148, the inner spacers 134, and source/drain structures 140*d'* are exposed by the trenches in accordance with some embodiments. In some embodiments, the source/drain structures 140*d'* are slightly etched during the etching processes, and the bottommost surfaces 140'BSd of the source/drain structures 140*d'* are still lower than the bottommost surfaces of the bottommost nanostructures 108', as shown in FIG. 10A in accordance with some embodiments. In some embodiments, the bottommost surfaces 140'BSd of the source/drain structures 140*d'* are higher than the bottommost surfaces of the bottommost inner spacers 134 in accordance with some embodiments.

After base fin structures 105 are replaced by the backside dielectric layer 182*d*, processes shown in FIGS. 1ZA to 1ZF and described above are performed to form the semiconductor structure 100*d*, as shown in FIG. 10B in accordance with some embodiments. The processes and materials for forming the source/drain structures 140*d'* and the backside dielectric layer 182*d* are similar to, or the same as, those for forming the source/drain structures 140' and the backside dielectric layer 182 and are not repeated herein.

As the device's size continuously reduces, the adjacent source/drain structures tend to be merged together. In order to prevent the merging of the source/drain structures over adjacent fin structures, the distance between the fin structures may not be too small, and therefore the reduction of the device size may have a limitation. In some embodiments, the merged source/drain structures (e.g. the source/drain structure 140 shown in FIG. 1M) are cut into separate portions (e.g. the source/drain structures 140-1', 140-2', and 140-3' shown in FIG. 1X) by the backside source/drain isolation features (e.g. the backside source/drain isolation features 174 shown in FIG. 1X) from the backside of the device. Accordingly, the distances (e.g. the pitches) between the fin structures (e.g. fin structures 104-1, 104-2, and 104-3) may be reduced without the concern of the merging of the source/drain structures.

It should be appreciated that the elements shown in the semiconductor structures 100 and 100*a* to 100*d* may be combined and/or exchanged. For example, a semiconductor structure may include the backside gate isolation features 206*a* shown in FIG. 7C and the source/drain structures 140*d'* shown in FIG. 10A.

In addition, it should be noted that same elements in FIGS. 1A to 10B may be designated by the same numerals and may include materials that are the same or similar and may be formed by processes that are the same or similar; therefore such redundant details are omitted in the interests of brevity. In addition, although FIGS. 1 to 10B are described in relation to the method, it will be appreciated that the structures disclosed in FIGS. 1 to 10B are not limited to the method but may stand alone as structures independent of the method.

Similarly, the methods shown in FIGS. 1 to 10B are not limited to the disclosed structures but may stand alone independent of the structures. Furthermore, the nanostructures described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include first nanostructures and second nanostructures and a gate structure wrapping around the first and second nanostructures. A first source/drain structure is attached to the first nanostructures and a second source/drain structure is attached to the second nanostructures. The first source/drain structure and the second source/drain structure may be merged together first and is divided into separate portions by a backside source/drain isolation feature formed afterwards. Since the first and second source/drain structures can be isolated afterwards, the distance between the nanostructures may be reduced without the risk of the merging of the source/drain structures at adjacent nanostructures. Therefore, the device size may be reduced and the performance of the semiconductor structure maybe improved.

In some embodiments, a semiconductor structure is provided. The semiconductor structure includes a backside dielectric layer and first nanostructures and second nanostructures over the backside dielectric layer. The semiconductor structure also includes a first source/drain structure connected to the first nanostructures and a second source/drain structure connected to the second nanostructures. The semiconductor structure also includes a backside source/drain isolation feature sandwiched between the first source/drain structure and the second source/drain structure. In addition, the bottom surface of the backside source/drain isolation feature is substantially level with the bottom surface of the backside dielectric layer.

In some embodiments, a semiconductor structure is provided. The semiconductor structure includes a backside dielectric layer and first nanostructures and second nanostructures extending in a first direction over the backside dielectric layer. The semiconductor structure also includes a gate structure over the backside dielectric layer and wrapping around the first nanostructures and the second nanostructures and extending in a second direction. The semiconductor structure also includes a first source/drain structure over the backside dielectric layer and connected to the first nanostructures and a second source/drain structure over the backside dielectric layer and connected to the second nanostructures. The semiconductor structure also includes a backside source/drain isolation feature extending in the first direction and separating the first source/drain structure and the second source/drain structure. In addition, the backside source/drain isolation feature includes a liner layer over a sidewall of the first source/drain structure and a sidewall of the second source/drain structure and an isolation material surrounded and covered by the liner layer.

In some embodiments, a method for manufacturing a semiconductor structure is provided. The method for manufacturing the semiconductor structure includes forming a first fin structure and a second fin structure protruding from the front side of a substrate. In addition, the first fin structure and the second fin structure include first semiconductor material layers and second semiconductor material layers alternately stacked. The method for manufacturing the semiconductor structure also includes forming an isolation structure surrounding the first fin structure and a second fin structure and forming a source/drain structure over the first fin structure and the second fin structure. The method for manufacturing the semiconductor structure also includes removing the isolation structure from a backside of the substrate to form an opening exposing the source/drain structure and etching the source/drain structure through the opening to form a deep opening through the source/drain structure. The method for manufacturing the semiconductor structure also includes forming a backside source/drain isolation feature in the deep opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a dielectric layer;

first nanostructures and second nanostructures over the dielectric layer;

a first source/drain structure connected to the first nanostructures in a first direction;

a second source/drain structure connected to the second nanostructures in the first direction; and a backside source/drain isolation feature laterally sandwiched between a first sidewall of the first source/drain structure and a second sidewall of the second source/drain structure in a cross-sectional view along a second direction that is different from the first direction, wherein a bottom surface of the backside source/drain isolation feature is substantially level with a bottom surface of the dielectric layer in the cross-sectional view, and the backside source/drain isolation feature continuously extends from the first sidewall of the first source/drain structure to the second sidewall of the second source/drain structure in the cross-sectional view.

2. The semiconductor structure as claimed in claim 1, further comprising:

a gate structure wrapping around the first nanostructures and the second nanostructures, wherein a bottom surface of the gate structure is lower than a top surface of the dielectric layer.

3. The semiconductor structure as claimed in claim 2, further comprising:

first inner spacers formed between the first nanostructures, wherein the dielectric layer is in direct contact with the gate structure and the first inner spacers.

4. The semiconductor structure as claimed in claim 2, further comprising:

a backside gate isolation feature formed through the dielectric layer and through the gate structure to separate the gate structure into a first portion and a second portion.

5. The semiconductor structure as claimed in claim 4, wherein the backside gate isolation feature is in contact with the backside source/drain isolation feature.

6. A semiconductor structure, comprising:

a backside dielectric layer;

first nanostructures and second nanostructures extending in a first direction over the backside dielectric layer;

a gate structure over the backside dielectric layer and wrapping around the first nanostructures and the second nanostructures and extending in a second direction;

a gate spacer on a sidewall of the gate structure;

a first source/drain structure over the backside dielectric layer and connected to the first nanostructures;

a second source/drain structure over the backside dielectric layer and connected to the second nanostructures;

a backside source/drain isolation feature extending in the first direction and separating the first source/drain structure and the second source/drain structure, wherein the backside source/drain isolation feature comprises:

a liner layer over a sidewall of the first source/drain structure and a sidewall of the second source/drain structure; and an isolation material surrounded and covered by the liner layer; and a source/drain conductive contact over the first source/drain structure and laterally spaced apart from the gate structure by the gate spacer, wherein the source/drain conductive contact is at a first side of the first source/drain structure, while the backside dielectric layer is at a second side of the first source/drain structure opposite to the first side.

7. The semiconductor structure as claimed in claim 6, wherein a portion of the liner layer of the backside source/drain isolation feature is vertically sandwiched between the isolation material of the backside source/drain isolation feature and the source/drain conductive contact.

8. The semiconductor structure as claimed in claim 6, further comprising:

a backside conductive via formed below the first source/drain structure, wherein the backside conductive via vertically overlaps the source/drain conductive contact.

9. The semiconductor structure as claimed in claim 6, wherein a bottom surface of the gate structure is lower than a bottom surface of the first source/drain structure.

10. A semiconductor structure, comprising:

first nanostructures;

a first gate structure wrapping around the first nanostructures;

a first source/drain structure attached to the first nanostructures in a first direction;

second nanostructures;

a second gate structure wrapping around the second nanostructures;

a second source/drain structure attached to the second nanostructures in the first direction;

a source/drain isolation feature sandwiched between the first source/drain structure and the second source/drain structure in a second direction different from the first direction; and a source/drain contact extending in the second direction and vertically overlapping the first source/drain structure, the second source/drain structure, and the source/drain isolation feature, wherein the source/drain contact comprises aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), or titanium aluminum nitride (TiAlN).

11. The semiconductor structure as claimed in claim 10, further comprising:

a backside conductive via attached to the first source/drain structure, wherein the source/drain contact and the backside conductive via are at opposite sides of the first source/drain structure.

12. The semiconductor structure as claimed in claim 11, wherein a bottom surface of the backside conductive via is substantially level with a bottom surface of the source/drain isolation feature.

13. The semiconductor structure as claimed in claim 11, further comprising:

a gate isolation feature sandwiched between the first gate structure and the second gate structure, wherein a bottom surface of the gate isolation feature is lower than a bottom surface of the first source/drain structure.

14. The semiconductor structure as claimed in claim 13, wherein the gate isolation feature has a first portion sandwiched between the first gate structure and the second gate structure in the second direction and a second portion vertically overlapping the first gate structure and the second gate structure.

15. The semiconductor structure as claimed in claim 14, wherein the second portion is wider than the first portion in the second direction.

16. The semiconductor structure as claimed in claim 13, wherein the gate isolation feature is attached to the source/drain isolation feature in the first direction.

17. The semiconductor structure as claimed in claim 1, further comprising:

a source/drain conductive contact formed over the first source/drain structure, wherein the source/drain conductive contact has a curved surface over the first source/drain structure.

18. The semiconductor structure as claimed in claim 8, wherein a portion of the backside source/drain isolation feature is laterally sandwiched between the backside dielectric layer and the backside conductive via in a cross-sectional view.

19. The semiconductor structure as claimed in claim 6, wherein the source/drain conductive contact covers a first sidewall of the gate spacer and the gate structure covers a second sidewall of the gate spacer opposite to the first sidewall.

20. The semiconductor structure as claimed in claim 1, wherein the backside source/drain isolation feature interfaces with the first sidewall of the first source/drain structure to the second sidewall of the second source/drain structure without overlapping the first source/drain structure and the second source/drain structure in a third direction that is different from the first direction and the second direction.

* * * * *